(12) United States Patent
Gonzalez et al.

(10) Patent No.: US 10,305,980 B1
(45) Date of Patent: May 28, 2019

(54) ARRANGEMENTS FOR COMMUNICATING DATA IN A COMPUTING SYSTEM USING MULTIPLE PROCESSORS

(71) Applicants: Juan Guillermo Gonzalez, Weston, FL (US); Santiago Andres Fonseca, Doral, FL (US); Rafael Camilo Nunez, Aventura, FL (US)

(72) Inventors: Juan Guillermo Gonzalez, Weston, FL (US); Santiago Andres Fonseca, Doral, FL (US); Rafael Camilo Nunez, Aventura, FL (US)

(73) Assignee: Intellectual Property Systems, LLC

( * ) Notice: Subject to any disclaimer, the term of this patent is extended or adjusted under 35 U.S.C. 154(b) by 0 days.

(21) Appl. No.: 15/249,619

(22) Filed: Aug. 29, 2016

Related U.S. Application Data

(63) Continuation of application No. 15/187,756, filed on Jun. 20, 2016, now abandoned, which is a continuation of application No. 14/990,747, filed on Jan. 7, 2016, now abandoned, which is a continuation-in-part of application No. 14/556,098, filed on Nov. 28, 2014, now abandoned.

(60) Provisional application No. 61/910,010, filed on Nov. 27, 2013, provisional application No. 62/101,347, filed on Jan. 8, 2015, provisional application No. 62/105,398, filed on Jan. 20, 2015.

(51) Int. Cl.
*H04L 29/08* (2006.01)

(52) U.S. Cl.
CPC ........ *H04L 67/1095* (2013.01); *H04L 67/104* (2013.01)

(58) Field of Classification Search
CPC .................. H04L 67/1095; H04L 67/104
See application file for complete search history.

(56) References Cited

U.S. PATENT DOCUMENTS

| | | |
|---|---|---|
| 6,240,431 B1 | 5/2001 | Dyer |
| 6,253,222 B1 | 6/2001 | Dyer |
| 6,396,420 B1 | 5/2002 | Augustine |

(Continued)

OTHER PUBLICATIONS

J. Demmel, L. Grigori, M. F. Hoemmen, and J. Langou, Communication-optimal parallel and sequential QR and LU factorizations. Tech. Report No. UCB/EECS-2008. Berkeley, CA, USA.

(Continued)

*Primary Examiner* — Nicholas R Taylor
*Assistant Examiner* — Sanjoy Roy

(57) ABSTRACT

Data employed in computations amongst multiple processors in a computing system is processed so that less bits than a full representation of the data needs to be communicated yet all of the relevant information is communicated. More specifically, a sensitivity value is determined for various items of the data which reflect the number of bits in the data items that are not garbage bits, and only information in the data items that are indicated by the sensitivity value to not be garbage bits are necessarily effectively retained. At least the information that is not garbage bits and the corresponding associated sensitivity are packed together. The results of computations that are performed using the data items as at least one of the operands for the computation are associated with a sensitivity that is derived from the individual sensitivities of the operands used in the computation.

40 Claims, 54 Drawing Sheets

(56) References Cited

U.S. PATENT DOCUMENTS

| | | | |
|---|---|---|---|
| 7,907,069 | B2 | 3/2011 | Oberdorfer |
| 8,301,803 | B2 | 10/2012 | Wegener |
| 8,368,568 | B2 | 2/2013 | Deslandes |
| 8,631,055 | B2 | 1/2014 | Wegener |
| 2002/0090141 | A1* | 7/2002 | Kenyon ............... G06T 9/001 382/239 |
| 2003/0101207 | A1* | 5/2003 | Dhong ............... G06F 7/485 708/505 |
| 2005/0071598 | A1* | 3/2005 | Luick ............... H04N 19/172 711/170 |
| 2011/0078222 | A1* | 3/2011 | Wegener ............... H03M 7/30 708/203 |
| 2013/0007077 | A1* | 1/2013 | Wegener ............... G06F 7/483 708/203 |
| 2015/0180504 | A1* | 6/2015 | Kang ............... H03M 7/30 708/203 |

OTHER PUBLICATIONS

C. Rubio-Gonzalez, C. Nguyen, H. Nguyen. J. Demmel, W. Kahan, K. Sen, D. Bailey, C. Iancu, D. Hough. Precimoniuous: Tuning assistant for floating-point precision. SC'13.

M. O. Lam, J. K. Hollingsworth, and G. W. Stewart. Dynamic floating-point cancellation detection. Parallel Computing. vol. 39, Issue 3, 2013. Elsevier Science Publishers B.V.

A. W. Brown, P. H. J. Kelly, and W. Luk. Profiling floating point value ranges for reconfigurable implementation. Proc, of the 1st HiPEAC Workshop on Reconf. Computing, 2007.

Eva Darulova and Viktor Kuncak. Trustworthy numerical computation in Scala. OOPSLA 2011. Portland, Oregon, USA.

F. Dinechin, C. Lauter, and G. Melquiond. Certifying the floating-point implementation of an elementary function using Gappa. IEEE Transactions on Computers, Issue1. Feb. 2011.

D. Abadi, S. Madden, and M. Ferreira. Integrating compression and execution in column-oriented database systems. Proc. of the 2006 ACM SIGMOD, New York, NY, USA.

Eric Schkufza, Rahul Sharma, and Alex Aiken. Stochastic optimization of floating-point programs with tunable precision. OIDI'14. Jun. 2014. Edinburgh, UK.

J. Ke, M. Burtscher, and E. Speight. Runtime compression of MPI messages to improve the performance and scalability of parallel applications. SC'14. Washington, DC, USA.

R. Filgueira, D. Singh, A. Calderon, J. Carretero.CoMPI: Enhancing MPI based applications performance and scalabillity using run time compression.16th European PVM/MPI Meeting.

R. Filgueira, et. al. Adaptive CoMPI: Enhancing MPI-based applications—Performance and scalability by using adaptive compression. Int. J. of High Performance Computing App.

R. Filgueira, J. Carretero, D. Singh, A. Calderon, and A. Nunez. Dyanamic-CoMPI: Dynamic optimization techniques for MPI parallel computations. Journal of Supercomputing, 2010.

D. Lemire and L. Boytsov. Decoding billions of integers per second through vectorization. Software: Practice and experience. vol. 45, issue 1. Jan. 2015.

P. Lindstrom, Fast and efficient compression of floating-point data. IEEE Transactions on Visualization and Computer Graphics. vol. 12, issue 5. Sep.-Oct. 2006.

Steve Sullivan. Wavelet compression for floating point data—Sengcom. Oct. 11, 2012.

* cited by examiner

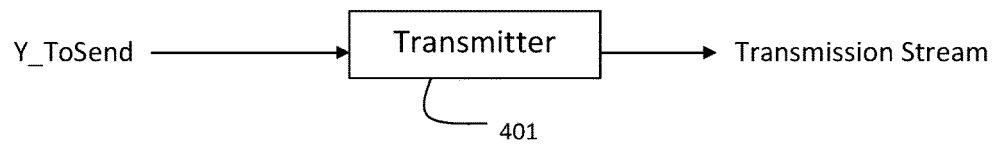
FIG. 4A
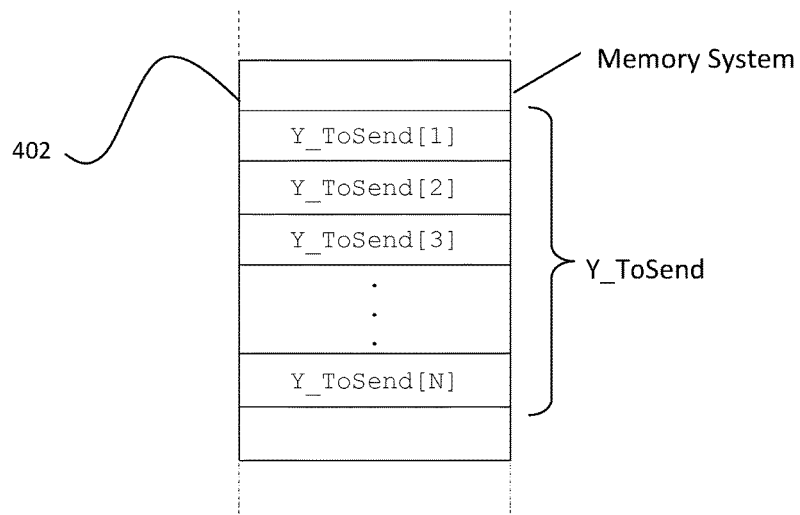
FIG. 4B
```
int Send( int *Y_ToSend, int N, int destination)
{
    int ReturnCode;
    ReturnCode=MPI_Send( Y_ToSend, N+1, MPI_INT, destination,
                         tag, MPI_COMM_WORLD);
    return ReturnCode;
}
```
FIG. 4C

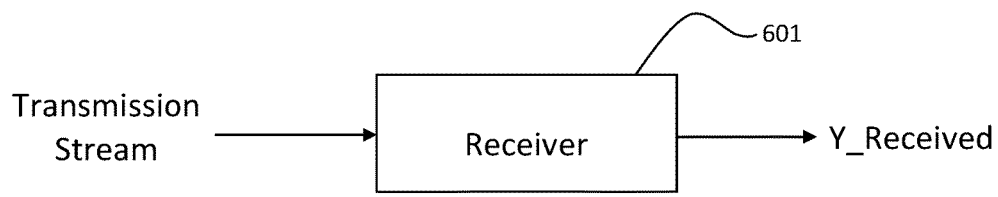
FIG. 6A
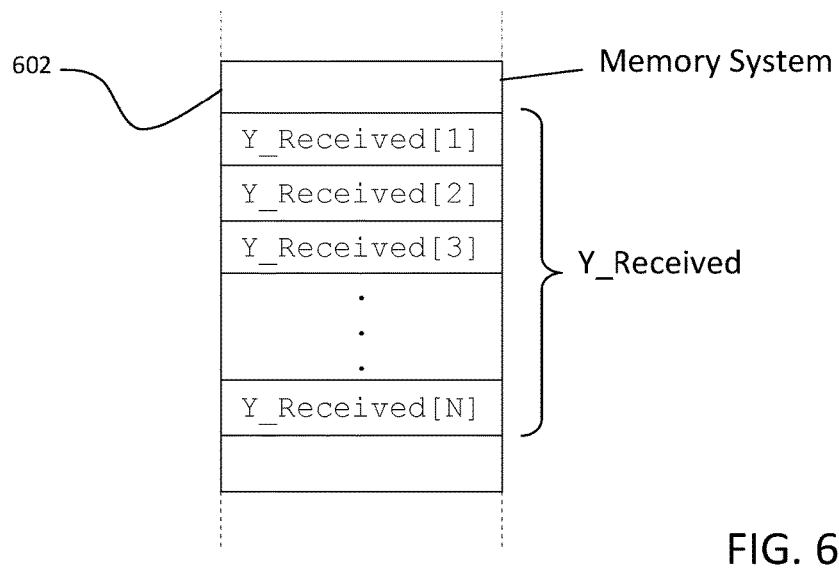
FIG. 6B
```
int Receive( int *Y_Received, int N, int source)
{
    int ReturnCode;
    ReturnCode=MPI_Recv( Y_Received, N+1, MPI_INT, source,
                         tag, MPI_COMM_WORLD, &status);
    return ReturnCode;
}
```
FIG. 6C

```
void CompressY( int *Y, int N, int *Y_Compressed, int *M ) {
  int i;  int j = 0;  int p = 0;  int d;  int L; int last = 0;
  for ( i = 0; i < N; i++ ) {
    // Predict
      d = Y[i] - last;
      last = Y[i];
    // Count leading zeros
      L = __builtin_clz( abs(d) );
    // Encode
      PushToArray( L, 28, 32, Y_Compressed, &j, &p ); // leading zeros
      PushToArray( d, 1, 1, Y_Compressed, &j, &p ); // sign of d
      PushToArray( d, L+1, 32, Y_Compressed, &j, &p ); // truncated d
  }
  *M = j;
  return;
}
```

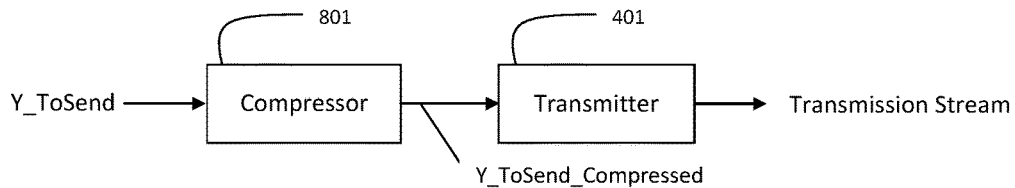
FIG. 10A
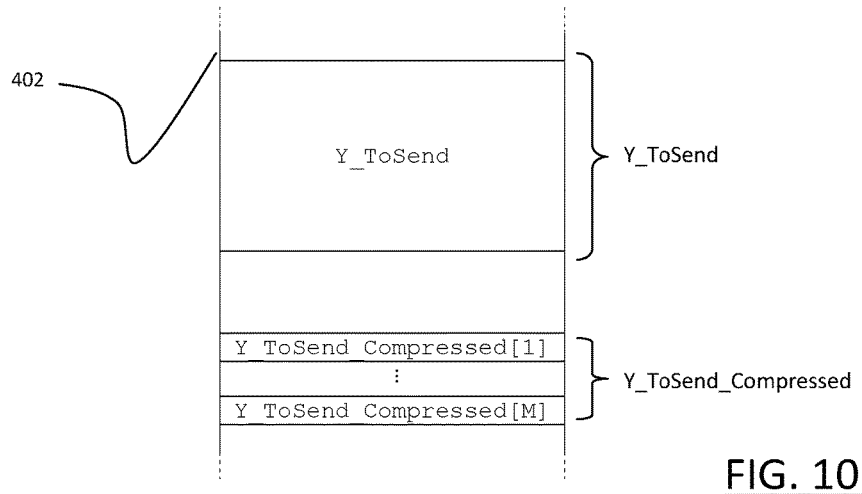
FIG. 10B
```
int CompressAndSend( int *Y_ToSend, int N, int destination ) {
    int ReturnCode;
    int *Y_ToSend_Compressed, M;
    if ( !malloc( Y_ToSend_Compressed, N*sizeof(int) ) {
        Compress( Y_ToSend, N, Y_ToSendCompressed, &M );
        ReturnCode = MPI_Send( Y_ToSend_Compressed, M+1, MPI_INT,
                               destination, tag, MPI_COMM_WORLD );
        return ReturnCode;
    }
    else {
        return -1;
    }
}
```
FIG. 10C

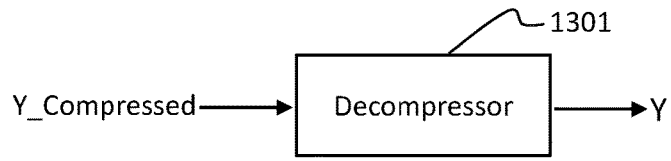
FIG. 13A
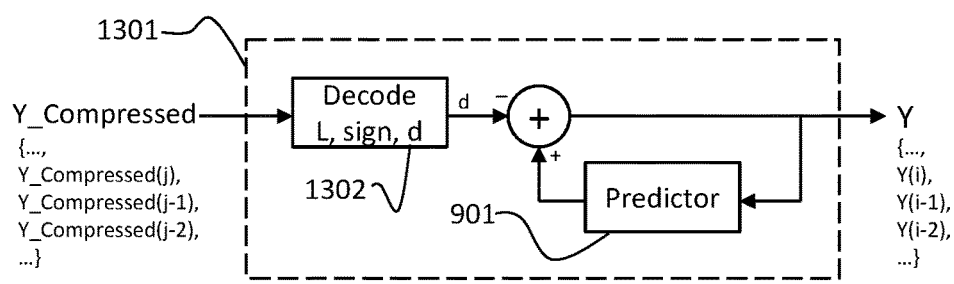
FIG. 13B
```
void DecompressY( int *Y_Compressed, int M, int *Y, int *N ) {
  int i = 0;  int j = 0;  int p = 0;  int d; int L; int last = 0;
  do {
        // Decode
        L = PullFromArray( Y_Compressed, &j, &p, 5 );
        sign = (-1) * PullFromArray( Y_Compressed, &j, &p, 1 );
        d = sign * PullFromArray( Y_Compressed, &j, &p, L );
        // Compute Y and predict next element
        Y[i] = last - d;
        last = Y[i];
        i++;
  } while( i < N );
  return;
}
```
FIG. 13C

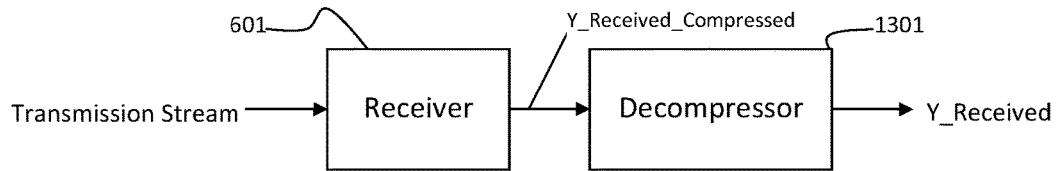

FIG. 14A

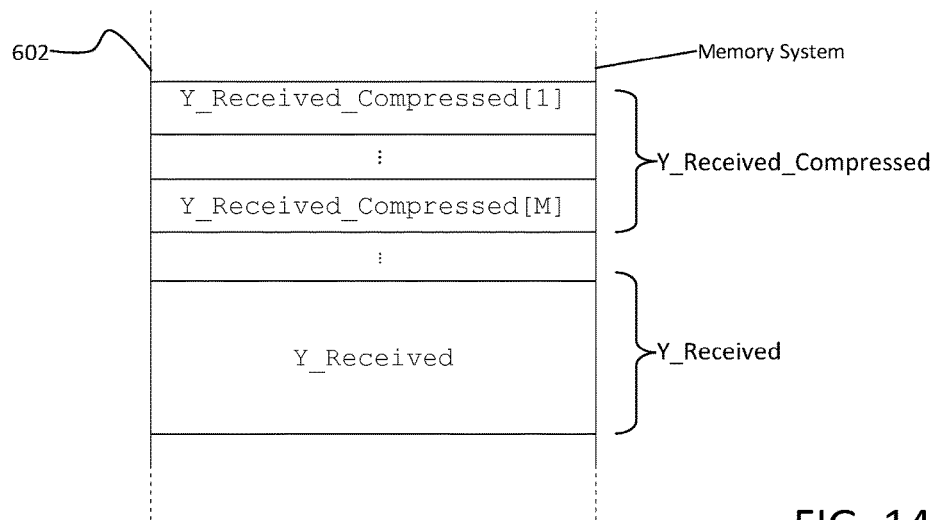

FIG. 14B

```
int ReceiveAndDecompress( int *Y_Received, int *N, int source ){
  int ReturnCode;  int *Y_Received_Compressed, int M;
  if ( !MPI_Get_count( &status, MPI_INT, &M ) ) {
    if ( !malloc( Y_Received_Compressed, M*sizeof(int) ) ) {
      ReturnCode = MPI_Recv( Y_ReceivedCompressed, M+1, MPI_INT,
                             source, tag, MPI_COMM_WORLD,
                             &status );
      Decompress( Y_ReceivedCompressed, M, Y_Received, N );
      return ReturnCode;
    } else { return -1; }
  } else { return-2; }
}
```

FIG. 14C

```
void DiscriminateAndPack( int *Y, int Ny,
                          int *Y_ToSend, int *N, int b)  {
    int i;
    int Incrementk = 0;   int P = 0;   int k = 0;   int y1, y2;
    Y_ToSend[k] = 0;
    for ( i = 0;   I < Ny;   i++ ) {
        y1 = ( y[i]<<b ) >> P;
        if ( (P-b) >0 ) {
            y2 = y[i] << (32-P);
            Incrementk = 1;
        } else {
            y2 = 0;
            P += (32-b);
        }
        Y_ToSend[k] += y1;
        Y_ToSend[k+1] = y2;
        if ( Incrementk ) {
            k++;
            Incrementk=0;
            y_ToSend[k]=0;
        }
    }
    *N=k;
    return;
}
```

```
void DiscriminateAndRewrite( int *Y, int Ny,
                             int *Y_ToSend, int *N, int b ) {
    int i;
    int Mask=0xFF;
    Mask= (Mask << b)>> b;
    for (  i = 0;  I < Ny; i++  ) {
        Y_ToSend[i] = Y[i]&Mask;
    }
    *N = Ny;
    return;
}
```

```
:
for (  i = 0;  i < N; i++ )
{
    Y_ToSend[i] = abs( Y[i] );
}
CompressAndSend( Y_ToSend, N, destination );
:
```

```
void Unpack( int *Y_Received, int N, int *Y, int Ny, int b )
{
    int i;
    int y1, y2;
    int p = 0
    int Incrementk = 0;
    int k = 0
    for ( i = 0; I < Ny; i++ )
    {
        y1 = Y_Received[k] << p;
        if ( (p-b) > 0 )
        {
            y2 = Y_Received[k+1] >> (p+1);
            p = p - b;
            Incrementk = 1;
        }
        else
        {
            y2 = 0
            p = ( (p+32-b) % 32 ) + 1;
        }
        y[i] = y1 + y2;
        if ( IncrementK ){
            k++;
            Incrementk=0;
        }
    }
    return;
}
```

```
void PackWithSensitivity_BitElimination( double*Y, double*X,
                                unsigned long N,
                                unsigned long *s,
                                unsigned long *Ns,
                                unsigned long *e,
                                unsigned long *Ne,
                                unsigned long *m,
                                unsigned long *Nm,
                                unsigned long *sensitivity
                                unsigned long *Nsensitivity)
{
    int i, Ps, Pe, Pm, Psensitivity;
    double delta;
    unsigned long delta_AsInterger, sign, exponent, mantissa;
    unsigned long sensitivity;
    Ps = 0;  Pe = 0;  Pm = 0;  Psensitivity = 0;
    *Ns = 0;  *Ne = 0;  *Nm = 0;  *Nsensitivity = 0;
    for (i=0; i<N; i++)
    {
      Delta = Y[i]-X[i];
      delta_AsInteger = (unsigned long) delta;
      sign = delta_AsInteger >> 63;
      exponent = (delta_AsInteger<<1) >> 54;
      mantissa = (delta_AsInteger<<12) >> 12;
      if (  fabs(delta) < fabs(Y[i]) )
      {
        sensitivityT=((((unsigned long)X[i])<<1)>>54))-exponent;
      }
      else
      {
        sensitivity = 52;
      }
      Mantissa = mantissa >> (52-sensitivityT);
      PushToArray( sign, 1, s, Ns, &Ps );
      PushToArray( exponent, 11, e, Ne, &Pe );
      PushToArray( mantissa, sensitivityT, Nm, &Pm );
      PushToArray( sensitivityT, 6, sensitivity, Nsensitivity,
                   &Psensitivity);
    }
    return;
}
```

FIG. 28

```
void  PackWithSensitivity_BitReplacing(double *Y, double *X,
                                       unsigned long N,
                                       unsigned long *s,
                                       unsigned long *Ns,
                                       unsigned long *e,
                                       unsigned long *Ne,
                                       unsigned long *m,
                                       unsigned long *Nm)
{
   int i, Ps, Pe, Pm, Psensitivity;
   double delta;
   unsigned long delta_AsInteger, sign, exponent, mantissa;
   unsigned long sensitivity;
   Ps=0; Pe=0; Pm=0; Psensitivity=0;
   *Ns=0; *Ne=0; *Nm=0; *Nsensitivity=0;
   for (i=0; i<N; i++)
   {
      Delta = Y[i]-X[i];
      delta_AsInteger = (unsigned long) delta;
      sign = delta_AsInteger>>63;
      exponent = (delta_AsInteger<<1)>>54;
      mantissa = (delta_AsInteger<<12)>>12;
      if (  fabs(delta) < fabs(Y[i]))
      {
         sensitivityT=((((unsigned long)X[i])<<1)>>54))-exponent;
      }
      else
      {
         sensitivity = 52;
      }
      mantissa=(mantissa>>(52-sensitivityT))<<(52-sensitivityT);
      PushToArray( sign, 1, s, Ns, &Ps );
      PushToArray( exponent, 11, e, Ne, &Pe );
      PushToArray( mantissa, 52, Nm, &Pm );
   }
   return;
}
```

FIG. 30

```
void  UnpackWithSensitivity ( unsigned long *s,
                              unsigned long Ns,
                              unsigned long *e,
                              unsigned long Ne,
                              unsigned long *m,
                              unsigned long Nm,
                              unsigned long *sensitivity,
                              unsigned long Nsensitivity,
                              unsigned long *delta,
                              unsigned long N )
{
    unsigned long i;
    unsigned long sign, exponent, mantissa, sensitivityT;
    unsigned long i_s, i_e, i_m, i_sensitivity;
    unsigned long Ps, Pe, Pm, Psensitivity;
    unsigned long delta_AsInteger;

i_s = 0;  i_e = 0;  i_m = 0;  i_sensitivity= 0 ;
    Ps = 0;  Pe = 0;  Pm = 0;  Psensitivity = 0;

for ( i = 0;  i < N;  i++ )
    {
        sign = PullFromArray( s, 1, &i_s, &Ps );
        sign = sign << 63;
        exponent = PullFromArray( e, 11, &i_e, &Pe );
        exponent = exponent << 54;
        sensitivity = PullFromArray( sensitivity, 6,
                        &i_sensitivity, &Psensitivity );
        mantissa = PullFromArray( m, sensitivityT, &_m, &P_m );
        mantissa = mantissa << (52-sensitivityT);
        delta_AsInteger = sign + exponent + mantissa;
        delta[i] = (double)delta_AsInteger;
    }
    return;
}
```

FIG. 34

```
void WriteToMemoryWithSensitivity(
    double *X,                   // Input array
    unsigned int Nx,             // Number of elements in X
    unsigned long *Xv,           // Sensitivities of numbers in X
    unsigned long *Xc,           // Output (sensitivity-packed) array
    unsigned int *Index_Xc,      // First element of Xc available for writing
    unsigned int *BitPointer_Xc, // First bit (from MSB to LSB) of
                                 // Xc[*Index_Xc] available for writing
    unsigned int PackingType,    // Type of packing
    unsigned long *se,              // Array of combined sign-exponent (aux)
    unsigned long *sec,          // Array of compressed se (aux)
    unsigned long *vm,           // Array of combined sensitivity-mantissa
                                 // (auxiliary variable)
    double *Xr,                  // Array of sensitivity-based modified X
                                 // (auxiliary variable)
                                 ) {
// Declare and initialize variables
    int i;       // Index for loops
    int j = 0; int k = 0;   // Indices for data packing
    int p = 1; int q = 0;   // Pointers for data packing
    int M;     // Size of compressed arrays
    unsigned long X_AsInteger;    // Casts values of X as integers // Optional: Use predictor (e.g., delta encoder) for elements in X // Packing with bit elimination
    if ( PackingType == BIT_ELIMINATION_WITH_COMPRESSED_SIGN_AND_EXPONENTS ) {
        for ( i = 0;  i < Nx;  i++ ) {
            X_AsInteger = (unsigned long) X[i];
            // Read sign and exponents
                PushToArray( X_AsInteger, 1, 12, se, &j, &p );
            // Pack mantissas with sensitivity information
                PushToArray( Xv[i], 59, 64, vm, &k, &q );
                PushToArray( X_AsInteger, 13, (13+(Xv[i]-1)), vm, &k, &q );
        }

// Compress sign and exponents
            Compress( se, (j+1), sec, &M );

// Pack into a single array Xc
            PushToArray( M, 1, 64, Xc, Index_Xc, BitPointer_Xc );
            PushArrayToArray( sec, 1, 64*M, Xc, Index_Xc, BitPointer_Xc );
            PushToArray( k, 1, 64, Xc, Index_Xc, BitPointer_Xc );
            PushToArray( j, 1, 64, Xc, Index_Xc, BitPointer_Xc );
            PushArrayToArray( vm, 1, 64*k + q, Xc, Index_Xc, BitPointer_Xc);
    }

// Packing with bit replacing
    else if ( PackingType == BIT_REPLACING )  {
        for ( i = 0;  i < Nx;  i++ ) {
            X_AsInteger = (unsigned long) X[i];
            // Replace LSBs with zeros
                X_AsInteger = ( X_AsInteger >> (52-Xv[i]) ) << (52-Xv[i]);
            Xr[i] = X_AsInteger;
        }
        Compress( Xr, N, vm, &M );
        PushArrayToArray( vm, 1, 64*M, Xc, Index_Xc, BitPointer_Xc);

}

// Other packings
    else {
        // Other packings
    }

// Return
    return;
}
```

FIG. 38

```
void ReadFromMemoryWithSensitivity(
    unsigned long *Xc,          // Input, ssensitivity-packed array
    unsigned int Nx,            // Number of elements in X
    double *X,                  // Output array
    unsigned long *Xv,          // Sensitivities of numbers in X
    unsigned int *Index_Xc,     // First element of Xc to be read
    unsigned int *BitPointer_Xc,// First bit (from MSB to LSB) of
                                // Xc[*Index_Xc] to be read
    unsigned int PackingType,   // Type of packing
    unsigned long *se,          // Array of combined sign-exponent (aux)
    unsigned long *sec,         // Array of compressed se (aux)
    unsigned long *vm,          // Array of combined sensitivity-mantissa
                                // (auxiliary variable)
    double *Xr,                 // Array of sensitivity-based modified X
                                // (auxiliary variable)
) {
// Declare and initialize variables
    int i;                      // Index for loops
    int j = 0; int k = 0;       // Indices for data packing
    int p = 1; int q = 1;       // Pointers for data packing
    int M, Nse;                 // Size of compressed arrays
    unsigned long X_AsInteger;  // Casts values of X as integers // Packing with bit elimination
    if ( PackingType == BIT_ELIMINATION_WITH_COMPRESSED_SIGN_AND_EXPONENTS ) {
        // Unpack into a combined sign-exponent and sensitivity-mantissa
        // arrays
            M = PullFromArray( Xc, Index_Xc, BitPointer_Xc, 64 );
            PullArrayFromArray( Xc, Index_Xc, BitPointer_Xc, sec, 64*M );
            j = PullFromArray( Xc, Index_Xc, BitPointer_Xc, 64 );
            p = PullFromArray( Xc, Index_Xc, BitPointer_Xc, 6 );
            PullArrayFromArray( Xc, Index_Xc, BitPointer_Xc,
                                vm, 64*(j-1) + p );
            j = 0; p = 1;

// Decompress sign and exponents
            Decompress( sec, M, se, &Nse );

for ( i = 0;  i < Nx;  i++ ) {
            // Read sign and exponents
                X_AsInteger = ( PullFromArray( se, &j, &p, 12 ) ) << 52;

// Unpack mantissas with sensitivity information
                Xv[i] = PullFromArray( ve, &k, &q, 6 );
                X_AsInteger = X_AsInteger
                            + PullFromArray( ve, &k, &q, Xv[i] );

// Cast as double
                X[i] = (double)X_AsInteger;
        }
    }

// Packing with bit replacing
    else if ( PackingType == BIT_REPLACING ) {
        M = PushFromArray( Xc, Index_Xc, BitPointer_Xc, 64 );
        PushArrayFromArray( Xc, Index_Xc, BitPointer_Xc, Xr, 64*M );
        Decompress( Xr, M, X, &Nx );
    }

// Other packings
    else {
        // Other packings
    }

// Return
    return;
}
```

FIG. 40

```
void AxpyWithSensitivity( double a,
                          unsigned long *X_Compressed,
                          unsigned long *Y_Compressed,
                          unsigned long *Z_Compressed,
                          unsigned int N,
                          unsigned int PackingType,
                          unsigned int BlockSize ) {

// Declare and initialize variables; temporary variables are not defined here,
    // they should be declared as global and their initialization is external to this
    // function.
        int i, j;
        unsigned int BitPointer_Xc, BitPointer_Yc, BitPointer_Zc;
        unsigned int Index_Xc, Index_Yc, Index_Zc;
        unsigned long Xe, Ye, Ze;
        BitPointer_Xc = 1;  BitPointer_Yc = 1;  BitPointer_Zc = 1;
        Index_Xc = 0;  Index_Yc = 0;  Index_Zc = 0;

// Main loop
        for ( i = 0;  i < N;  i = i + BlockSize ) {

// Read data from memory
                ReadFromMemoryWithSensitivity( X_Compressed, BlockSize, X, Xv,
                                               &Index_Xc, &BitPointer_Xc, PackingType,
                                               se, sec, vm, Xr );
                ReadFromMemoryWithSensitivity( Y_Compressed, BlockSize, Y, Yv,
                                               &Index_Yc, &BitPointer_Yc, PackingType,
                                               se, sec, vm, Xr );

// Compute AXPY and sensitivity
                for ( j = 0;  j < BlockSize;  j++ ) {
                    Z[j] = a*X[j] + Y[j];
                    Xe = ( ( ( (unsigned long) X[j] )<<1 ) >> 53 ) - BIAS;
                    Ye = ( ( ( (unsigned long) Y[j] )<<1 ) >> 53 ) - BIAS;
                    Ze = ( ( ( (unsigned long) Z[j] )<<1 ) >> 53 ) - BIAS;
                    Zv = max( 0, Ze - max( Xe - Xv[j], Ye - Yv[j] ) );
                }

// Write results in memory
                WriteToMemoryWithSensitivity( Z, BlockSize, Zv, Z_Compressed,
                                              &Index_Zc, &BitPointer_Zc, PackingType,
                                              se, sec, vm, Zr );
        }
        return;
}
```

FIG. 43

```
double DotProductWithSensitivity( unsigned long *X_Compressed,
                                  unsigned long *Y_Compressed,
                                  unsigned int N,
                                  unsigned int PackingType,
                                  unsigned int BlockSize ) {

// Declare and initialize variables; temporary variables are not
    // defined here, they should be declared as global and their
    // initialization is external to this function.
        int i, j;
        unsigned int BitPointer_Xc, BitPointer_Yc;
        double sum = 0;
        BitPointer_Xc = 1;  BitPointer_Yc = 1;
        Index_Xc = 0;  Index_Yc = 0;

// Main loop
        for ( i = 0;  i < N;  i = i + BlockSize )  {

// Read data from memory
                ReadFromMemoryWithSensitivity( X_Compressed,
                                               BlockSize, X, Xv,
                                               &Index_Xc,
                                               &BitPointer_Xc,
                                               PackingType,
                                               se, sec, vm, Xr );
                ReadFromMemoryWithSensitivity( Y_Compressed,
                                               BlockSize, Y, Yv,
                                               &Index_Yc,
                                               &BitPointer_Yc,
                                               PackingType,
                                               se, sec, vm, Xr );

// Compute dot product
                for ( j = 0;  j < BlockSize;  j++ )  {
                    sum = sum + (X[j]*Y[j]);
                }
        }
        return sum;
}
```

FIG. 46

ARRANGEMENTS FOR COMMUNICATING DATA IN A COMPUTING SYSTEM USING MULTIPLE PROCESSORS

CROSS-REFERENCE TO RELATED APPLICATIONS

This application is a Continuation of co-pending U.S. patent application Ser. No. 15/187,756, entitled SYSTEMS AND METHODS FOR REDUCING BIT LENGTH IN COMPUTER SYSTEMS, filed on Jun. 20, 2016, which is a Continuation of U.S. patent application Ser. No. 14/990,747, entitled SYSTEMS AND METHODS FOR REDUCING BIT LENGTH IN COMPUTER SYSTEMS, filed on Jan. 7, 2016, which is a Continuation-In-Part of U.S. patent application Ser. No. 14/556,098, entitled SYSTEMS AND METHODS FOR REDUCING DATA MOVEMENT IN COMPUTER SYSTEMS, filed on Nov. 28, 2014, which claims priority to Provisional Patent Application No. 61/910,010, entitled SYSTEMS AND METHODS OF WACSING AND ANCHORING FOR REDUCING DATA TRAFFIC IN DISTRIBUTED COMPUTING SYSTEMS, filed on Nov. 27, 2013, U.S. Provisional Patent Application No. 62/101,347, entitled "SYSTEMS AND METHODS FOR REDUCING BIT LENGTH IN COMPUTER SYSTEMS", filed on Jan. 8, 2015, and U.S. Provisional Patent Application No. 62/105,398, entitled "SYSTEMS AND METHODS FOR REDUCING BIT LENGTH IN COMPUTER SYSTEMS", filed on Jan. 20, 2015, the disclosures of which are herein incorporated by reference in their entirety.

STATEMENTS REGARDING FEDERALLY SPONSORED RESEARCH OR DEVELOPMENT

The invention described herein was partially made in the performance of work under Department of Energy Small Business Innovation Research (SBIR) Contract DE-SC0006379, and work under NASA Small Business Innovation Research (SBIR) Contract NNX13CA43P.

BACKGROUND OF THE INVENTION

Field of the Invention

The present invention relates generally to the field of computing. More specifically, the present invention is related to bit length reduction in computer systems.

Representing Numerical Data in Computer Applications

Computer applications, including algorithms and software that is executed in computer and/or digital systems are very important for many fields today, e.g., solution of linear equations, solution of partial differential equations, analysis of financial market statistics, weather modeling, mechanical design, aircraft design, automotive design, structural design, among many others. Virtually every computer application requires the use of digital representations of numbers.

In digital/computer systems, numbers are encoded by means of binary digits or bits. There are multiple formats or encodings available for representing numerical data (i.e., numbers) in computer applications. Some examples include, among others: integers, fixed point, floating point, and logarithmic representations. In general, these formats define a number of bits (usually known as "precision") and a format for storage of information that represent numerical data. Users or designers of computer applications may select formats and precisions based on several criteria, such as desired accuracy of the solutions rendered by the application, available capacity for data storage, etc.

Regardless of the format or encoding of a number, it is desired to use as less bits as possible for its representation. Reasons for this goal may include: maximizing the use of storage capacity, reducing access times, reducing communication time, reduce time to solution, reducing power consumption, etc. This patent provides solutions for reducing the number of bits (i.e., bit length) used for representing data elements in computer applications/systems.

Floating Point Representations of Numerical Data

As an example of formats used for representing numbers, here we briefly describe the floating point format. In general, the representation of a given number x in floating point is based on four parameters, namely: a sign s, a significant f, an exponent base b, and an exponent e. A number x in floating point format is expressed in the following manner:

$$x = \pm f \times b^e.$$

There are many alternative floating point representation formats. For illustration purposes, we focus on the ANSI/IEEE 754 format for the description of the embodiments described in this document, although it should be apparent to someone skilled in the art that the embodiments will also work for other floating point and non-floating point formats, in general. The standard representation specified by ANSI/IEEE 754 specifies the following:

a) The exponent base is 2 (i.e., b=2).
b) The sign is either +1 or −1, and it is represented by a sign bit s set to 1 if the sign is −1, and 0 if it is +1.
c) The significant is f=1.m, where m is a binary number usually referred to as mantissa, which could be of length 23 bits for single-precision floating point numbers, or 52 bits for double-precision floating point numbers.
d) The exponent is a biased binary number of length 8 bits for single-precision floating point numbers, and length 11 bits for double-precision floating point numbers. In its decimal representation, the bias is 127 in single precision floating point numbers, and 1023 in double precision floating point numbers.
e) Special cases are also encoded into the floating point standard: 0, NaN, Inf, and −Inf.

Addition and subtraction are basic operations for floating point numbers. The addition of two floating point numbers $x_1$ and $x_2$ can be described as follows (note that the following explanation also describes the subtraction, as the subtraction can be converted into an addition by flipping the sign of the number to be subtracted). Consider the addition:

$$(\pm 1.m_1 \times 2^{e_1}) + (\pm 1.m_2 \times 2^{e_2}) = \pm 1.m \times 2^e.$$

In a typical arithmetic processing unit, the two numbers are aligned by shifting to the right the mantissa of the number with the smaller exponent. Without loss of generality, assume that $e_1 \geq e_2$. In this case, the second number (i.e., $x_2$) is shifted and becomes:

$$\pm 1.m_2 \times 2^{e_2} = (\pm 1.m_2)/(2^{e_1-e_2}) \times 2^{e_1}.$$

The operation above is equivalent to shifting $1.m_2$ to the right by $(e_1-e_2)$ bits. After the operands are aligned, the addition proceeds as follows:

$$(\pm 1.m_1 \times 2^{e_1}) + (\pm 1.m_2 \times 2^{e_2}) = (\pm 1 m_1 \pm 1.m_2/2^{e_1-e_2}) \times 2^{e_1} = (\pm f_3) \times 2^{e_1}.$$

In typical implementations, this result goes through a process of normalization to produce the result in a format that complies with the floating point standard. That is to say, the addition renders $x_3 = (\pm f_3) \times 2^{e_1} = (\pm 2.m_3) \times 2^e$.

Storing and Moving Data in Memory

Computer systems may count with several types of memory, with particular types being distinguished by characteristics such as access time, power consumption, capacity (i.e., number of bits/data elements that can be stored in the memory), cost, etc. When more than one type of memory is available, the memories may be classified according to their performance (e.g., response time, complexitiy, capacity) in levels or hierarchies. Memories at the lower part of the hierarchy may have fast access speeds for data retrieval, as well as low energy consumption, but are usually more expensive and hence come in smaller capacities. Memories located at the higher part of the hierarchy may be larger in capacity, but have slower access times and consume larger (average) amounts of energy per bit moved.

The memory hierarchies of today's computing systems may be composed of (ascending from the lowest level in the hierarchy to the highest): a system of registers, a group of cache memories (such as L0, L1, L2, L3, etc.), a system of local memories (such as RAM), and a system of external storage (such as hard disk drives, solid state drives, cloud storage, etc.)

In computer applications, it is common practice to try to keep as much data movement as possible around the lower levels of the memory hierarchy, thus minimizing costs, both in access time and power consumption. When data is moved to a higher level of the hierarchy, a higher cost in access time and power consumption is paid. Thus, there exists a constant need of moving fewer bits to the memories in higher levels of the hierarchy.

Moving Data in Distributed Computer Systems

Distributed computer systems consist of several processing units that are interconnected through a network, with the capability of working together to reach a common goal (e.g., solving a partial differential equation, simulation, or, in general, solving a computing application/problem). The processing units in the network may communicate through messages that may be passed via one-to-one or one-to-many interactions.

Distributed computing systems include, but are not limited to supercomputers, Beowulf clusters, and multiprocessor computers, in which the processing units may be single-core processors, multicore processors, accelerators (e.g. GPUs, MICs, etc.), or other types of processor systems (e.g., specialized processors). Some of the processing units may count with a hierarchy of memory or storage devices with different storage capacity, costs, access speeds, power consumption rates, etc.

Each processing unit may also count with different communication channels that are part of a communication network to transfer data to and from other processing units placed in different locations of the network. Some examples of communication networks include Infiniband and Ethernet. In some computing systems, more than one processing unit may share access to a common memory or storage device. It is thus said that these processing units "share" memory or storage. Systems where this sharing occurs are usually referred to as shared memory systems. Communication between processing units in shared memory systems may be enabled through "reading" and "writing" on the shared memory (e.g., to transfer datum A from Processing Unit 1 to Processing Unit 2, Processing Unit 1 writes A into the shared memory, and subsequently, Processing Unit 2 reads it from said shared memory), as opposed to transmitting and receiving explicit messages through a network.

In distributed computing systems both communication time and power consumption may grow as the number of bits that must be transmitted for solving a problem increase. There is often a need by the users of computing applications to reduce either the power consumption, or the time it takes to execute the application, or both. Thus, there is a need for distributed computing systems to spend less time and power in data transmission. Two known approaches to solve this need focus on (1) reducing the length of the transmitted numbers (i.e., the amount of bits in each of the numbers) or (2) reducing the amount of numbers to transmit.

Approaches that aim at reducing the length of the transmitted numbers include:

a) Mixed-precision: It consists in allowing each named program variable in the application to have its own format with its own bit lengths (or precisions) from a set of formats and lengths (or precisions) supported by the processing units, as opposed to the traditional practice of assigning to all of the variables the same format and length (or precision). This will potentially reduce the overall size of any message used to transmit the bits that make up the information in a set of variables. The fact that different variables have "a mixture" of precisions grants the technique its name. In general, mixed precision approaches try to find "pieces" of the application that can be computed with less than the maximum native precision of the computer system (often either 32 or 64 bits), in hopes that the requirement for less complex computing resources (coming from the reduced bit lengths) or the resulting savings in memory or network traffic (also coming from the reduced bit lengths) will help accelerate the application and/or reduce its running time. In general, the spirit is that the "loss of precision" incurred by the reduced precision inside the "pieces" can be compensated by the other "pieces" of the algorithm that remained at higher precision.

b) Data compression: Here, a compression algorithm is used to reduce the message size before it is sent, and once received, to decompress the data in that message. In distributed computing systems, communication may be more costly than computation (e.g., in terms of power consumption or time spent in communication), thus, computing resources may be spent on compressing and decompressing the data. In general, a shorter message will reduce the overall transmission time and power consumption, even after adding the cost of compressing and decompressing the data.

An approach that aims at reducing the amount of numbers to transmit is communication avoidance. This approach is focused on performing artifices on the application, in such a way that the underlying algorithms are modified to reduce the total amount of words or numbers to be transmitted. An example of a successful application of these algorithms is found in linear algebra computations, where a wide set of problems has been tested for specific custom-designed "communication-avoiding" algorithms,

BRIEF SUMMARY OF THE INVENTION

The present invention provides systems and methods for reducing the bit length of numerical data in computer systems.

BRIEF DESCRIPTION OF THE SEVERAL VIEWS OF THE DRAWINGS

A more complete understanding of the present invention, and the attendant advantages and features thereof, will be more readily understood by reference to the following detailed description when considered in conjunction with the accompanying drawings wherein:

FIGS. 4A-4C illustrate example transmitters.

FIGS. 6A-6C illustrate example receivers.

FIGS. 10A-11 illustrate example embodiments of the invention.

FIGS. 13A-13C illustrate example decompressors.

FIGS. 14A-15 illustrate example embodiments of the invention.

FIG. 17-21B illustrate example embodiments of the invention.

FIGS. 24-46 illustrate example embodiments of the invention.

DETAILED DESCRIPTION OF THE INVENTION

Figure 1:
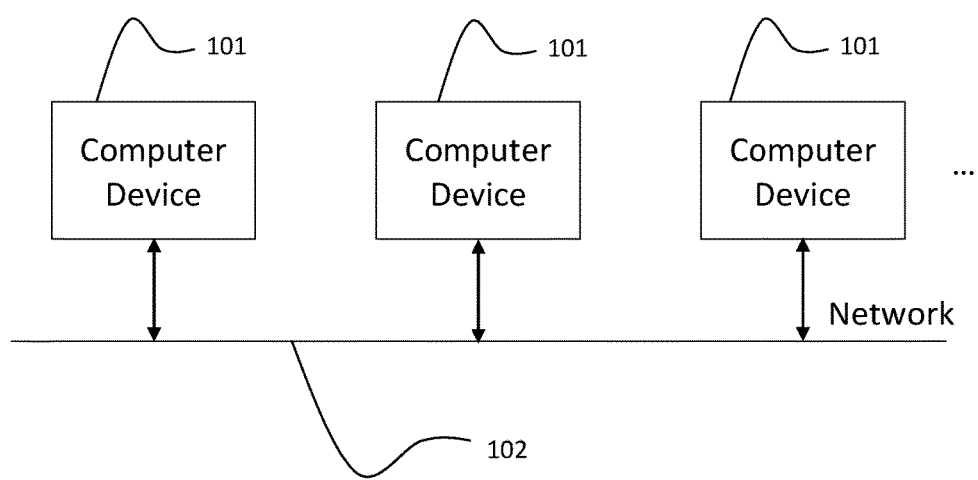
FIG. 1 illustrates an example distributed system.

Reference will now be made in detail to exemplary embodiments of the present invention, examples of which are illustrated in the accompanying drawings, wherein like reference numerals refer to the like elements throughout. The exemplary embodiments are described below to explain the present invention by referring to the figures.

As used in the description of this application, the terms "a", "an", and "the" may refer to one or more than one of an element (e.g., item or act). Similarly, a particular quantity of an element may be described or shown while the actual quantity of the element may differ. The terms "and" and "or" may be used in the conjunctive or disjunctive sense and will generally be understood to be equivalent to "and/or". References to "an" or "one" embodiment are not necessarily all referring to the same embodiment. Elements from an embodiment may be combined with elements of another. No element used in the description of this application should be construed as critical or essential to the invention unless explicitly described as such. Further, when an element is described as "connected", "coupled", or otherwise linked to another element, it may be directly linked to the other element, or intervening elements may be present.

As discussed in the background of the present invention, numerical processes, codes, or algorithms often rely on moving and/or storing large amounts of data. This data could be inputs, outputs, or intermediate variables, parameters, or, in general, numbers or signals, generated during the execution of numerical processes. This data movement or storage may occur at different levels in computer systems. For example, data may be moved from a storage device, from external memory to cache memory in a personal computer, or among computer devices in a supercomputer network. The present invention provides systems and methods for reducing the number of bits used for representing data elements in computer systems.

Overview of the Components of an Implementation

A computer system is a collection of one or more processing units and memory components interconnected by communication links that transport data between components. FIG. 1 illustrates an example computer system that may be used with one or more embodiments described herein. The system in FIG. 1 contains a plurality of computer devices 101 interconnected by a network 102. Examples of computer devices are personal computers, workstations, Graphical Processing Units (GPUs), etc. A network 102 is a communication link that transports data between computer devices 100. Many types of networks are available, such as Ethernet, phone lines, synchronous optical networks, powerline communications, mobile ad-hoc networks, etc. A user of a computer system may be, under the context of the invention, an application user, a programmer, a system designer, any person that makes use of a computer system either during its design, implementation, or during its operation, or any person that designs and/or makes use of the present invention in any of its embodiments.

Figure 2A:
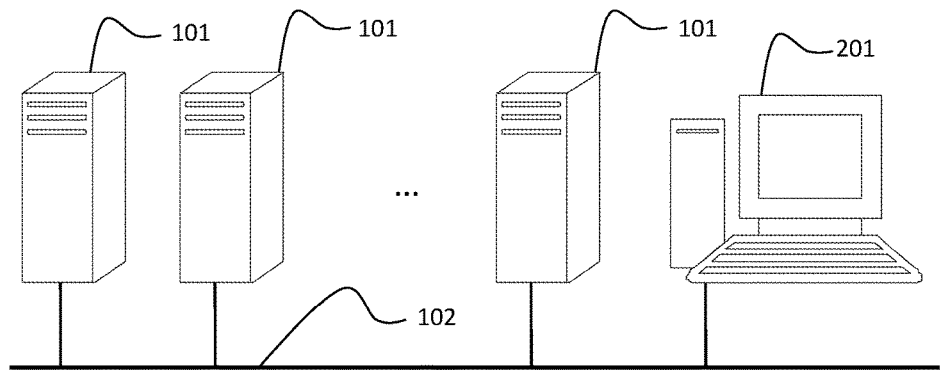
FIGS. 2A-2B illustrate examples distributed systems.
Figure 2B:
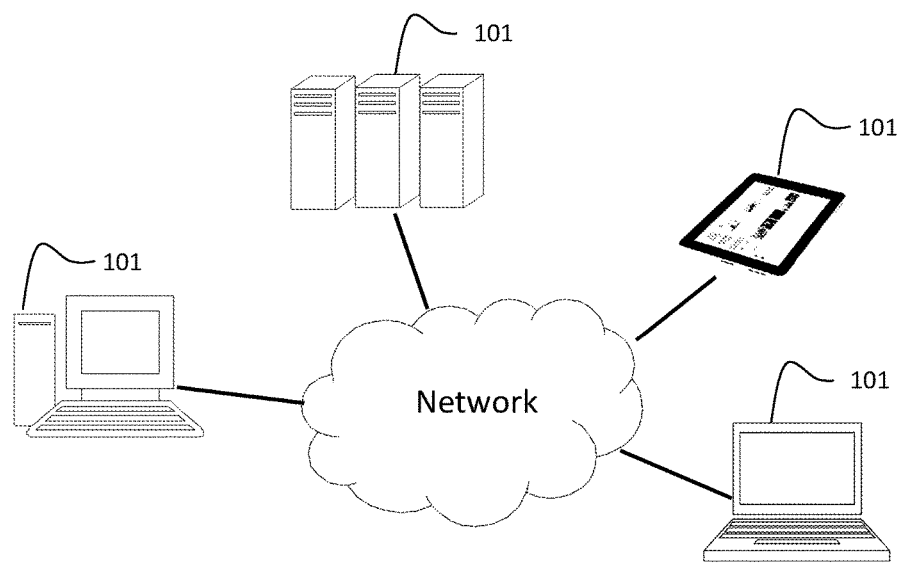

FIG. 2A illustrates an example computer system, in which computer devices 101 are nodes of a Beowulf cluster, connected by a network 102 which is typically a high-speed interconnect. Computer devices 101 in FIG. 2A may be programmed using a terminal computer 201. A terminal computer is any device that allows a user to input information and/or data into the computer system. FIG. 2B illustrates another example computer system, in which the physical type of computer devices 101 may be different, for example including devices such as computer workstations, laptops, smartphones, tablet computers, or any other computer device or group of computer devices, connected through a network, which may be a virtual network such as the Internet, VPNs, or any other network 102.

Figure 3:
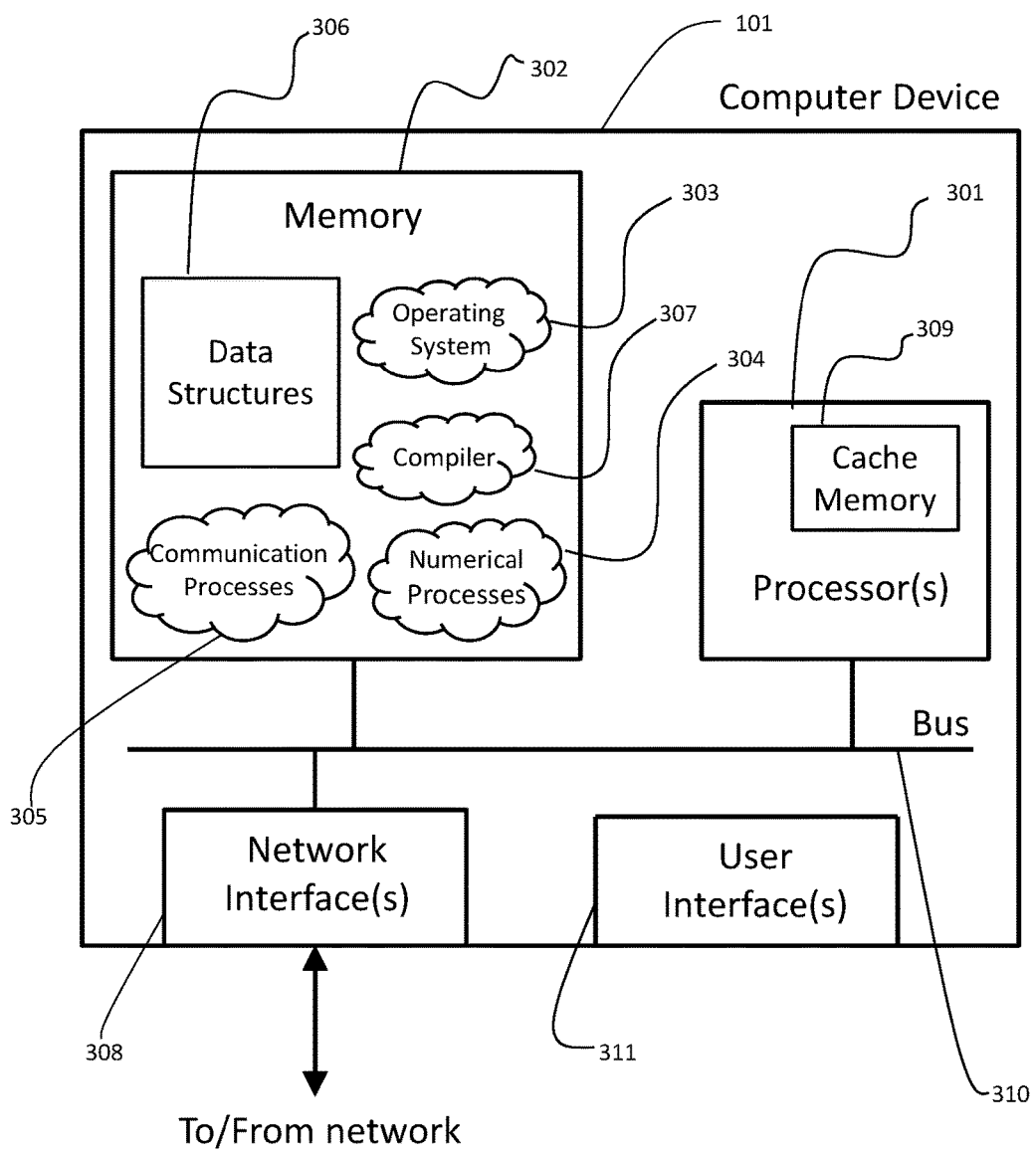
FIG. 3 illustrates an example computer device.

FIG. 3 is a schematic block diagram of an example computer device 101 that may be used with one or more embodiments described herein, e.g., as any of the computer devices shown in FIG. 1, 2A, or 2B. The computer device may comprise at least one processor 301, a memory 302, and one or more network interfaces 303. The memory 302 may comprise a plurality of storage locations that are addressable by the processor 301 and the network interface 308. The memory 302 may be used for storing software programs, numerical processes 304, communication processes 305, and data structures 306 associated with the embodiments described herein. When data structures 306 are separated among several computer devices 101, the computer system may be called "distributed memory system". The memory 302 may also store portions of an operating system 303, which are executed by the processor and which functionally organize the computer device by invoking operations in support of software processes and/or services executing on the device. The memory 302 may also store portions of a compiler 307, which is software that converts object or code programs into a set of instructions to be executed by a processor 301 (e.g., programs that implement embodiments of the invention). The processor 301 may comprise hardware elements or hardware logic adapted to execute the software programs and manipulate the data structures. The processor 301 may have one or more cache memories 309. The time required for accessing to data stored in a cache memory 309 is typically shorter than the time required for accessing said data in memory 302. In computer devices that include both cache memory 309 and memory 302, the cache memory 309 is usually referred to as a lower hierarchy memory, and the memory 302 is referred to as a higher hierarchy memory.

The computer device 101 may comprise a user interface 311. A user interface 311 is an item or combination of items for a user to provide input (e.g., text, voice, position) and/or receive output (e.g., text, images, video, audio) to/from the computer device. Examples of items for a user to provide inputs in a user interface 311 include keyboards, mice, and microphones. Examples of items for a user to receive outputs in a user interface 311 include monitors, printers, and speakers. Through a user interface 311, a user may provide data and/or parameters to software programs, numerical processes 304, communication processes 305, and data structures 306 associated with the embodiments described herein.

The network interfaces 308 may be configured to transmit and/or receive data using a variety of different communication protocols. Data may be organized into data packets for transmission through a network interface 308, according to a network communication protocol. Examples of network communication protocols are IEEE standard 802.15.4, WiFi, Bluetooth, etc. A software program, numerical process 304, communication process 305 may be generated by compiling a set of instructions written in some programming language. Examples of programming languages are C, FORTRAN, VHDL, PHP, Python, etc. Operations in a communication process 305 may be defined using standard software libraries, protocols, and standards, such as Message Passing Interface (MPI), OpenMP, etc.

When a computer system is used for solving a distributed algorithm, it may be called a distributed computer system. An algorithm may be any sequence of data, steps, or processing elements that are used for solving a numerical problem. Examples of numerical problems are the solution of linear equations, partial differential equations, weather forecast, engineering structural analysis, etc. An algorithm is distributed when a plurality of processing or computer devices collaborate for solving the numerical problem. During the execution of a distributed algorithm, some devices may be transmitting data and others may be receiving data. When, at any given time one device is transmitting data, we call it a "transmitting entity". When, at any given time one device is receiving data, we call it a "receiving entity". A computer device 2200 is a transmitting entity when it is sending data to other computer device or devices. A computer device 2200 is a receiving entity when it is receiving data from other computer device or devices. The terms "transmitting entity" and "receiving entity" are defined then based on the functionality of a computer device at a particular moment, but any computer device may be a transmitting entity or a receiving entity at any moment during the execution of a distributed algorithm.

An exemplary implementation of the present invention considers one sending and one receiving entity. However, one skilled in the art would appreciate that the invention can be used for reducing data movement between more than one sending and receiving entities. One skilled in the art would also appreciate that the invention can be used in various environments other than in distributed computer systems. For example, when a processor 301 requests or sends data from/to a memory 302, data movement occurs between processor 301 and the memory 302. In this scenario, at a given moment a transmitting entity may be a memory 302 or a cache memory 309. Similarly, at a given moment a receiving entity may be a memory 302 or a cache memory 309. In yet another exemplary scenario, a computer device may reduce the number of bits that represent a set of data elements for storage (e.g., in memory, disc) in a computer device.

Bit-Garbage in Numerical Data

Binary representations of numbers in computer devices vary in format and characteristics. For example, the ANSI/IEEE 754 format defines floating point numbers, where specific formats for 32-bit and 64-bit representations of numbers are defined. ASCII defines the encoding of 128 characters using 7 bits. Similarly, other formats standardized or not, may be used in computer devices. The selection of appropriate formats to represent numbers in an algorithm or application is typically done by a designer or user of the device, whom may use particular knowledge or criteria related to the application that will use the binary representation, or simply arbitrarily selecting formats. For example, one criterion for the selection of binary representations could be enabling faster computations. Even when data formats are carefully selected, typical scenarios in applications of computer systems/devices may contain binary representations of data elements that include some bits that are either not used, or that may contain corrupted data.

Figure 22A:
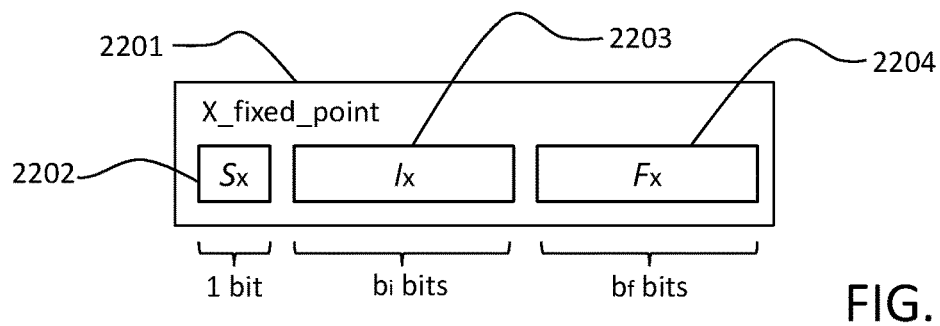
FIGS. 22A-22C illustrate components of floating point numbers and arithmetic operations with fixed point numbers.
Figure 22B:
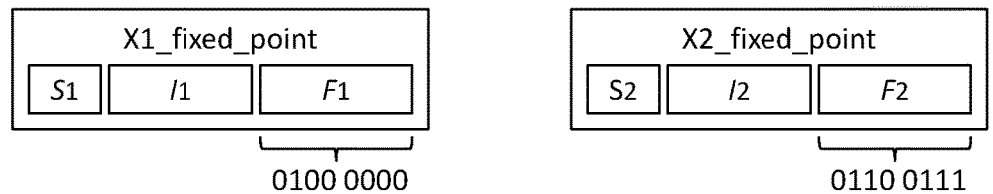
Figure 22C:
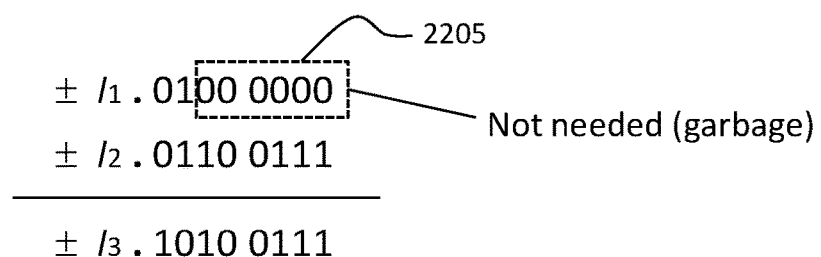

FIGS. 22A, 22B, and 22C illustrate a scenario where some bits may not be used in arithmetic computations in a computer device. This scenario shows an arithmetic operation with binary numbers using a fixed-point representation. A data element X may be represented as X_fixed_point in fixed point arithmetic, as illustrated in FIG. 22A. The exemplary data element X_fixed_point in FIG. 22A is made of three components, namely, a sign bit $S_x$, an integer part $I_x$ of $b_i$ bits, and a fractional part $F_x$ containing $b_f$ bits. Based on the format illustrated in FIG. 22A, FIG. 22B shows fixed point representations $X_1$_fixed_point and $X_2$_fixed_point corresponding to two data elements $X_1$ and $X_2$, respectively. For illustration purposes, consider the case of the fractional part of $X_1$ containing the bits $F_1$='01000000', and the fractional part of $X_2$ containing the bits $F_2$='01100111'. FIG. 22C illustrates the bit-alignment of data in $X_1$_fixed_point and $X_2$_fixed_point for an addition/subtraction operation. Note that, in this addition operation, the set of bits 2205 are zeros. If bits 2205 were not included in the arithmetic operation shown in FIG. 22C, or if these bits 2205 were not stored in a fixed point representation $X_1$_fixed_point, the result of the arithmetic operation in FIG. 22C would not be affected. We may refer to sets of bits that may not be needed as "garbage" bits.

Figure 23A:
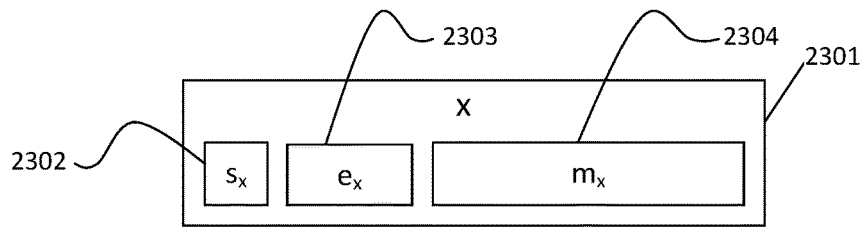
FIGS. 23A-23C illustrate components of floating point numbers and arithmetic operations with floating point numbers.
Figure 23B:
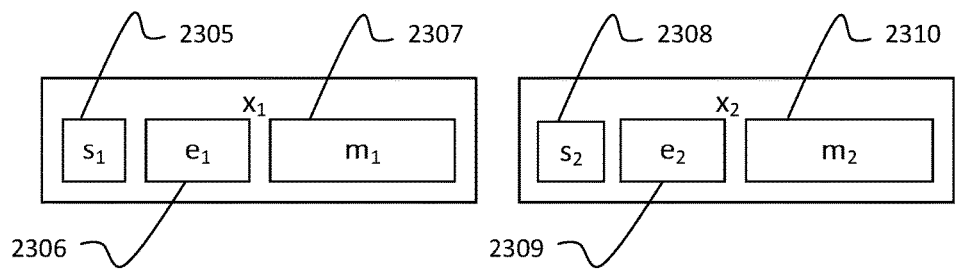
Figure 23C:
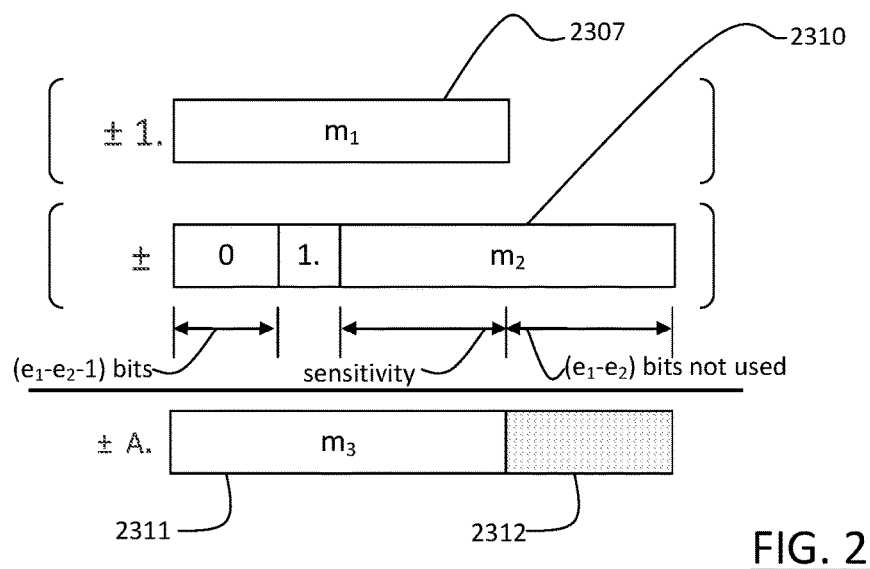

Similarly, another exemplary scenario that illustrates the presence of garbage bits in binary representations of data is shown in FIGS. 23A, 23B, and 23C. FIG. 23A illustrates a typical representation of the components of a floating point number 2301: a sign bit $s_x$ 2302, an exponent "$e_x$" 2303, and a mantissa "$m_x$" 2304. The number of bits and particular formats of each of these components are defined by floating point standards such as ANSI/IEEE 754. Based on the exemplary format shown in FIG. 23A, FIG. 23B illustrates the components $s_1$, $e_1$, and $m_1$, of a floating point number $x_1$, and the components $s_2$, $e_2$, and $m_2$, of a floating point number $x_2$. FIG. 23C illustrates an operation that occurs in a floating point addition and that involves mantissas $m_1$ and $m_2$. As part of a standard floating point addition $x_3=x_1+x_2$, the mantissa of the smaller number is shifted to the right. FIG. 23C illustrates this shifting in an example in which $x_1>x_2$, which requires shifting $m_2$ by ($e_1-e_2$) bits to the right. Once the mantissa $m_2$ is shifted, both mantissas are added, producing a mantissa $m_3$, which is represented by 2311. An additional group of bits 2312 may be generated, which are produced only by the rightmost bits of $m_2$. The group of bits 2312, which originally belonged to $m_2$, is not used when only the output $m_3$ is needed for characterizing the mantissa of a resulting floating point number $x_3$. This means that the group of bits 2312 could then be eliminated from $m_2$ or replaced by any convenient pattern of bits (e.g., zeros) without affecting the result of the floating point addition. According to an aspect of the invention, groups of bits that could be eliminated or replaced without affecting the result of a floating point operation (e.g., multiplication), such as 2312, may also be identified for other arithmetic operations, and may be called "garbage" bits.

Similar to the above described scenarios, other scenarios may exist in which garbage bits are embedded as part of the binary representation of numbers in computer systems/devices. The present invention provides systems and methods for using information about garbage for reducing the bit length of data elements in computer systems/devices.

According to the spirit of the present invention, the number of bits of garbage at the rightmost part of the representation of a number may be characterized by a parameter. We may call this parameter the "sensitivity" of the number. In general, according to the spirit of the present invention, the sensitivity itself or rules that define its computation could be provided by a user. An alternative for receiving the sensitivity parameter is through a user interface 311 in an embodiment (e.g., keyboard-monitor, speech recognition system, selection list, configuration file, among others). The sensitivity could be a number directly defined by a user or defined based on a default configuration, or whose value could be estimated from formulas, methods, or systems, with said formulas, methods, or systems being defined by a user and input into an embodiment. According to an aspect of the present invention, the sensitivity parameter indicates a bit number, from MSB to LSB, that separates a group of bits that should be used in binary representations of numerical data elements, from a group of LSBs that can be considered as garbage bits. For a floating point number, for example, the sensitivity parameter V of a number indicates that the least significant bits of the mantissa beginning with the "(V+1)-th" up to the LSB (or, alternatively, to a bit defined by a maximum sensitivity parameter called "$V_{max}$" have very little information that is useful, or that eliminating such bits will not introduce substantial error into the subsequent computations of an application. In other words, for a floating point number, the sensitivity of a number indicates that the bits (V+1)-th of the mantissa and all subsequent mantissa bits beyond the (V+1)-th are considered, for practical effects, as garbage, in the sense that a user, either directly or indirectly by not altering default sensitivity configuration in an embodiment of the invention, is not interested in exploiting the information in those bits, or the user has reasons to believe that those bits will not be important for the numerical quality of the computations within an overall application.

According to an aspect of the present invention, the sensitivity parameter may be used when encoding a data element for storage (e.g., in memory, cache memory, disc, or any other digital media), for transmission, for memory read/write operations, or for any operation that may occur as part of the execution of a numerical algorithm. The sensitivity of a number may depend on several factors, such as the type of arithmetic operation, other numbers that are operated with it, the purpose for which the result of the arithmetic operation will be used, among others. The sensitivity of an arbitrary number $x_1$ may not be the same of other arbitrary number $x_2$. The sensitivity of a number may change in time when arithmetic operations that include the number are executed. In an embodiment of the present invention, the dynamic nature of the sensitivity may be used for dynamically adapting the number of bits in binary representation of numbers that could be eliminated or replaced by other bit patterns, when the sensitivity represents the number of MSBs that should be used for encoding, transmitting, storing, or operating said data elements numbers. For example, in FIG. 23C, we may set a value called "sensitivity of $m_2$" to indicate the number of bits in $m_2$ that are used in the floating point addition $x_3=x_1+x_2$ described above.

In embodiments of the present invention, the sensitivity of a number may be used throughout the execution of an application for reducing the number of bits in data movement, or data storage, or both. A user of an application may define the sensitivity of numbers using rules, methods, or systems for computing the sensitivity of numbers, in such a way that the number of bits indicated by the sensitivity is used in one or more points during the execution of the application, in order to make decisions that will potentially improve the resource usage by the application. For example, the sensitivity may be used for deciding the number of bits of the mantissa of a floating point number to be transmitted to a receiving entity (or equivalently the number of bits of the mantissa that may be discarded without compromising too much the accuracy of the results); or the sensitivity may be used for deciding stop criteria in an iterative algorithm.

Forward Sensitivity Analysis

An embodiment of the invention implements sensitivity analysis/tracking computations in an application that runs in a computer system/device or a distributed computer system by doing at least one of the following: (i) Set the sensitivities of the application's data element to initial values indicated by the user; if the user does not indicate an initial value of the sensitivity for a given input number, then set the value of the sensitivity for said number to a default, typically $V_{max}$; (ii) Set the sensitivities of each constant data element (i.e., data elements whose value do not change during the execution of an application) used internally by the application, to specific values indicated by the user; if the user does not indicate a value of the sensitivity for a given internal constant data element, then said value is set to a default, typically $V_{max}$; (iii) for every specific operation in the application, compute the sensitivities of the operation's output data element or data elements, using a method, formula, system, or rule indicated by the user; if the user does not indicate a method, formula, system, or rule for computing the sensitivity of a particular operation output, then set said sensitivity value to a default, typically $V_{max}$.

Recall that within the spirit of the invention, a variable may be any scalar value or data element of an array in a numerical algorithm. Note that the sensitivity of a variable may or may not change in time as the application makes different computations for the variable at different instances of time. For example, if there is an operation of a variable x early during the execution of the application, with said operation resulting in the computation of a new value for x, described as "Operation 1: x=x+1", and there is a subsequent operation at some instance in time, operating again over variable x, and described as "Operation 2: x=x+1", then the sensitivity of x at the output of operation 1 may be different from the sensitivity of x at the output of operation 2 because different formulas may have been defined by the user for computing sensitivities in 1 and 2, or because the input data and/or input sensitivities of operation 1 may be different to those of operation 2. A user may define different formulas, rules, mechanisms, or methods for computing sensitivities for any number being computed at any point in time, based on what the user considers may be more convenient at any given case.

In an embodiment of the invention, the system performs sensitivity computations only for a limited subset of the operations and/or variables and/or data elements in the application, as indicated by the user. In such an embodiment, the operators not selected by the user do not perform any type of sensitivity computation, which may save resources or simplify the implementation of the system. For example in a system where most of the application's data movement time is consumed by the processing within a particular subsystem, the user may define sensitivity computations only for the operations and variables inside said subsystem, and ignore for purposes of sensitivity computation, all the operations and variables outside the subsystem. The user may use the technique of making the sensitivities of all input data to the subsystem equal to $V_{max}$, so to effectively isolate sensitivity computation inside the subsystem without the need for sensitivity computation outside the subsystem. This type of isolation of sensitivity computations may help save computational resources and simplify implementation.

In an embodiment of the invention, there is a set of methods, formulas, systems, or rules that define the computations or updates of the sensitivities, with different methods, formulas, systems, or rules being defined for different specific operations, and said definitions depending on at least: (1) the type of operation being performed, (2) the data values at the input of the operation, and (3) the sensitivity values of said input data. For example, there may be a formula for sensitivity computations that is to be applied whenever two floating point numbers are added inside the application, another formula for sensitivity computations whenever two floating point numbers are multiplied, etc.

We refer in general to a given set of methods, formulas, systems, or rules for computing sensitivities as "algebra of sensitivities".

In an embodiment of the invention, we denote the algebra of sensitivities as "0-conservative" and define it as follows. Let $E_i$, $V_i$, and $V_i^*$ denote the exponent, sensitivity, and "absolute sensitivity", respectively, of a floating point number. Let the absolute sensitivity of the floating point number be defined as $V_i^* = E_i - V_i$. It should be apparent for someone skilled in the art that the absolute sensitivity is an indicator of "absolute precision" for the floating point number in the case the $(V_{max} - V_1)$ least significant bits of the mantissa are truncated. Let $x_1, x_2, x_3$ be in general floating point numbers. Then, the following rules and formulas make the definition of the 0-conservative algebra:

i) For $x_1 = x_2 + x_3$ (addition): $V_1 = E_1 - V_1^*$, with $V_1^* = \max(V_2^*, V_3^*)$, $V_2^* = E_2 - S_2$, and $V_3^* = E_3 - S_3$. If $V_1 < 0$ then $S_1 = 0$. If $V_1 > V_{max}$, then $V_1 = V_{max}$.

ii) For $x_1 = x_2 \times x_3$ (multiplication): $V_1 = \min(V_2, V_3)$. If $V_1 < 0$ then $V_1 = 0$. If $V_1 > V_{max}$, then $V_1 = V_{max}$.

iii) For any other operations, set the sensitivities of any and all outputs to $V_{max}$.

The 0-conservative algebra has an important feature: It is a "garbage tracking consistent" algebra. We define a garbage tracking consistent algebra as an algebra that for the operations in which it is explicitly defined (mainly addition and multiplication in the definition above), the following holds true: If the sensitivities of the inputs are "consistent", then the resulting sensitivities of the outputs will be consistent as well. We define the sensitivity "V" of a number as "consistent" if the user has reasons to believe that the least significant bits of the mantissa beginning with the "(V+1)-th" up to the "$V_{max}$-th" bit have very little information that is useful, or equivalently, that eliminating such bits will not introduce substantial error into the subsequent computations of the application. In other words, the sensitivity of a number is defined as consistent if the bits (V+1)-th of the mantissa and all subsequent mantissa bits beyond the (V+1)-th are considered, for practical effects, as garbage by the user, in the sense that the user is not interested in exploiting the information in those bits, or the user has reasons to believe that those bits will not be important for the numerical quality of the computations within the overall application. As an example, suppose that a sensor measures a physical variable and provides the result of the measurement as a number in 64-bit floating point arithmetic with 52 bits of mantissa. The user knows, for example, that the precision of the sensor, as defined by its manufacturer, is a relative precision of $2^{-10}$, in the sense that the manufacturer guarantees that relative errors of the measurement will always be less than $2^{-10}$. In view of that information, a certain user might feel comfortable discarding bits 11-th to 52-nd in the mantissa of the number and thus would define V=10 as a consistent sensitivity for that number. Another more conservative user might not feel comfortable with that value of the sensitivity and might want to use the first 14 bits in the mantissa instead of only the first 10 bits. For this user, V=14 would be a consistent sensitivity for the number. Likewise, V=15, 16, etc., up to 52, would also be consistent values of sensitivity of the number for that same user. There could also be another user who knows for example how the measurements made by the sensor will be used by the application, and, based on that information in, would be comfortable with a more aggressive truncation, say using V=8. For this latter user, V=8 would be a consistent sensitivity for the measurement, as would be V=9, 10, . . . , 52. Note that the sensitivity computations defined in item ii) above for multiplication operations, are likely to produce consistent sensitivities (for a given user) for the number $x_1$, provided that said user considers $x_2$ and $x_3$ to be consistent. This is because bits $(V_2+1)$-th, $(V_2+2)$-th, etc. of the mantissa of $x_2$ will have direct incidence on the values of bits $(V_2+1)$-th, $(V_2+2)$-th, etc. of the mantissa of $x_1$, and similarly, bits $(V_3+1)$-th, $(V_3+2)$-th, etc. of the mantissa of $x_3$ will have direct incidence on bits $(V_3+1)$-th, $(V_3+2)$-th, etc. of the mantissa of $x_1$. At the same time, the aforementioned bits in $x_2$ and $x_3$ will have no incidence at all on bits 1, 2, etc., up to bit $\min(V_2, V_3)$ of the mantissa of $x_1$. So, if both bits $(V_2+1)$ and beyond, in $x_2$, and bits $(V_3+1)$ and beyond, in $x_3$, are considered as potential garbage by the user, then the user may feel compelled, and with strong mathematical reasons, to consider bits $(V_1+1)$ and beyond in the mantissa of $x_1$ as potential garbage as well. Hence the sensitivity computation formula in item ii) above may be considered "garbage tracking consistent" by some users. It should be apparent to a person skilled in the art that analogous considerations for the sensitivity computation proposed for the addition operation in item i) above would lead to consider that formulation as "garbage tracking consistent" as well.

It should be apparent to someone skilled in the art, that the algebra of sensitivities defined above is not the only way to track garbage consistently, and that many other algebra formulations to achieve consistent garbage tracking may be formulated. For example, similar considerations may be used to produce formulations that work effectively for other non floating point formats, such as fixed point, integer, logarithmic arithmetic format, etc. It should also be apparent for someone skilled in the art that many different structures or algebras of sensitivities could be proposed for additions and multiplications, and for other possible operators. In another exemplary embodiment, an algebra that we call an "N-conservative" algebra, where N is a positive integer number, is used. Within this algebra, sensitivities are computed as N plus the result delivered by the "0-conservative" algebra. In yet another exemplary embodiment denoted "N-aggressive", where N is an integer number, sensitivities may be computed as N subtracted from the result delivered by the "0-conservative" algebra. In both the N-conservative and the N-aggressive algebras the sensitivities may be bounded between 0 and $V_{max}$ to allow consistency of operation with any bit elimination and packing subsystems that would use the sensitivity information.

A user may use experimentation or a priori information about the application to determine which garbage tracking algebras to adopt. A user may also use theoretical concepts and mathematical analysis to produce convenient garbage tracking algebras that could be accepted as consistent for the user. A user may then incorporate sensitivity values and/or rules through a user interface 311.

Backward Sensitivity Analysis

According to an aspect of the present invention, sensitivity estimation/tracking can be defined based on how data elements are going to be used. Hence, the sensitivity of a number may be defined by user through methods, formulas, systems, or rules that consider how the data elements will be used in an application, in what we call "backward sensitivity" analysis.

An embodiment may define backward sensitivity analysis of floating point numbers as follows. Given a set of data elements $Y=[y_1, \ldots, y_n]$, with $n \geq 1$, the sensitivity $V_Y=[v_{y1}, \ldots, v_{yn}]$ of the data elements Y is computed as: $v_{yi}=\max(0, V_{max}-(E_{max}-E_{yi}))$, with $E_{yi}$ being the exponent of data element $y_i$, $i=1, \ldots, n$, and $E_{max}=\max(E_{y1}, \ldots, E_{yn})$. We call this definition 0-conservative backward sensitivity.

Another embodiment may define backward sensitivity analysis of floating point numbers as follows. Given a set of data elements $Y=[y_1, \ldots, y_n]$, with $n \geq 1$, split the set into subsets $Y_k$ of size $s_{Yk}$ of each subset $Y_k$ satisfying $s_{Yk} \leq n$. Then, compute the sensitivity of each element of a subset $Y_k$ using 0-conservative backward sensitivity on the subset $Y_k$ (i.e., considering only the elements of the subset $Y_k$ for computing $E_{max}$). We call this definition the "windowed 0-conservative backward sensitivity". For example, a vector $Y=[y_1, y_2, y_3, y_4, y_5]$ could be split into two subsets $Y_1=[y_1, y_2, y_3]$ and $Y_2=[y_4, y_5]$. Then, according to the windowed 0-conservative backward sensitivity analysis, 0-conservative backward sensitivity could be used independently in $Y_1$ and $Y_2$ instead of in the full vector Y.

An embodiment may define backward sensitivity analysis of floating point numbers as follows. Given a set of data elements $Y=[y_1, \ldots, y_n]$, with $n \geq 1$, compute the sensitivity of each element $y_i$ as the 0-conservative backward sensitivity defined on the subset $Y_k=[y_1, \ldots, yi]$, for $i=1, \ldots, n$. We call this definition the "progressive 0-conservative backward sensitivity".

It should be apparent to someone skilled in the art, that the algebras of backward sensitivities defined above are not the only way to define backward sensitivities. For example, N-conservative and N-aggressive definitions could also be defined, similar to the way described for forward sensitivity analysis above. The definitions could also be used and/or adapted for sensitivity analysis of other types of data, such as fixed-point, logarithmic, etc. Furthermore, forward and backward sensitivity may be combined in an embodiment, with the sensitivity value being selected based on the smaller of the sensitivity results given by one or more forward and/or backward sensitivity algebras.

Data Packing, Compression, and Transmission Components

Referring to the drawings, FIG. 4A shows a transmitter 401 that may be used when a sending entity needs to transmit data to one or more receiving entities. Transmitter 401 receives data that may be stored in a program variable Y_ToSend. Although for illustrations of embodiments of the present invention we used the name Y_ToSend, other embodiments built in spirit of the present invention may use other variable names or other data structures for describing the data to be transmitted. In general, Y_ToSend may be a variable, array, set of variables, subset of a variable, object, or data storage designation, whose contents needs to be stored (e.g., in memory, cache memory, disc) and/or sent/received to/from a receiving/sending entity as part of the execution of a distributed algorithm. We may refer to a variable, or a subset of a variable, object, or data storage designation, as "data element".

A variable Y_ToSend may be stored in a memory system prior to transmission. FIG. 4B illustrates the storage of a variable Y_ToSend in a memory system 402. The memory system 402 may be memory 302, cache memory 309, or any other type of data storage systems or combination of data storage systems. Y_ToSend may be split or distributed among a plurality of memory elements 302 and/or cache memory 309. Y_ToSend may be partitioned into N blocks of words. We may refer to N as the size of Y_ToSend. Typical words used in computer systems contain 8, 16, 32 or 64 bits; however a word may contain any number of bits. The number of bits in a word may be defined by a computer system, memory system, compiler, or any subsystem in a distributed processing environment. The number of bits in a word may be defined by the user. Exemplary implementations of the present invention use a fixed number of bits for all the words. However, the number of bits in different words may be variable. We refer to the number of bits used for representing a data element as the "bit length". The bit length of a data element may be less, equal, or greater than the number of bits in a word. Hence, a data element may be stored in one of more words.

Figure 5:
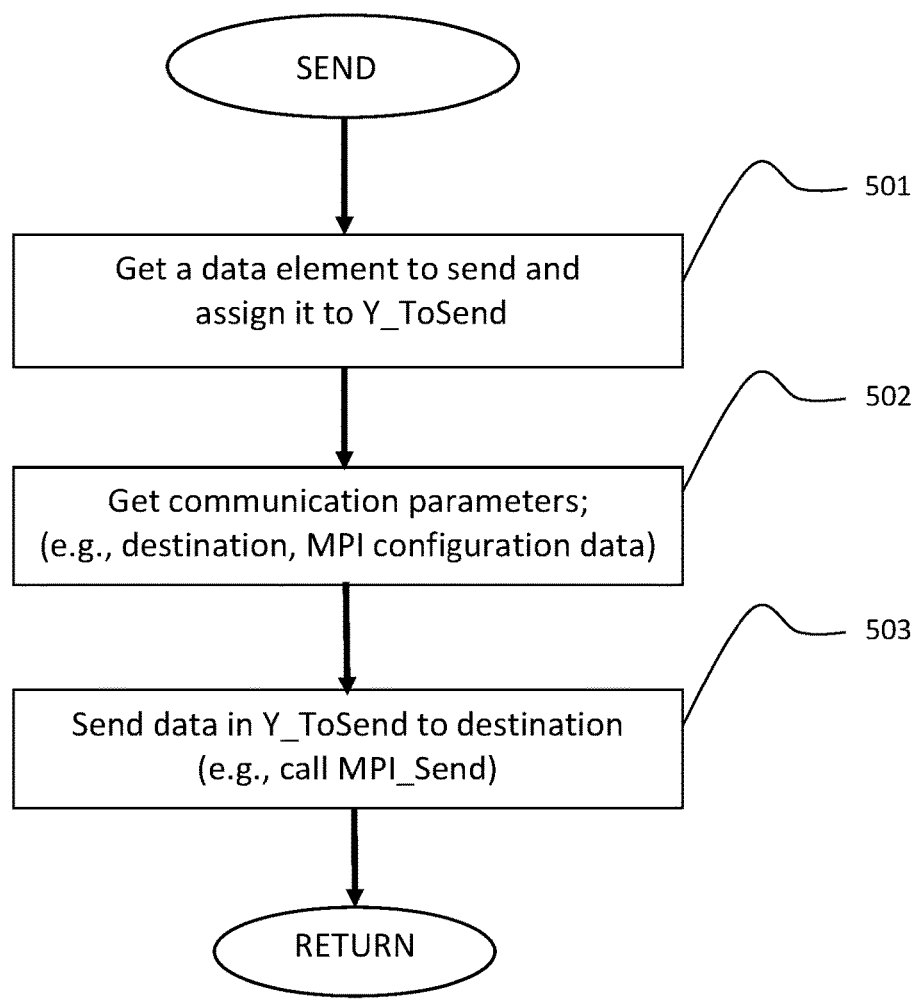
FIG. 5 is a flow diagram of an example routine that sends data.

FIG. 5 illustrates a component that may be used to transmit a data element from a sending entity to a receiving entity. The data element to be sent may be assigned to a program variable Y_ToSend, as it is described in 501. A pointer to Y_ToSend may be provided as a reference to the data element. One or more communication parameters may be retrieved as it is shown in 502. These communication parameters may be in a memory system, and can include information such as, but not limited to: an identifier of receiving entity, size "N" of the variable Y_ToSend, datatype of Y_ToSend, configuration data, and/or any other information that may be used for transmission and/or compression. Then, the variable Y_ToSend is transmitted to the receiving entity as it is described in 503. The command MPI_Send may be used for the transmission, or any other command or function that enables data transfer in any other programming language, data transfer standard, or format. The command MPI_Send is defined in the MPI 3.0 standard. In an alternative embodiment of the present invention the order of the steps 501, 502, and 503 may change, or some steps may be merged together.

FIG. 4C illustrates an implementation of a transmitter 401 named "Send", which could be used in a computer device 101. The implementation in FIG. 4C uses Message Passing Interface (MPI) for sending data from a sending entity to a receiving entity. The implementation shown in FIG. 4C is based on a function coded in C, but other programming languages or implementation techniques could be used. The implementation in FIG. 4C receives information about the address of Y_ToSend in memory 302, the size N of Y_ToSend, and the destination. The destination is an identifier of the receiving entity. In the implementation illustrated in FIG. 4C Y_ToSend is partitioned into N words, with each word containing the number of bits assigned by the computing system or compiler to the type of data labeled as "int". The transmitter in FIG. 4C uses the command MPI_Send to transmit data stored at Y_ToSend to the receiving entity defined by the variable name "destination". The command MPI_Send used in FIG. 4C is defined in the MPI 3.0 standard.

Data transmitted by a sending entity may be processed by a receiving entity using a receiver. FIG. 6A depicts a receiver 601. A receiver 601 receives a transmission stream and produces data Y_Received. Data Y_Received may be stored in a memory system 602, as is shown in FIG. 6B. A memory system 602 may be RAM, cache memory, or any other type of data storage systems or combinations of data storage systems. The receiver entity may read Y_Received from a memory system 602 and use it for numerical processing. Data Y_Received may be partitioned into N words, similar to the way Y_ToSend is partitioned in FIG. 4B. When data Y_ToSend is transmitted, and an intended receiving entity uses a receiver 401, and if no data errors occur during the transmission or data errors are corrected prior to said data being processed by a receiver 401, Y_Received is a copy of Y_ToSend.

Figure 7:
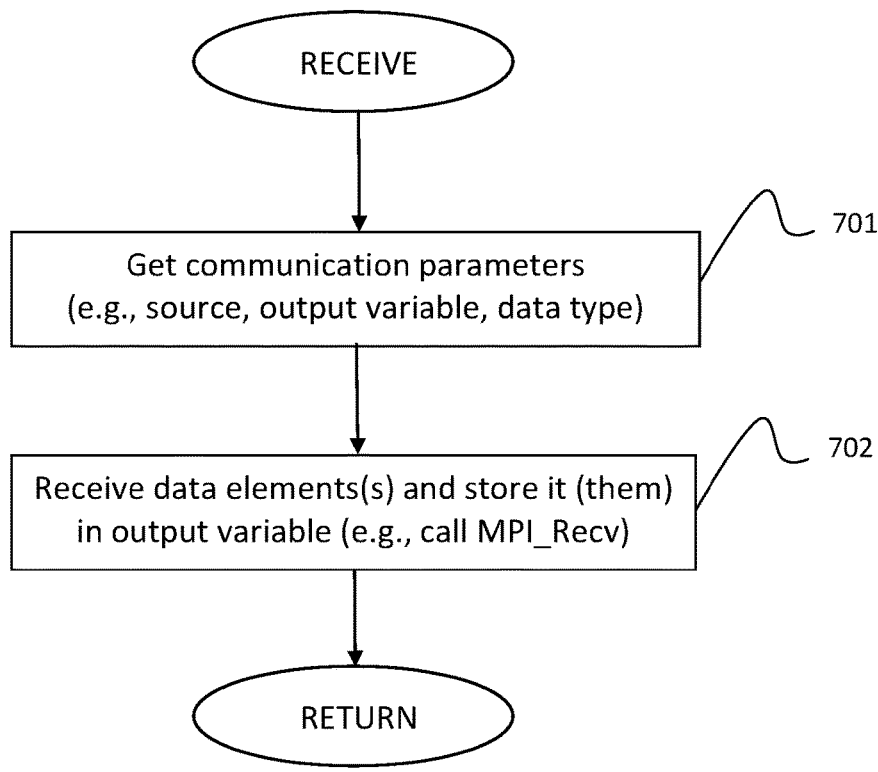
FIG. 7 is a flow diagram of an example routine that receives data.

FIG. 7 illustrates an embodiment of the present invention that may be used for receiving a data element in a receiving entity. The data element may have been sent from a sending entity through an embodiment such as, but not limited to the one described in FIG. 5, the embodiment described in FIG. 4A, or the embodiment described in FIG. 4C. Initially, the receiving entity may read communication parameters as it is shown in 701. These communication parameters may be in a memory system, and may include information such as, but not limited to: identifier of sending entity, name of output variable, data type of the variable, configuration data, and/or any other information that may be used for reception and/or decompression. Then, the data may be received and stored in an output variable, as it is shown in 702; this data may also contain information regarding the communication. The communication parameters retrieved in 701 and/or in 702 may be used to store the data element in an output variable. The command MPI_Recv may be used for reception of the data element in 702, or any other command or function that enables data reception in any programming language, standard, or format. The command MPI_Recv is defined in the MPI 3.0 standard.

FIG. 6C illustrates an implementation of a receiver 601 named "Receive", which may be executed in a computer device 101. The implementation in FIG. 6C uses MPI for receiving data from a sending entity. The implementation shown in FIG. 6C is based on a function coded in C, but other programming languages or implementation techniques could be used. The implementation in FIG. 6C receives information about the address of Y_Received in a memory 302, the maximum size that may be stored at the memory address indicated by Y_Received, and the sending node or source. In the implementation shown in FIG. 6C the received data is stored in words containing the number of bits indicated by the parameter MPI_INT.

Figure 8A:
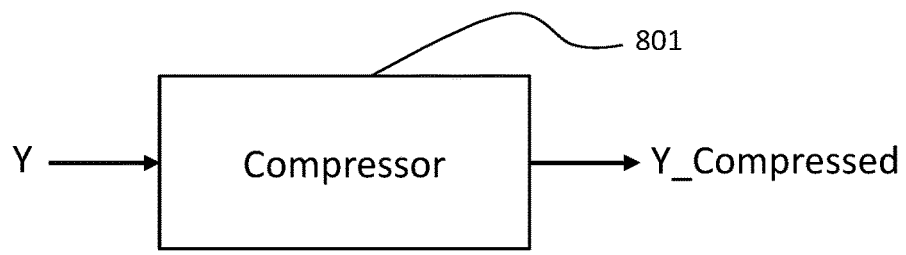
FIG. 8A illustrates an embodiment of the present invention.
Figure 8B:
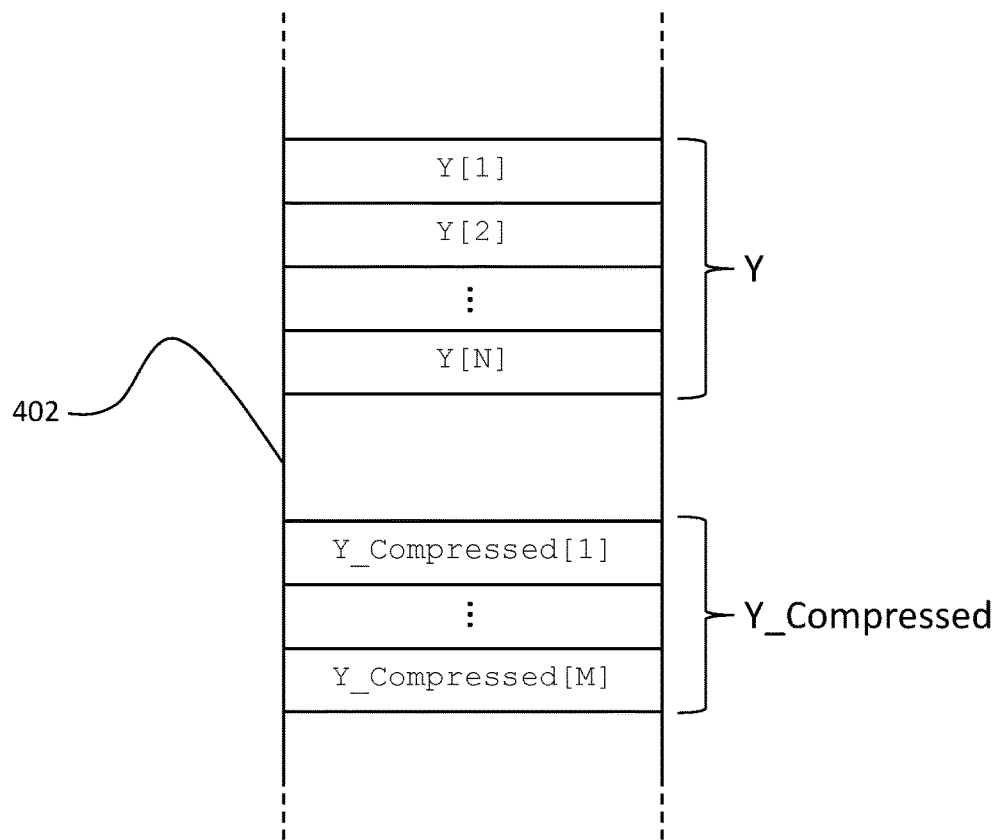
FIG. 8B illustrates example organization of data in memory using an embodiment of the invention.

The number of bits used for representing data, for example, Y_ToSend, may be reduced through data compression/encoding. FIG. 8A illustrates a compressor system 801 for data compression. The compressor 801 can be designed to implement any suitable compression scheme, such as Lempel-Ziv, Hamming, arithmetic encoding, delta encoding, etc. The compressor system 801 is preferably designed to implement a lossless compression scheme, but lossy compression schemes may be also used. The compressor receives data Y and renders compressed data Y_Compressed. FIG. 8B illustrates an example in which a memory system 402 containing both data Y and Y_Compressed. Data Y may be divided into N words. Data Y_Compressed may be divided into M words. If the word length of data in Y and data in Y_Compressed is the same, and a compressor 801 successfully compresses Y, then M<N.

Figures 9A, 9B:
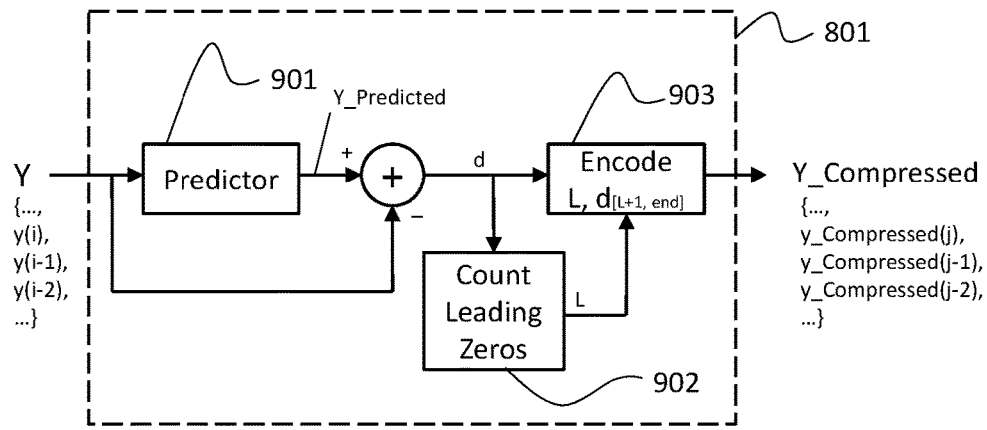
FIGS. 9A-9B illustrate example compressors.

FIG. 9A illustrates an example compression system 801. The system in FIG. 9A may include a predictor 901, a count leading zeros component 902, and an encoder 903. For a data element y(i) in Y, a predictor 901 uses previous data (i.e., y(i−1), y(i−2), etc.) to estimate a predicted value y_Predicted(i). Then difference between y_Predicted(i) and y(i) is computed, rendering a data element "d". For example, a delta encoder may predict y_Predicted(i)=y(i−1). In this case, d=y_Predicted(i)−y(i−1). It is expected for a encoder 903 to produce better compression rates when data elements d are used than when elements y(i) are directly used without a predictor. In the example compression system in FIG. 9A, a count leading zeros component 902 counts the number of leading zeros in a data element d, i.e., the number of zeros going from the Most Significant Bit (MSB) to the Least Significant Bit (LSB) before finding a 1. The output of component 902 is an integer L, which may be used for indicating a number of bits from the data element "d" that could be truncated by an encoder 903. An encoder 903, alternatively, may implement other encoding schemes. The output of an encoder 903 is the compressed data Y_Compressed corresponding to input data Y.

FIG. 9B illustrates an example function CompressY, which may be used for implementing a compressor system 801 in a computer device 101. The exemplary function CompressY receives a pointer to an array of 32-bit integers called Y, the size of said array Y, a pointer to an output array of 32-bit integers Y_Compressed, and a pointer to an integer M which, upon returning from the function, will contain the number of integer words in the array Y_Compressed. The exemplary function CompressY defines a delta predictor, in which d=y_Predicted(i)−y(i−1). The count leading zeros component is defined using a standard C built in function called "_builtin_clz". This function returns an integer, which corresponds to the number of leading zeros in and that is assigned to the variable L. The encoder is implemented using three successive calls to a function PushToArray that stores the encoded data element into Y_Compressed, with the first call to PushToArray storing the number of leading zeros using 5 bits, the second call to PushToArray storing 1-bit corresponding to the sign of d, and the third call to PushToArray storing a truncated version of d. The function PushToArray in the exemplary implementation of FIG. 9B has the function prototype:

```
void PushToArray(  int Input, int FromBit, int ToBit,
                   int *Output, int *OutputIndex, int *OutputP ),
``` which copies the group of bits defined by "FromBit" to "ToBit" from the input integer "Input", into the output integer array "Output". The arguments "FromBit" and "ToBit" are integer numbers between 1 and 32, where 1 indicates the MSB of Input, and 32 the LSB of Input. The group of bits extracted from Output are copied into Output starting at the bit position "*OutputP" in the element "*OutputIndex", where "*OutputIndex" is a nonnegative integer that indicates the element of the array "Output" that is being processed, and "*OutputP" is an integer between 1, the MSB, and 32, the LSB, indicating the first bit available for writing in "Output[*OutputIndex]". Upon return, the values of "*OutputIndex" and "*OutputP" are updated as needed, depending on the values of "FromBit", "ToBit", as well as on the previous values of "*OutputIndex" and "*OutputP".

Figure 12:
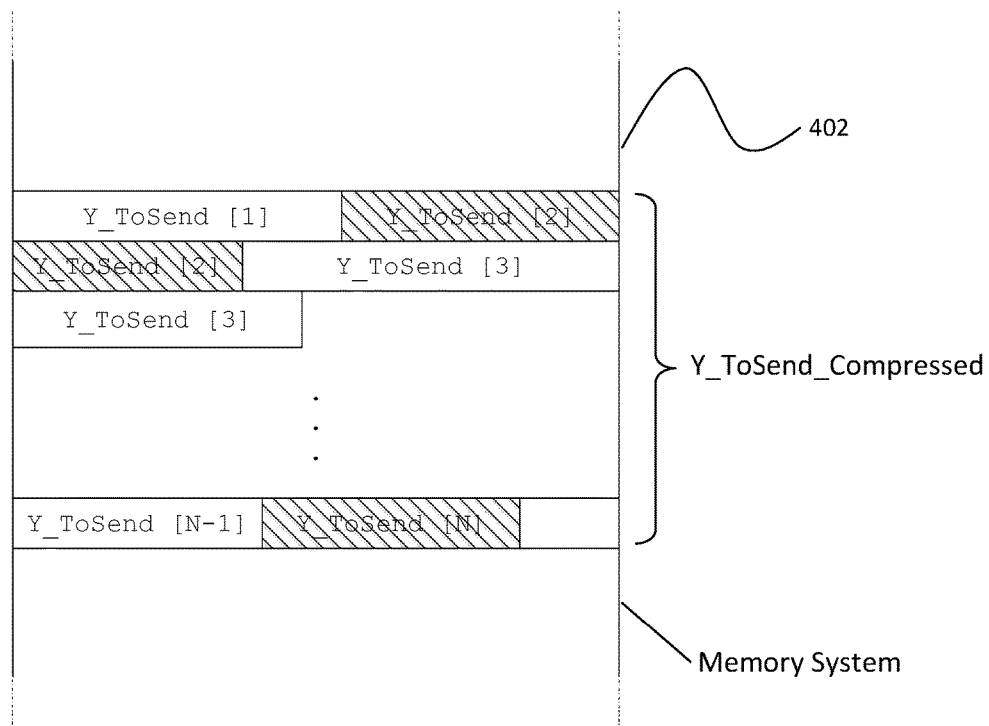
FIG. 12 illustrates example organization of data in memory using an embodiment of the invention.

If data elements in Y_ToSend need to be transmitted, the number of bits used to send data in Y_ToSend from a receiving entity to one or more receiving entities may be reduced using a data compressor. FIG. 10A illustrates a compressor 801 used to process data in Y_ToSend with the goal of reducing the number of bits to be transmitted by a transmitter 401. Outputs of a compressor 801 may be sent to a memory system 402, and stored in a memory space denoted by the name Y_ToSend_Compressed. Data in Y_ToSend_Compressed may be partitioned into M words. The number of bits in each word may be the same number of bits used in the partition of Y_ToSend. If a compressor 801 is able to reduce the number of bits to be transmitted, and the number of bits in a word in Y_ToSend is the same as in Y_ToSend_Compressed, then M<N. FIG. 10B illustrates an exemplary organization of the compressed data Y_ToSend in the memory space Y_ToSend_Compressed when M<N. The number of bits used for representing data in some elements of Y_ToSend after compression may be less than the number of bits used in the original representation of Y_ToSend. Then data corresponding to more than one element in Y_ToSend may fit in a single word of Y_ToSend_Compressed, as is illustrated in FIG. 12.

Figure 11:
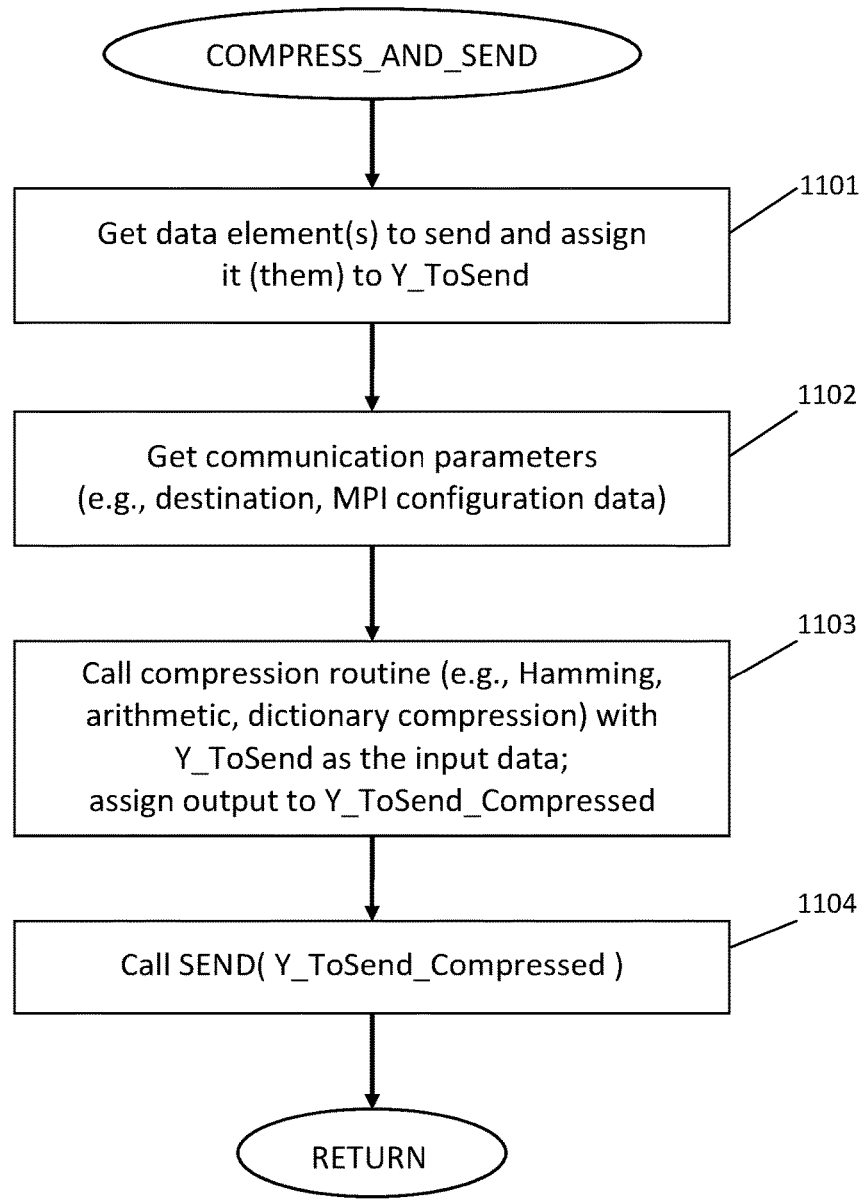

FIG. 11 illustrates an exemplary implementation that executes a set of operations for a joint implementation of the elements 801 and 401 illustrated in FIG. 10A, and which may be used in an embodiment of the invention. The exemplary implementation in FIG. 11 may be used to compress a variable and any other necessary information (e.g., data lengths, dictionary data), and send it from a sending entity to a receiving entity. The data element to be sent initially may be assigned to a variable Y_ToSend as it is described in 1101, or a pointer to Y_ToSend may be provided as a valid reference of the data element. One or more communication and/or configuration parameters may be retrieved as it is shown in 1102. These communication and/or configuration parameters may be in a memory system, and may include information such as, but not limited to: identifier of receiving entity, size "N" of variable Y_ToSend, datatype of Y_ToSend, configuration data, compression parameters, and/or any other information that may be used for transmission and/or compression of the data. Then, a compression routine may be called using Y_ToSend and/or retrieved information as input data, as it is shown in 1103. The compression routine may be a compression procedure or algorithm such as, but not limited to: Hamming compression, arithmetic compression, or dictionary compression, or one defined by a compressor 801. The output of this routine may be assigned to a variable Y_ToSend_Compressed as it is shown in 1103. Then, a call may be made to a transmitter 401, or any other transmission function. The variable Y_ToSend_Compressed may be used as input to this routine, as it is shown in 1104.

FIG. 10C illustrates an implementation of a joint compressor 801 and transmitter 401 named "CompressAndSend". The implementation shown in FIG. 10C is based on a function coded in C that uses MPI for transmission and a function called "Compress" for compression, but other programming languages, implementation techniques, transmission systems, or compression mechanisms may be used. The exemplary function CompressAndSend may be executed in a computer device 101. The function "Compress" could be any routine that allows the compression of data, such as the function "CompressY" in FIG. 9B. In an exemplary embodiment this function has the function prototype:

void Compress(int *Input, int N_Input, int *Output, int *N_Output), where "Input" is a pointer to the array of "N_Input" integers to be compressed, and "Output" is a pointer to the array of *N_Output integers that the function returns. This function could implement any compression technique. For example, it could implement frame-of-reference compression, delta encoding, Hamming compression, Lempel-Zip, etc. The "CompressAndSend" function in FIG. 10C receives information about the memory address of Y_ToSend, the size N of Y_ToSend, and the destination, which are the same inputs that an exemplary implementation of a transmitter 401 illustrated in FIG. 4C uses.

Compressed data Y may be processed by a decompressor. FIG. 13A illustrates a decompressor 1301. The decompressor 1301 receives compressed data Y_Compressed, and renders decompressed data Y. FIG. 13B illustrates an exemplary implementation of a decompressor 1301, which recovers data Y from data Y_Compressed. A decoder 1302 decodes data using any decoding mechanism or algorithm, such as, but not limited to Lempel-Ziv, Hamming, arithmetic decoding, delta encoding, etc. For example, if each data element Y_Compressed(i) of Y_Compressed is encoded with a variable-length encoding, with said encoding having the format (L, sign, d_encoded), such that L is the number of nonzero LSBs of a number d stored at Y_Compressed(i), sign is a bit that encodes the sign of d, and d_encoded contains the L LSBs of d, then the decoder 1302 recovers d by appending zeros to the MSBs of d as needed to complete a the required number of bits of data element d. If the number d is the error incurred by a predictor 901 when trying to predict the data element Y(i), then a predictor 901 can be used to finally recover a data element Y(i).

FIG. 13C illustrates an exemplary implementation of a decompressor 1301, where the description of the implementation is written in C. The implementation in C is described by the function DecompressY. The function DecompressY receives as arguments a pointer to an array of integers Y_Compressed, the size M of the array Y_Compressed, a pointer to an output array Y, and a pointer to an integer N that contains the size of N upon returning from DecompressY. DecompressY execute decoding and prediction for each data element in Y_Compressed. Decoding is accomplished through three successive calls to a function PullFromArray. This function has the prototype:

```
void PullFromArray( int *Input, int *ArrayPointer, int *BitPointer,
                    int NumberOfBitsToPull ).
```

The first argument in PullFromArray, Input, is a pointer to an array of integers. The second argument is a pointer to an integer that, as an input, indicates the element of the array Input that contains the first bit that will be extracted; as an output, *ArrayPointer indicates the index of the array Input that contains the bit that follows the last bit extracted from the call to PullFromArray. The third argument, as an input, indicates the bit number, from MSB to LSB, in Input [*ArrayPointer] that contains the first bit that will be extracted in the call to PullFromArray. As an output, *BitPointer contains the bit number, from MSB to LSB, in Input[*ArrayPointer] that follows the last bit extracted from the call to PullFromArray. The fourth argument, NumberOfBitsToPull, is an integer that indicates the number of bits to extract from the call to PullFromArray, starting in the bit *BitPointer of Input[*ArrayPointer]. The first call to PullFromArray in DecompressY extracts the number of bits L of the unsigned component d that is stored in Y_Compressed. The second call to PullFromArray obtains the sign of d. Finally, the last call to PullFromArray in DecompressY completes the decoding portion of the decompression. Then, the data element Y[i] in the output Y is recovered using a delta encoding based on Y[i−1] and d. Upon recovering Y[i], the value of *N is incremented in 1.

Compressed data Y_ToSend_Compressed transmitted to a receiving entity may be processed by a decompressor. FIG. 14A illustrates an exemplary implementation in which a transmission stream is first processed by a receiver 601. Then, the output of a receiver 601 is sent to a decompressor 1301. A decompressor 1301 outputs data Y_Received.

FIG. 14B illustrates an implementation in which inputs and outputs of a receiver 601 and a decompressor 1301 are stored in a memory system 602. The output of a receiver 601 may be stored in a memory system 602 at the memory space denoted by the name Y_Received_Compressed. Data in Y_Received_Compressed may be partitioned into M words. The number of bits in each word may be the same number of bits used in the partition of Y_ToSend_Compressed. A decompressor 1301 may read data in Y_Received_Compressed and store decompressed data in a memory 602 in a memory space indicated by Y_Received.

Figure 15:
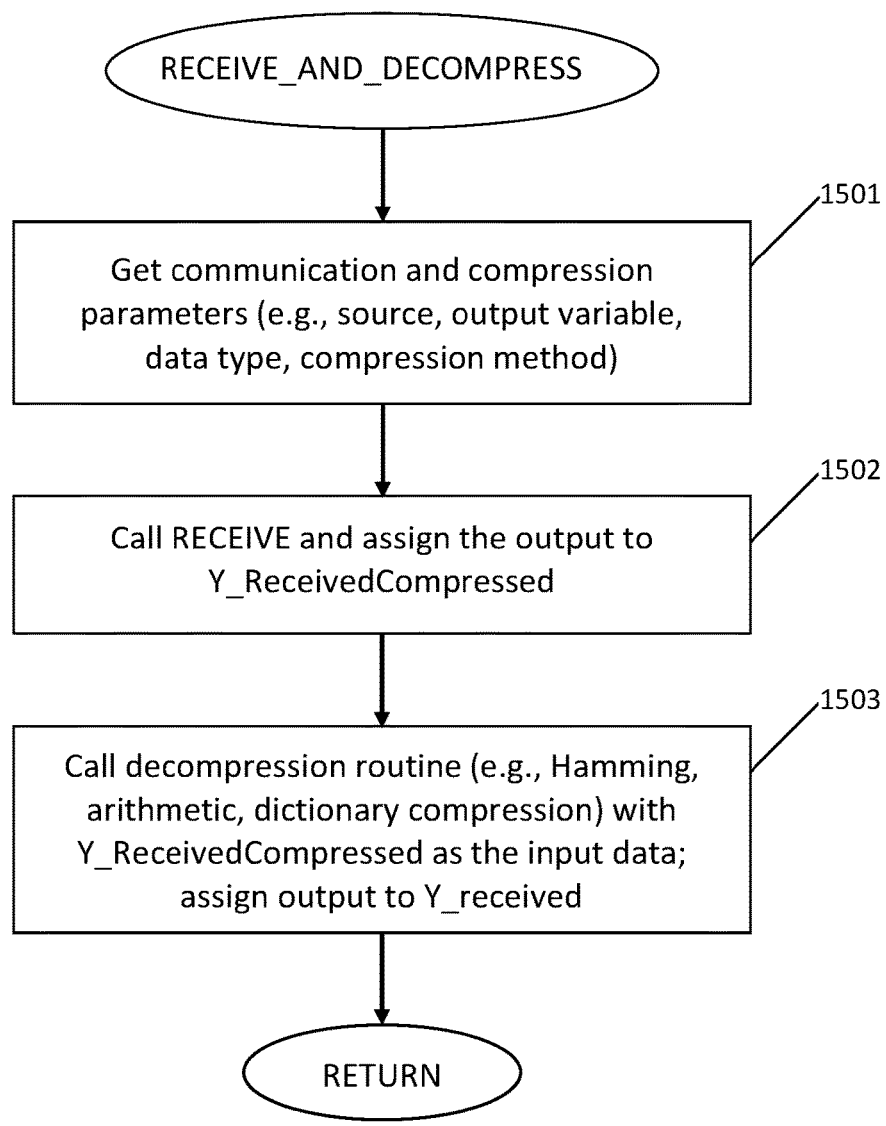

FIG. 15 illustrates an embodiment of the present invention that executes a set of operations for a joint implementation of the elements 601 and 1301 as illustrated in FIG. 14A. The embodiment in FIG. 15 may be used in a receiving entity to receive and decompress a compressed data element coming from a sending entity. The data element may have been sent from a sending entity using an embodiment such as, but not limited to the one described in FIG. 5, or one as described in FIG. 11. The process may start with the receiving entity retrieving communication and/or compression parameters as it is shown in the element 1501. These communication parameters may be in a memory system, and may include information such as, but not limited to: identifier of sending entity, size "N" of the output variable, name of output variable, data type of the output variable, configuration data, compression parameters, and/or any other information that may be used for reception and/or decompression of the data. Then, a receiver, such as, but not limited to the one described in FIG. 6C, may be called to receive the variable. The output of the receiver may be assigned to a variable Y_ReceivedCompressed, as it is described in 1502.

Then, a decompression routine may be called using Y_ReceivedCompressed and/or the communication parameters and/or the compression parameters as input data, as it is shown in 1503. The decompression routine may be a decompression procedure or algorithm such as, but not limited to: Hamming decompression, arithmetic decompression, or dictionary decompression. The output of this routine may get assigned to a variable Y_Received as it is shown in 1503.

FIG. 14C illustrates an implementation of a joint receiver 601 and decompressor 1301 named "ReceiveAndDecompress". The implementation in FIG. 14C is based on a function coded in C that uses MPI for reception and a function called "Decompress" for decompression, but other programming languages, implementation techniques, receiving systems, or decompression mechanisms may be used. The function "Decompress" could be any routine that allows the decompression of data. In an exemplary embodiment this function has the function prototype:

void Decompress(int *Input, int N_Input, int *Output, int *N_Output), where "Input" is a pointer to the array of "N_Input" integers to be decompressed, and "Output" is a pointer to the array of *N_Output integers that the function returns. The function Decompress implements any decompression technique. The function DecompressY in FIG. 13C is an example of a possible function that could be used as "Decompress". Other examples include decompression implementations for frame-of-reference compression, delta encoding, Hamming compression, Lempel-Zip, etc. The "ReceiveAndDecompress" function in FIG. 14C receives information about the memory address of Y_Received, the maximum size that may be stored at the memory address indicated by Y_Received, and the sending node or source.

Data Packing with Discriminators

In an embodiment of the present invention, information or knowledge about the structure of an algorithm, operations to be executed at a receiving entity, variables or subsets of variables in a distributed algorithm or other forms of context information may be used for reducing the number of bits used for data movement and/or storage. Said information or knowledge may be used for reducing the number of transmitted bits as illustrated in the exemplary embodiment in FIG. 16. A discriminator 1602 may provide, for example, information about the sensitivity of numbers Y to be packed by component 1601. If a transmitting entity needs to reduce the number of bits of a variable Y to one, for example, for sending it to one or more receiving entities, a bit elimination and packing system 1601 may process Y and output Y_Packed. Y_Packed may be used, for example, as input to a transmitter 401. Y_Packed may be used, for example, as input to a compressor 801. A bit elimination and packing system 1601 receives input from a discriminator 1602. A discriminator may be any component able to provide information or knowledge for the packing, including, for example, sensitivity of data elements, information about the structure of an algorithm, variables that exist at a receiving entity, operations to be executed at a receiving entity, or any other context information. Examples of discriminators are systems that run experiments to determine the position of bits that are equal in all the words of Y, either a priori or at run time; systems that identify repeating binary patterns within Y; parsers that analyze distributed algorithms; or user input, among others.

Figure 16:
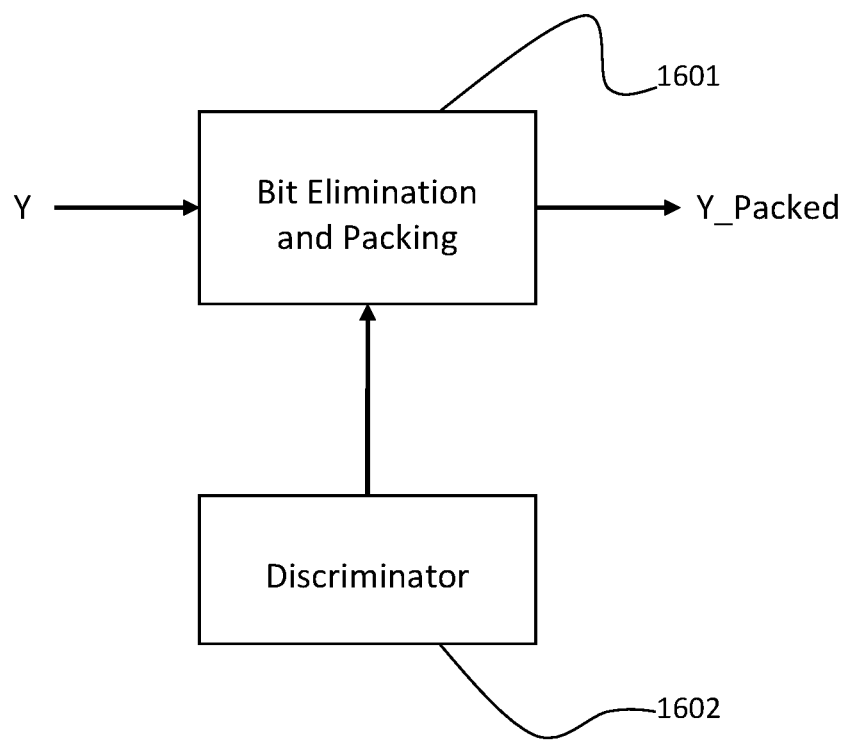
FIG. 16 is a block diagram illustrating an embodiment of the invention.
Figure 17:
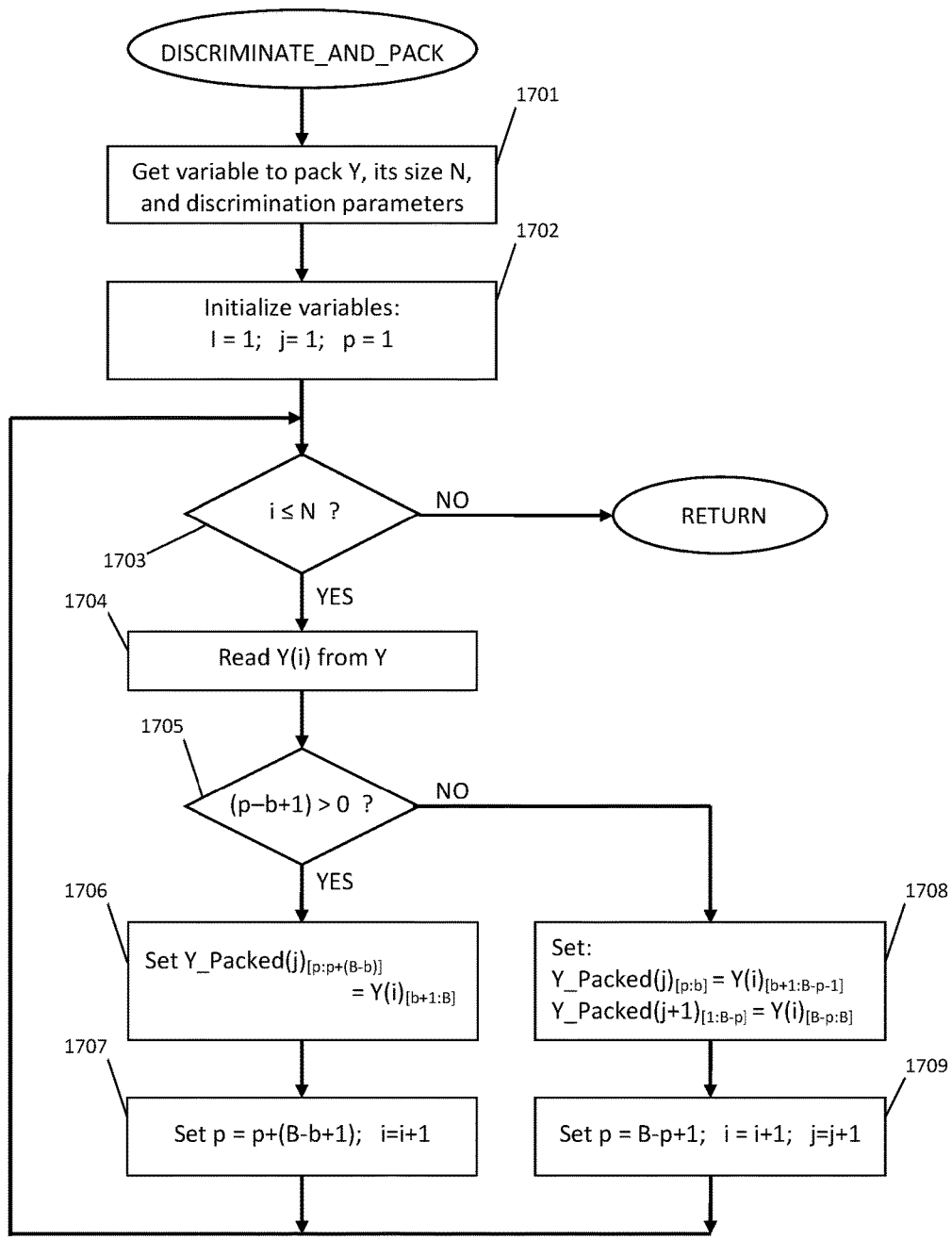

FIG. 17 illustrates an exemplary joint implementation DISCRIMINATE_AND_PACK of the elements 1601 and 1602 depicted in FIG. 16 that may be used in an embodiment. DISCRIMINATE_AND_PACK receives an array Y of one or more data elements to pack, as well as any additional data that characterizes said data Y and a discriminator 1602 in the element 1701. These parameters may be, but are not limited to: size "N" of the array Y, the number "b" of MSBs that could be changed in elements of Y, the number "B" of bits of each data element in Y (e.g., 64 bits in ANSI/IEEE 754 double-precision floating point format, 32 bits of unsigned integer data), discrimination parameters, and/or any other necessary information for discriminating and/or packing the variable. A set of control data may be initialized in 1702. For example, this set could include the three variables named "i", "j", and "p" that are shown in FIG. 17. Each data element Y(i) in Y may be processed in consecutive order, with said processing being controlled by a condition, as illustrated in 1703, which is an example condition in which, if "N" is not greater than or equal to "i" DISCRIMI-NATE_AND_PACK ends, whereas if N is less than or equal to "i", DISCRIMINATE_AND_PACK continues by moving to 1704. The i-th element of Y, Y[i], is retrieved in 1704. Following, as is shown in 1705, the condition "p−b+1>0" may be evaluated; if the result of the condition is positive (i.e., the remaining values of Y(i) fit in the current empty bits in the j-th position of the array Y_Packed) the process moves to 1706; if the result of the condition is negative (i.e., the remaining values of Y(i) do not fit in the current empty bits in the j-th position of the array Y_Packed, and therefore a (j+1)-th position in Y_ToSend may be allocated with the values that could not fit in the j-th position), the process moves to 1708. For elements 1706 and 1708 the following notation is used: $Y\_Packed(j)_{[a:b]} = Y(i)_{[c:d]}$. This notation describes that the a-th bit through the b-th bit in the j-th position of the array Y_Packed get assigned the values of the c-th bit through the d-th bit in the i-th position of the array Y. The element 1706 describes the assignment that may be done to Y_Packed as per the notation described. After 1706, the process moves to 1707, where the updates of "p" and "i" are performed. Element 1707 leads back to step 1703 to reevaluate whether the condition of (i≤N) is met. The element 1708 describes the assignment that may be done to Y_Packed as per the notation described. Also, the j-th plus 1 vector of the variable Y_Packed is assigned a value coming from Y, as described in 1708. Following 1708 comes the element 1709, where the updates of "p'", "i", and "j" are executed. The exit of element 1709 leads back to 1703 to reevaluate whether the condition of (i≤N) is met.

Figures 18A, 18B:
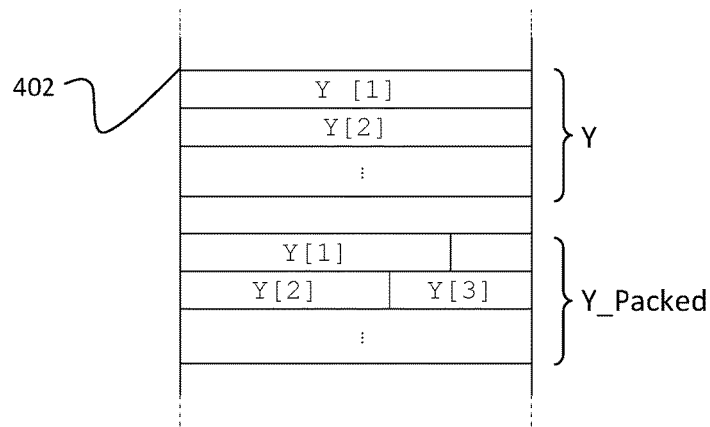

FIG. 18A shows an example of the organization of Y_Packed in a memory system 402 when a bit elimination and packing system 1601 is used to process input data Y. In an embodiment of the present invention, packed data Y_Packed may be the input of a transmitter 401 or a compressor 801.

FIG. 18B contains an exemplary implementation of bit elimination and packing 1601. In this exemplary implementation, a discriminator indicates that a number "b" of MSBs of the elements of Y that do not change or are not used by a receiving entity (i.e., are not included in a packed version of Y). This exemplary implementation is based on a C function that considers the data type "int" as having 32 bits, but other programming languages or implementation methods or systems may be used. Examples of other implementation methods or systems are bit elimination and packing and discriminators defined in software, hardware, or combinations of software and hardware.

An example of an application using the implementation depicted in FIG. 18B is a distributed algorithm in which a receiving entity only uses the absolute value of the elements in Y. A discriminator may use this information and, if the format of the elements or words in Y is such that uses their MSB to define the sign, then said discriminator may assign "b=1". A subsequent call to the function DiscriminateAnd-Pack would pack the elements in Y by eliminating the MSB of each element of Y.

Figure 19:
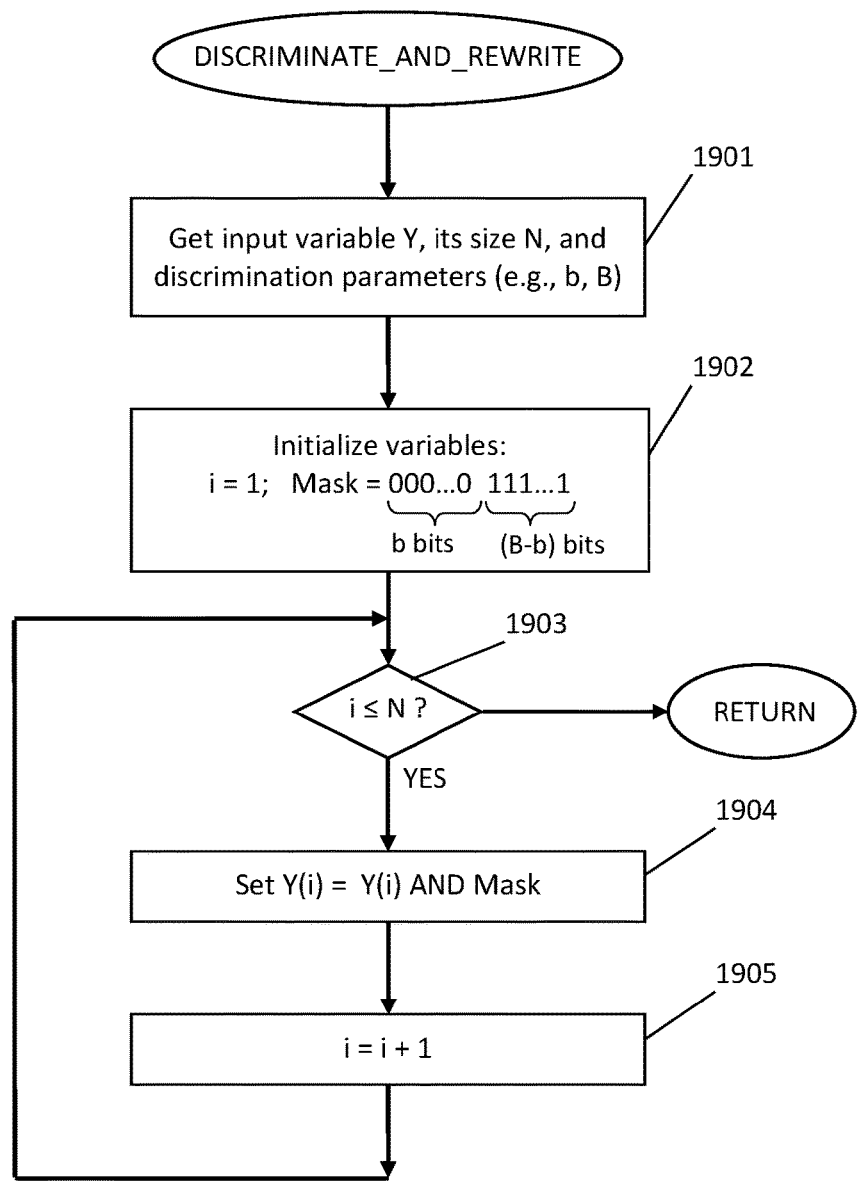

FIG. 19 illustrates an implementation of a DISCRIMI-NATE_AND_REWRITE component that may be used to discriminate and eliminate unnecessary bits in a variable Y in embodiments of the invention. The DISCRIMIN-ATE_AND_REWRITE implementation rewrites an array Y of data elements Y(i) in such a way that a number "b" of MSBs of each data element are set to a given pattern. In FIG. 19, the array Y to be discriminated and rewritten may be retrieved along with other parameters from a memory system as it is depicted in 1901. These parameters may be, but are not limited to: size N of the variable Y, the number "b" of MSBs that will be changed in elements of the array Y, the size "B" of a variable or signal "Mask", and/or any other necessary information and parameters that may be used for discriminating and/or rewriting the variable Y. For example, a variable "i" may be initialized to 1, and the "b" Most Significant Bits of a variable "Mask" may be assigned with the value "0", while the "B−b" less significant bits of that variable "Mask" may be assigned the value "1", as it is depicted in 1902. A stop condition is evaluated in 1903. For example, if "i" is not less than or equal to N, DISCRIMI-NATE_AND_REWRITE ends; whereas if N is more than or equal to "i", the i-th element of Y, Y[i], is assigned the result of the bitwise AND operation between Y[i] and "Mask", as it is shown in 1904. After this, "i" is incremented in 1905. The exit of 1905 is directed to 1903 to reevaluate the stop condition.

Figures 20A, 20B, 20C:
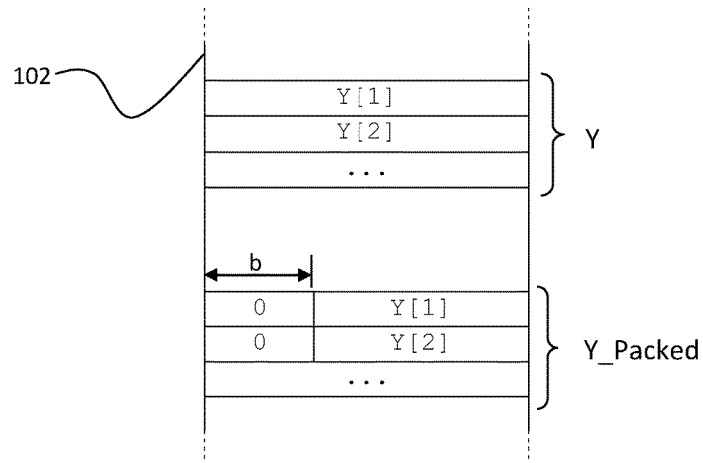

In an exemplary embodiment of the present invention, bit elimination and packing replaces a number "b" of MSB of data elements in Y with a bit pattern that may support better compression gains if Y is processed by a compressor 801. FIG. 20A shows an example of the organization of Y_Packed in a memory 402 when a number "b" of MSBs of Y are replaced by a set of "b" zeros. FIG. 20B illustrates an exemplary implementation in which a function "DiscriminateAndRewrite" is used for replacing "b" MSBs of all the elements of Y when producing Y_Packed. When replacing bits instead of eliminating, a compressor 801 may be able to render higher compression gains. It is known that entropy compressors or compressors that partition Y_Packed into segments could detect and take advantage of sequences of patterns, such as the sequence of zeros illustrated in FIG. 20A. In general, an embodiment of the present invention, an algorithm may be organized or rewritten to help a compressor 801 attaining higher compression gains. For example, if a discriminator indicates that a receiving entity only uses the absolute value of the elements y in Y, elements y may be substituted by the absolute value of y, |y|, resulting in a pattern of zeroes appearing at the MSB of all the elements of Y. FIG. 20C shows an exemplary implementation of this type of rewrite. This strategy may, for example, reduce total execution time of a distributed algorithm when the cost of the additional computations is less than the cost of transmitting the original variable Y.

Figures 21A, 21B:
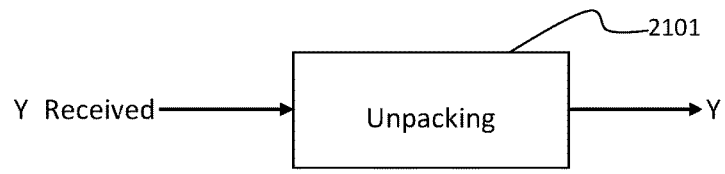

FIG. 21A depicts an unpacking system 2101 that may be used for unpacking data that was packed using a bit elimination and packing system 1601. FIG. 21B shows an exemplary implementation of unpacking 2101, when unpacking is implemented as a function in C named "Unpack" that considers the data type "int" as having 32 bits. Although FIG. 21B implements unpacking 2101 as a C function, other programming languages or implementation alternatives are possible. When bits in Y are not eliminated, as is done, for example, in FIG. 21B, unpacking may not be necessary.

Data Compression Based on Sensitivity Analysis

According to an aspect of the present invention, data elements may have corresponding sensitivities. Given that the sensitivity of a number may be used to characterize a set of garbage bits in said number, an embodiment may eliminate and/or replace those garbage bits for compressing sets and/or arrays of data elements.

An embodiment may reduce the number of bits for storage and/or data movement by splitting data elements into components (e.g., sign, exponent, and mantissa in floating point numbers), eliminating and/or replacing the garbage bits indicated by the sensitivities of the corresponding data elements (e.g., eliminating bits (V+1) to the LSB in the mantissas of floating point numbers Y, where V is the sensitivity of Y), and packing the resulting components into a new array or set. This sensitivity-based encoding could be combined with further data compression mechanisms, such as Hamming, delta-encoding, frame-of-reference, the components in FIG. 8A, 9A, 9B, or any other encoding/compression mechanism or method.

Figure 24:
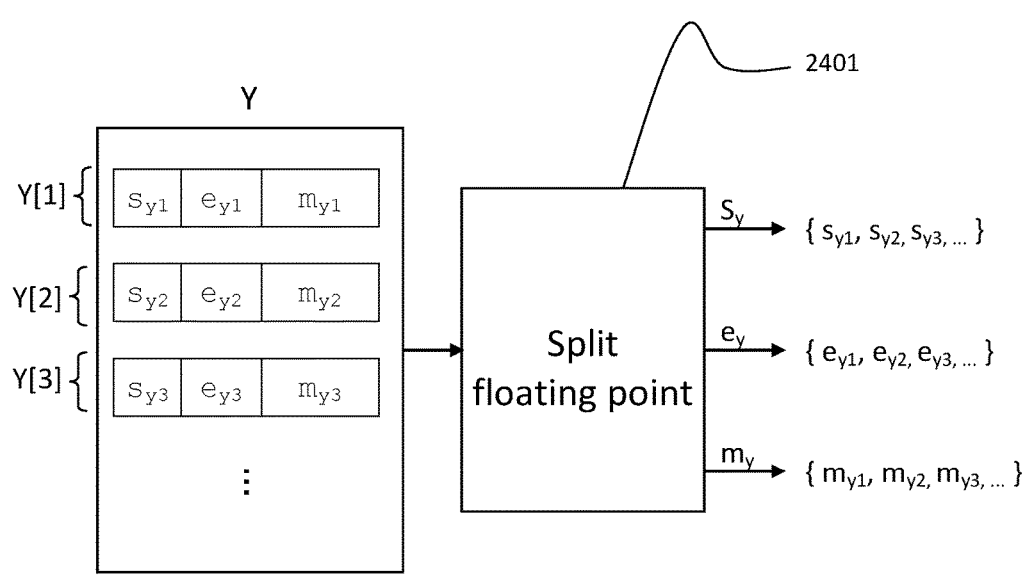
Figure 25A:
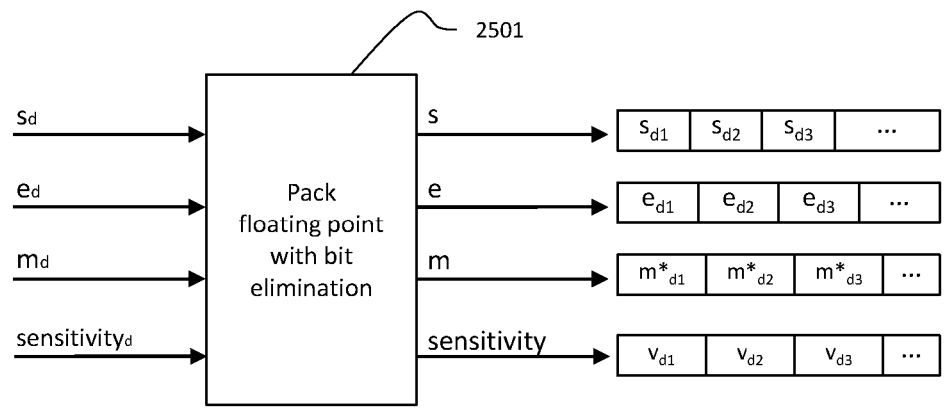
Figure 25B:
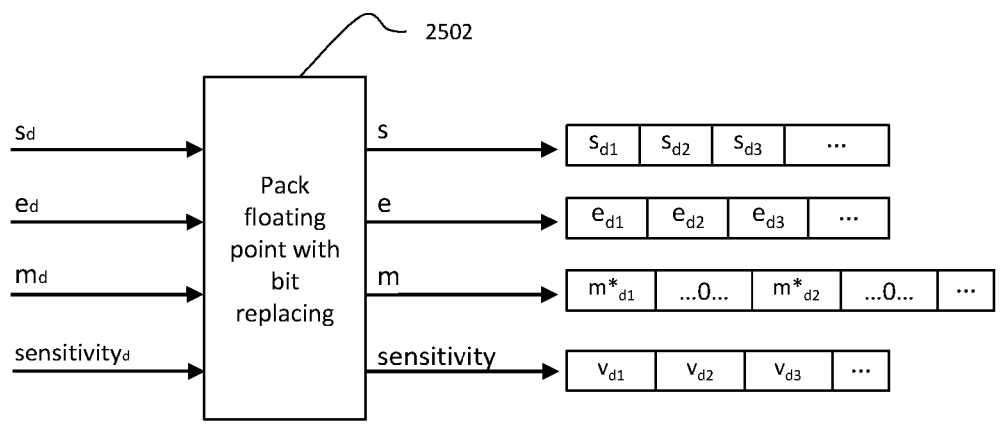

FIG. 24 shows a component in which a system 2401 receives an array of floating point numbers and outputs three sets of data that characterize the numbers in Y: a set of signs $s_y$, a set of exponents $e_y$, and a set of mantissas $m_y$. The sets $s_y$, $e_y$, and $m_y$ may be manipulated and packed into one or more variables for subsequent reduction of bit lengths. For example, FIG. 25A shows an embodiment in which elements in a set $s_d$ are stored as an array of signs s, elements in a set $e_d$ are stored as an array of exponents e, and elements in a set sensitivity$_d$ are stored as an array of sensitivities called "sensitivity". The embodiment in FIG. 25A reads the elements in $m_d$ and creates an output array m in which only the number of MSBs indicated by each element in sensitivity$_d$ are packed for each element in m. FIG. 25B shows an exemplary embodiment in which arrays s, e, and "sensitivity" are generated as in the embodiment in FIG. 25A, but in which all the bits in the elements of $m_d$ are included. In this case, the values of the number of MSB bits of the mantissas in $m_\delta$ indicated by the sensitivity is left without changes, but all the other bits of the corresponding mantissas are set to zero.

Figure 26:
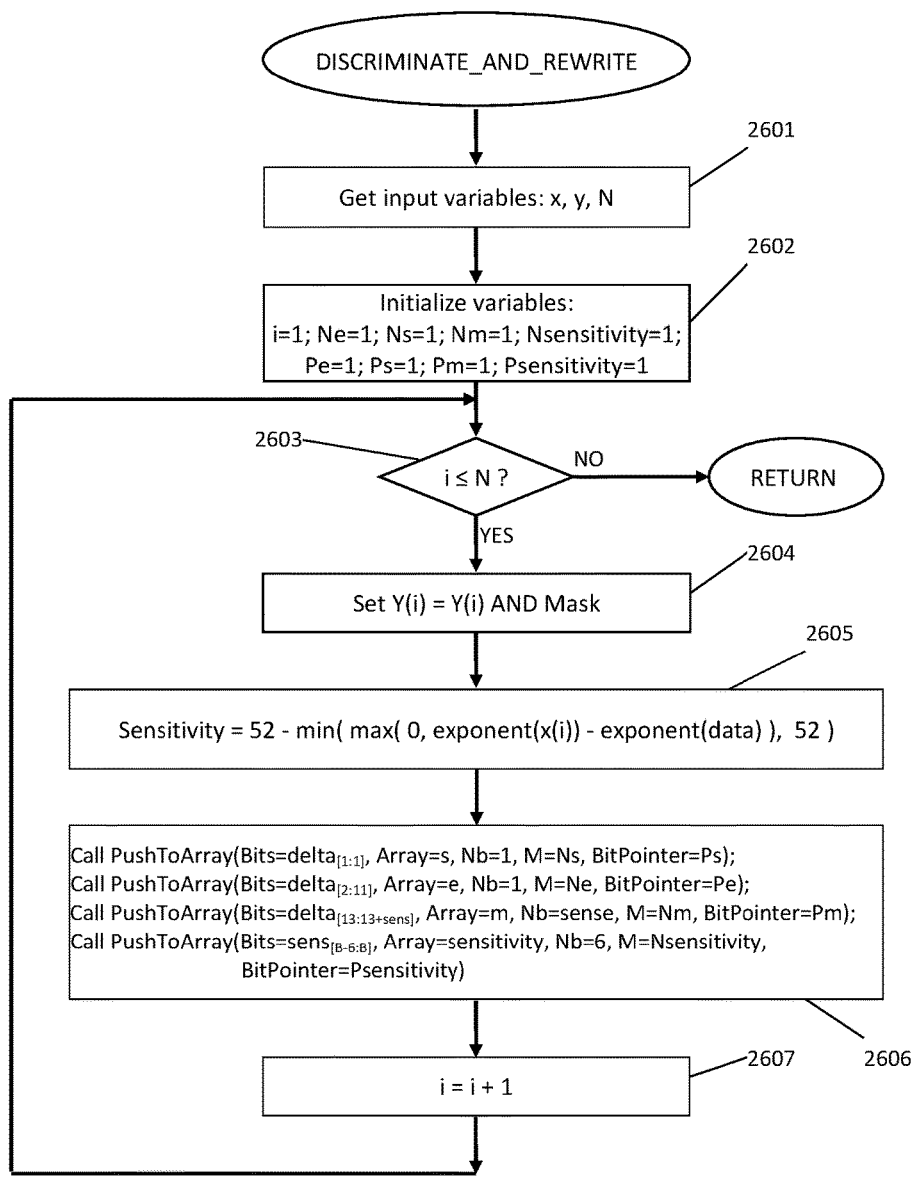

FIG. 26, illustrates an embodiment of the present invention that executes a set of operations for a joint implementation of the embodiments illustrated in FIG. 24 and FIG. 25A. The embodiment in FIG. 26 initially may split two floating-point variables (X and Y) into their signs, exponents, and mantissas, as per the ANSI/IEEE 754 standard or any other standard. The embodiment may also estimate the sensitivities of the two variables X and Y. The embodiment may also eliminate any unnecessary bits in the output information, and pack the remaining information into a separate array of signs, a separate array of exponents, a separate array of mantissas, and a separate array of sensitivities. Initially, the embodiment in FIG. 26 retrieves the variables X, Y, and N (the size of Y) as explained in step 2601. This information may be retrieved from a memory system where it may have been stored. Several variables are then initialized to "1" as described in step 2602. In step 2603, if "i" not less than or equal to "N" (i.e., both X and Y have been effectively packed into separate arrays of signs, exponents, mantissas, and sensitivities) the whole process ends; whereas if N is more than or equal to "i" (i.e, not all the bits in X and Y have been packed), the process moves on to step 2604. In step 2604 the value δ may be calculated as the difference between Y[i] and X[i]. In step 2605 the sensitivity is calculated as a function of X[i] and δ as described. Step 2606 calls a function "PushToArray" in order to pack the information into separate arrays of signs, exponents, sensitivities, and mantissas. The function "PushToArray" has the following prototype unsigned long PushToArray(unsigned long IntegerToPush,
    unsigned long NumberOfLSBsToPush, unsigned long *Array,
    unsigned long *ArrayIndex, unsigned long *BitPointer).

The function PushToArray reads the number IntegerToPush, extracts its leftmost number of bits indicated by NumberOfLSBsToPush, and writes them at Array[*ArrayIndex] starting at the bit position indicated by *BitPointer. *BitPointer is a number between 1 and 64. If NumberOfLSBsToPush is larger than (64−*BitPointer), then the (64−*BitPointer) MSBs of the group of bits extracted from IntegerToPush are copied to the rightmost part of Array[*ArrayIndex], and the (NumberOfLSBsToPush+BitPointer−64) LSBs of the group of bits extracted from IntegerToPush are copied to the leftmost part of Array[*ArrayIndex+1], followed by an increment of *ArrayIndex in 1. Before returning, PushToArray sets *BitPointer to indicate the position of the next bit available for writing at Array[*ArrayIndex]. Although FIG. 30 illustrates an embodiment in which the output is delivered as four separate variable arrays, other possible packing strategies could be implemented. For example, a user may prefer to pack a combined s and e representation in one array, and m and "sensitivity" in a separate array. It should be evident for a skilled in the art that other implementations using other programming languages or implementation techniques can be used for producing alternative embodiments of the invention. After step 2606 the process moves to step 2607, where the value of "i" is incremented by one. The process is directed to step 2603 to reassess whether (i<N) and the process may continue or not. The process goes on until the condition(N) in item 2603 becomes false.

Figure 27:
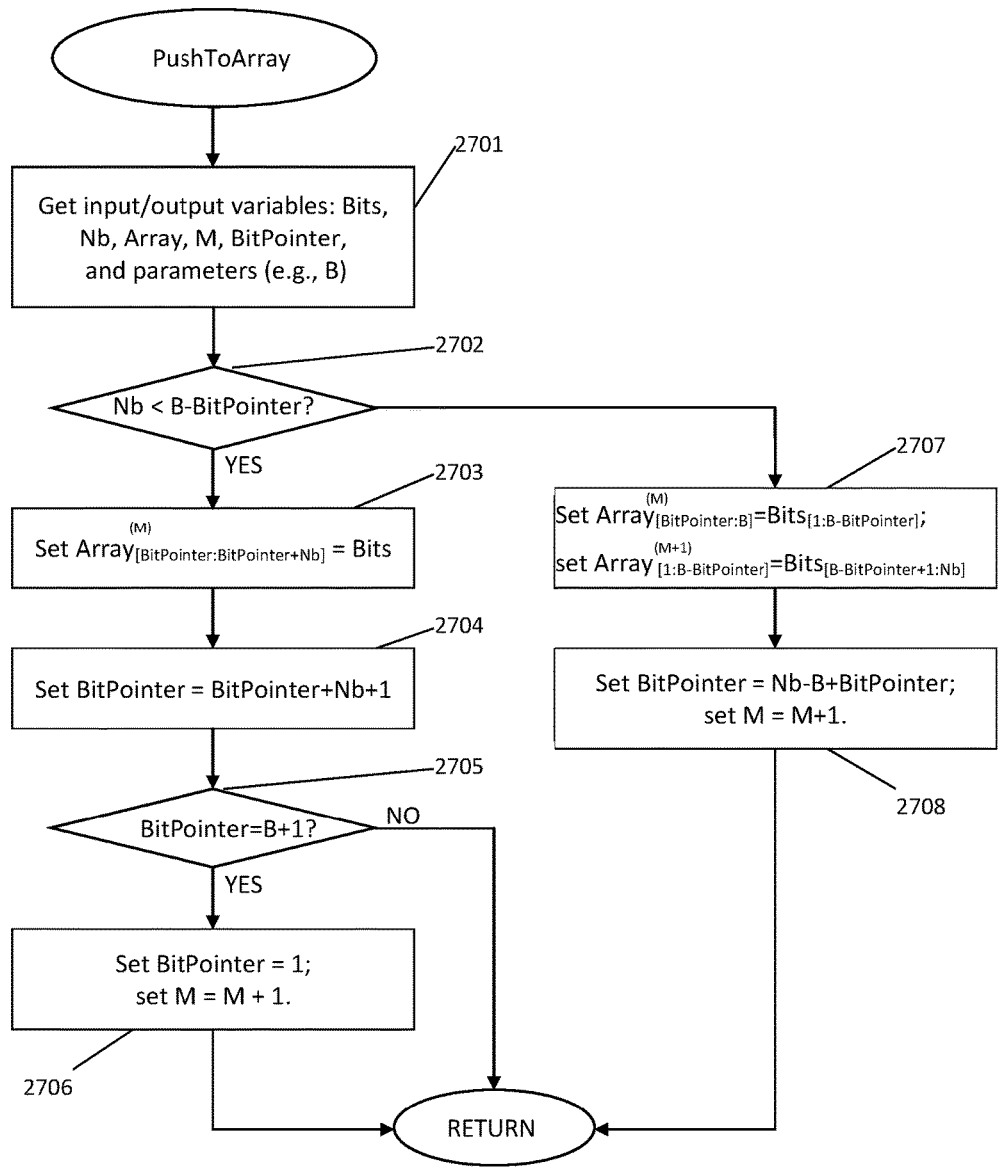

FIG. 27 illustrates an embodiment of the present invention that may be used to push elements to an array called "Array" with size B. In step 2701, the embodiment may retrieve input/output variables, such as, but not limited to: the number of bits "Nb" of the element to be pushed into "Array", the "Array", the number "M" of the element being pushed into the array, the element to be pushed which may be named as "Bits", a pointer to "Array", "BitPointer" as the pointer to a specific bit of the "Array". The embodiment may also retrieve parameters such as B and/or any other necessary parameters to push elements into "Array". In step 2702 the condition "Nb<B−BitPointer" may be assessed, and if the result is negative the process may go to step 2707; if the result is positive the process will go to step 2703. For steps 2703 and S3107 the following notation, or a part of it, is used: Array(M)[a:b]=Bits(i)[c:d]. This notation details that the a-th bit through the b-th bit in the M-th position of the array "Array" get assigned the values of the c-th bit through the d-th bit in the i-th position of the array Bits. The process goes into step 2703 if the condition "Nb<B−BitPointer" has a positive result, i.e., if the element to be pushed into "Array" will fit in the M-th position of "Array". In step 2703 in the M-th position of "Array" from the positions pointed by BitPointer to (BitPointer+Nb) may get assigned the value of the element to be pushed, i.e., the value in "Bits". After step 2703 step 2704 is shown, where "BitPointer" gets updated as shown in FIG. 27. Then a conditional step 2705 evaluates whether "BitPointer=B+1"; if the result is negative the whole process ends, whereas if the result is positive, the process directs to step 2706. In step 2706 both BitPointer and M get updated as shown in the figure. Then the process ends. The process goes into step 2707 if "Nb<B−BitPointer" has a negative result, i.e., if the element to be pushed will not fit in the M-th position of the array and may be split: one portion of the element goes into the M-th position of "Array" and the remaining portion goes into the (M+1)-th position of "Array". This assignment is described in step 2707 as per the notation described. After step 2707 comes step 2708, where BitPointer and M are updated as described in the step. After this, the process ends.

FIG. 28 contains an exemplary embodiment coded in C that executes a set of operations for a joint implementation of the embodiments illustrated in FIG. 24 and FIG. 25A. The embodiment in FIG. 28 is designed for a compiler or system that defines the type of data "unsigned long" as having 64 bits, and that defines the type of data "double" in the standard double precision floating point representation. However, these requirements are not necessary and alternative embodiments may be implemented to accommodate other data type definitions. The embodiment in FIG. 28 calls a function "PushToArray", which has the prototype unsigned long PushToArray(unsigned long IntegerToPush, unsigned long NumberOfLSBsToPush, unsigned long *Array, unsigned long *ArrayIndex, unsigned long *BitPointer).

The function PushToArray reads the number IntegerToPush, extracts its leftmost number of bits indicated by NumberOfLSBsToPush, and writes them at Array[*ArrayIndex] starting at the bit position indicated by *BitPointer. *BitPointer is a number between 1 and 64. If NumberOfLSBsToPush is larger than (64-*BitPointer), then the (64-*BitPointer) MSBs of the group of bits extracted from IntegerToPush are copied to the rightmost part of Array[*ArrayIndex], and the (NumberOfLSBsToPush+BitPointer−64) LSBs of the group of bits extracted from IntegerToPush are copied to the leftmost part of Array[*ArrayIndex+1], followed by an increment of *ArrayIndex in 1. Before returning, PushToArray sets *BitPointer to indicate the position of the next bit available for writing at Array[*ArrayIndex]. Although FIG. 28 illustrates an embodiment in which the output is delivered as four separate variable arrays, other possible packing strategies could be implemented. For example, a user may prefer to pack a combined s and e representation in one array, and m and "sensitivity" in a separate array. It should be evident for a skilled in the art that other implementations using other programming languages or implementation techniques can be used for producing alternative embodiments of the invention. The embodiment in FIG. 28 evaluates if $\delta_i < y_1$, for a number $\delta_i$ in $\delta$ and a number $y_i$ in Y. If this condition is not satisfied, then all the bits in the mantissa are necessary. That is to say, the sensitivity of the resulting $\delta_i$ is 52. An embodiment of the present invention may choose to transmit the original number $y_i$ instead of $\delta_i$, together with a signaling code that indicates that the transmitted number is $y_i$ and not $\delta_i$. Given that the sensitivity $\delta_i$ can be computed by subtracting the exponent of $\delta_i$ from the exponent of $x_i$, an exemplary embodiment of the present invention may avoid the transmission of the sensitivity array. At a receiving entity, given that the exponent of $\delta_i$ is transmitted, and the exponent of $x_i$ is known, the sensitivity of $\delta_i$ can be estimated and used for unpacking truncated mantissas of $\delta_i$.

Figure 29:
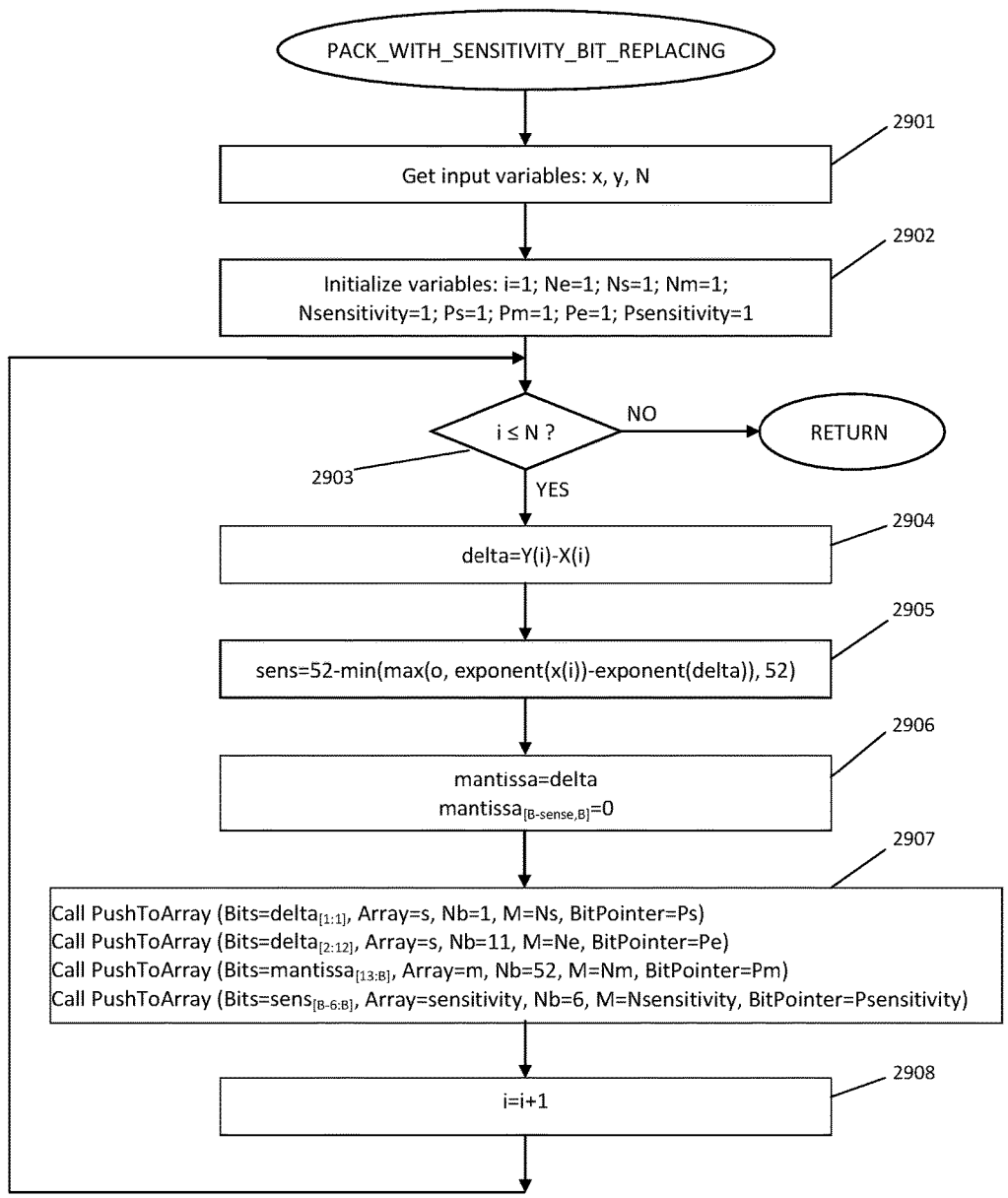

FIG. 29 illustrates an embodiment of the present invention that executes a set of operations for a joint implementation of the embodiments illustrated in FIG. 24 and FIG. 25B. FIG. 29 illustrates an embodiment of the present invention that analyzes two floating-point variables (X and Y) and splits them into their signs, exponents, and mantissas, as per the ANSI/IEEE 754 standard or any other standard. The embodiment may also estimate the sensitivities of the two variables X and Y. The embodiment may also pack the remaining information into a separate array of signs, a separate array of exponents, and separate array of sensitivities. To pack the array of mantissas, the embodiment may perform a padding operation to add enough zeroes to each mantissa element such that all elements have the same size "B", as explained graphically in FIG. 25B. Initially, the embodiment in FIG. 29 retrieves the variables X, Y, and N (the size of Y) as explained in step 2901. This information may be retrieved from a memory system where it may have been stored. Several variables are then initialized to "1" as shown in step 2902. As it is shown in step 2903, if "i" is not less than or equal to "N" the whole process ends; whereas if "N" is more than or equal to "i", the process moves on to step 2904. In step 2904 the value $\delta$ may be calculated as the difference between Y[i] and X[i]. In step 2905 the sensitivity is calculated as a function of X[i] and $\delta$. Step 2906 updates the value of "mantissa" to $\delta$, and the value of the last "sens" bits of the mantissa to "0". Step 2907 may call a function "PushToArray" in the same manner in which the embodiment in FIG. 26 calls the function "PushToArray" in step 2606. The only difference between step 2907 and 2906 may be that in 2907 the third call to "PushToArray" assigns to "Bits" the value of all the mantissa bits (from the 13-th to the B-th), which may create a zero padding in the output that ensures that all elements in the mantissa array have the same size (B). Although FIG. 29 illustrates an embodiment in which the output is delivered as four separate variable arrays, other possible packing strategies could be implemented. For example, a user may prefer to pack a combined sign and exponent representation in one array, and m and "sensitivity" in a separate array. It should be evident for a skilled in the art that other implementations using other programming languages or implementation techniques can be used for producing alternative embodiments of the invention. Following step 2907 is step 2908, where the value of "i" is incremented by one. The process is directed to item 2903 to reassess whether (i≤N) and the process may continue or not. The process goes on until the condition (i≤N) in item 2903 becomes false.

FIG. 30 illustrates an exemplary embodiment constructed in a similar way to the embodiment in FIG. 28. The embodiment in FIG. 30, however, does not truncate bits in the mantissas contained in $m_\delta$. Instead of truncating bits in the mantissas in $m_\delta$ as in the embodiment illustrated in FIG. 28, the embodiment in FIG. 30 replaces the bits in the mantissas that are not included in the range indicated by the sensitivities of the corresponding floating point numbers by zeroes, as is shown in FIG. 25B. Replacing these bits by zeroes may be useful when the output arrays of the embodiment in FIG. 30, or the outputs of embodiments constructed using this strategy, are delivered to a compressor 801 that could identify and efficiently compress said patterns of zeroes.

Figure 31:
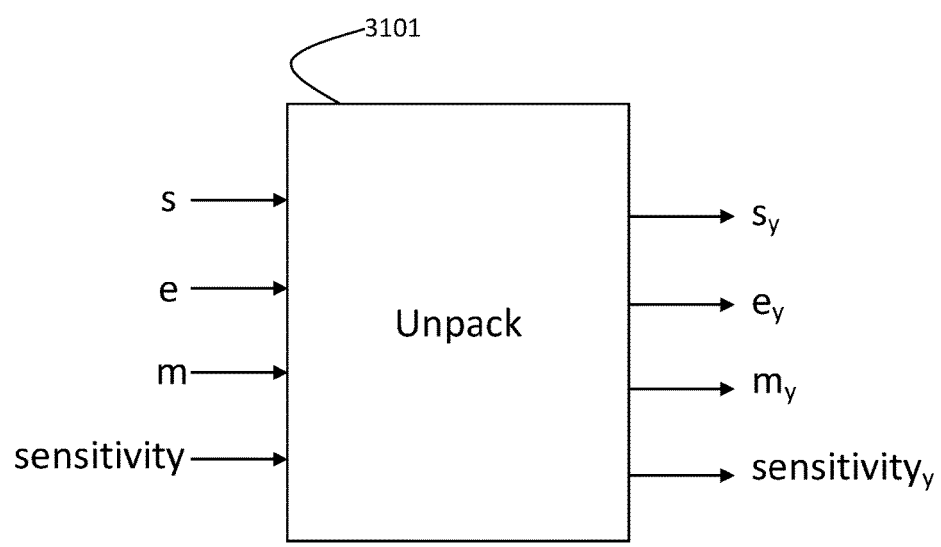

FIG. 31 shows an Unpack system 3101 that may be used to process arrays of packed signs s, exponents e, mantissas m, and sensitivities "sensitivity". After partially or fully receiving one or more input arrays, the unpack system 3101 generates sets $s_y$, $e_y$, $m_y$, and sensitivity$_\delta$, which should be equivalent to the corresponding sets used in the implementation in FIG. 24. In an embodiment of the present invention, the output of system 1701 could be used for regenerating a variable array of floating point numbers Y.

Figure 32:
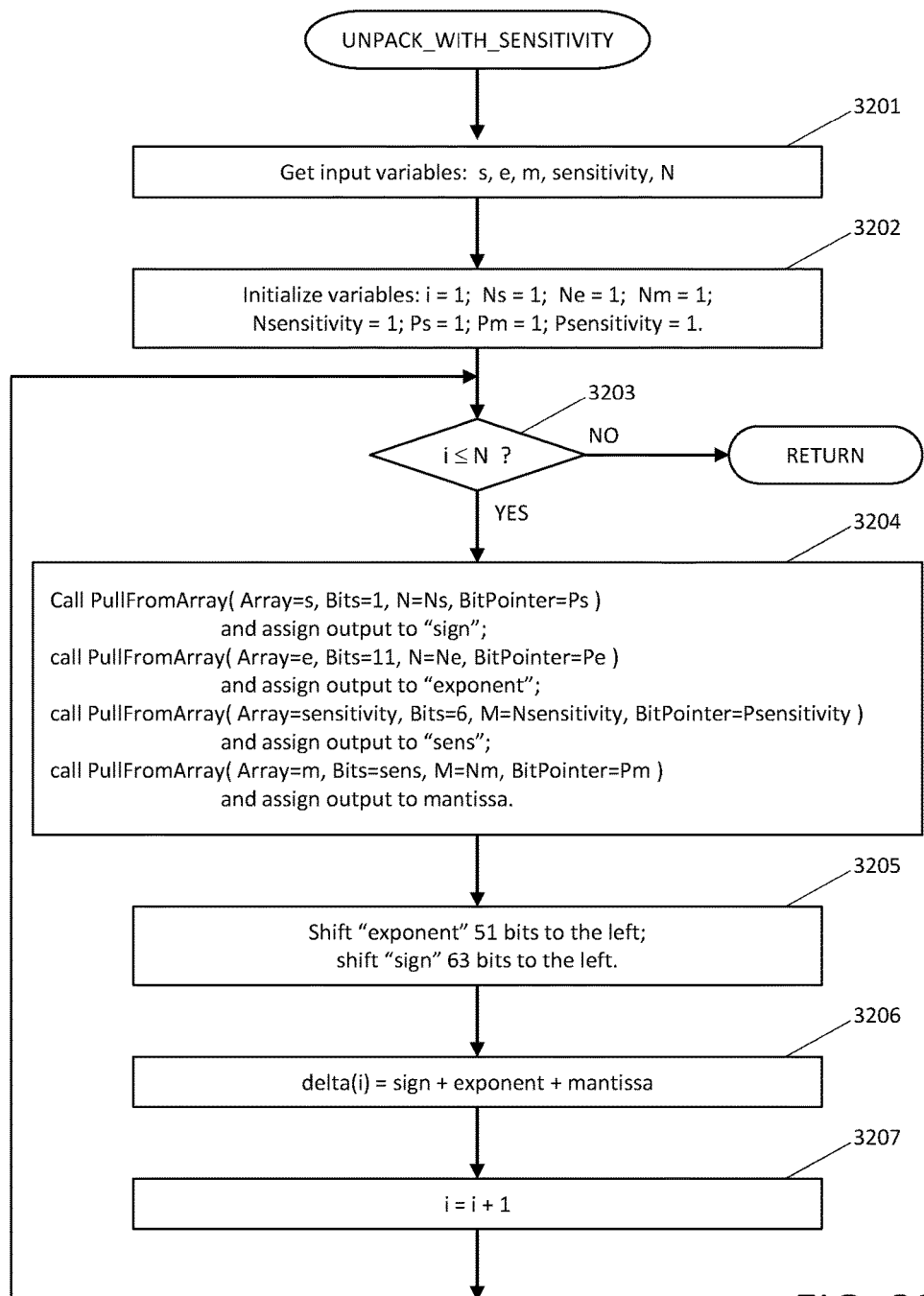

FIG. 32 illustrates an embodiment of the present invention that implements an unpack system similar to the one described in FIG. 31. The embodiment in FIG. 32 may be used to process separate arrays of packed signs "s", exponents "e", mantissas "m", and sensitivities "sensitivity". After partially or fully receiving one or more of these input arrays the process in FIG. 32 may perform a process to unpack the arrays into $s_\delta$, $e_\delta$, $m_\delta$, and sensitivity$_\delta$, which should be equivalent to the corresponding output sets in the embodiment in FIG. 31. In the first step in FIG. 32, the process retrieves the arrays "s", "e", "m", "sensitivity", and the array N (which carries the values of the sizes of the elements in the arrays) as explained in step 3201. This information may be retrieved from a memory system or it may have been received from a sending entity. Several variables are then initialized to "1" as shown in step 3202. As is shown in step 3203, if "i" is not less than or equal to "N" the whole process ends; whereas if "N" is more than or equal to "i", the process moves on to step 3204. In step 3204 the process "PullFromArray" (described in FIG. 33) gets called for each of the arrays of data that may have been retrieved (i.e., "s", "e", "m", and "sensitivity"). Through "PullFromArray", the process may pull values from each of the retrieved arrays to place them in an output array. In step 3205 the output arrays "exponent" and "sign" may be shifted 51 and 63 bits to the left respectively to place them in their respective positions as per the ANSI/IEEE 754 floating point standard. In step 3206, the value δ(i) is updated with the addition of the "sign", "exponent", and "mantissa" output arrays. In step 3207 the value of "i" is incremented by one. The process is directed to step 3203 to reassess whether (i≤N) and the process may continue or not. The process goes on until the condition (i≤N) in step 3203 presents a negative answer.

Figure 33:
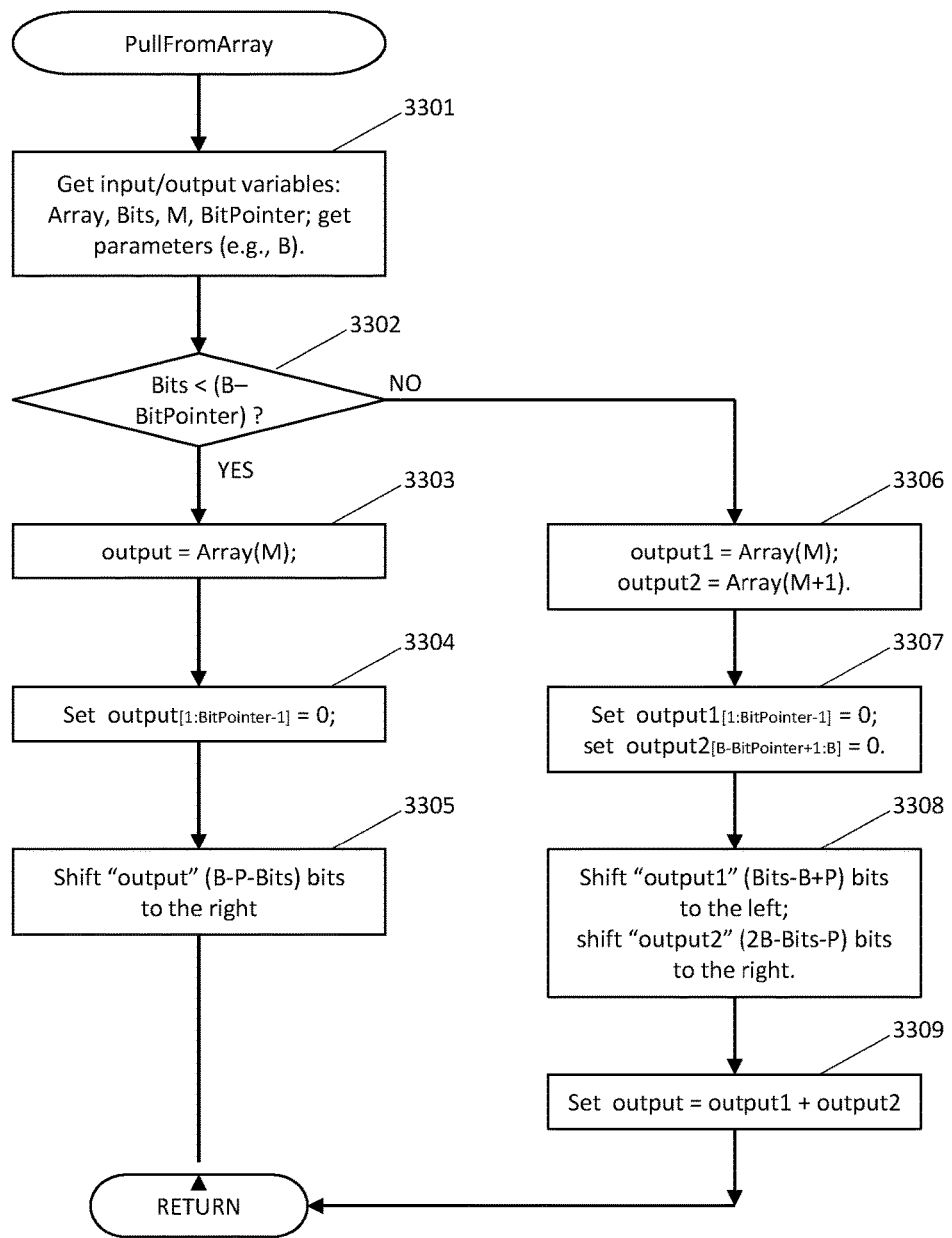

FIG. 33 illustrates an embodiment of the present invention that may be used to pull elements from an array called "Array" with size B. In step 3301, the embodiment may retrieve input/output variables, such as, but not limited to: the number of bits "Nb" of the element to be pulled from "Array", the number "M" of the element being pushed into the array, the element to be pulled and named as "Bits", a pointer to "Array", "BitPointer" as the pointer to a specific bit of the "Array". The embodiment may also retrieve parameters such as "B" and/or any other necessary parameters to pull elements from "Array". In step 3302 the condition "Bits<B-BitPointer" may be assessed, and if the result is negative the process may go to step 3306; whereas if the result is positive the process will go to step 3303. For steps 3304 and 3307 the following notation, or a part of it, is used: output[a:b]=0. This notation implies that the a-th bit through the b-th bit in the array "output" get assigned the value "0". The process goes into step 3303 if the condition "Bits<B-BitPointer" has a positive result, i.e., if the amount of bits to be pulled from "Array" will fit in the output element. In step 3303 output gets assigned the M-th position of "Array". In step 3304 the first (BitPointer-1) bits of "output" get assigned a "0" value. In step 3305 "output" gets shifted by (B-P-Bits) to the right. After step 3305 the process ends. The process goes into step 3306 if "Bits<B-BitPointer" has a negative result, i.e., if a portion of the element to be pulled is contained in the M-th portion of "Array" and the rest of the element is in the (M+1)-th portion of "Array". In step 3306 the M-th portion of "Array" gets assigned to "output1" and the (M+1)-th portion of "Array" gets assigned to "output2". In step 3307 the first (BitPointer-1) bits of "output" get assigned a "0" value; and the last (BitPointer-1) bits get assigned a "0" value. In step 3308 "output1" gets shifted by (Bits-B+P) to the left; and "output2" gets shifted (2B-Bits-P) bits to the right. Step 3309 sets "output" as the sum of "output1" and "output2". After step 3309 the process may come to an end.

FIG. 34 illustrates an exemplary embodiment of an unpack system 3101, which is combined with the generation of a vector "delta". Although the implementation in FIG. 34 is coded in C, and is designed for being compiled or for running on a system that defines the type of data "unsigned long" containing 64 bits, other programming languages or implementations designed according to the spirit of the present invention could also be used. The function UnpackWithSensitivity in FIG. 18 calls a function PullFromArray, which has the prototype unsigned long PullFromArray(unsigned long *Array, unsigned long
BitsToExtract, unsigned long *ArrayIndex, unsigned long *BitPointer);

The function PullFromArray reads a number of bits indicated by its argument BitsToExtract from the element Array[*ArrayIndex], starting said reading at the bit number indicated by the argument BitPointer. BitPointer is a number between 1 and 64, with BitPointer=1 corresponding to the MSB of Array[*ArrayIndex] and BitPointer=64 corresponding to the LSB of Array[*ArrayIndex]. If BitPointer+BitsToExtract is larger than 64, the extracted bits are formed by the (64-BitsPointer) LSB of Array[*ArrayIndex], concatenated with the (BitsToExtract+BitPointer-64) MSB of Array[ArrayIndex+1], and *ArrayIndex is incremented in 1. The extracted bits are aligned positioning their LSB at bit 64, and padding with zeroes to the left, as needed for completing a 64 bit number. Before returning, PullFromArray updates BitPointer to indicate the position of the bit that follows the last bit read. The implementation in FIG. 34 could be used for unpacking numbers that have been packed with bit elimination, as in 2501. The implementation in FIG. 34 could be used for unpacking numbers that have been packed with bit replacing, as in 2502, by setting the elements in the set "sensitivity" to 52. The operations and instructions in FIG. 34 may be modified for optimizing the execution of a distributed algorithm.

Figure 35A:
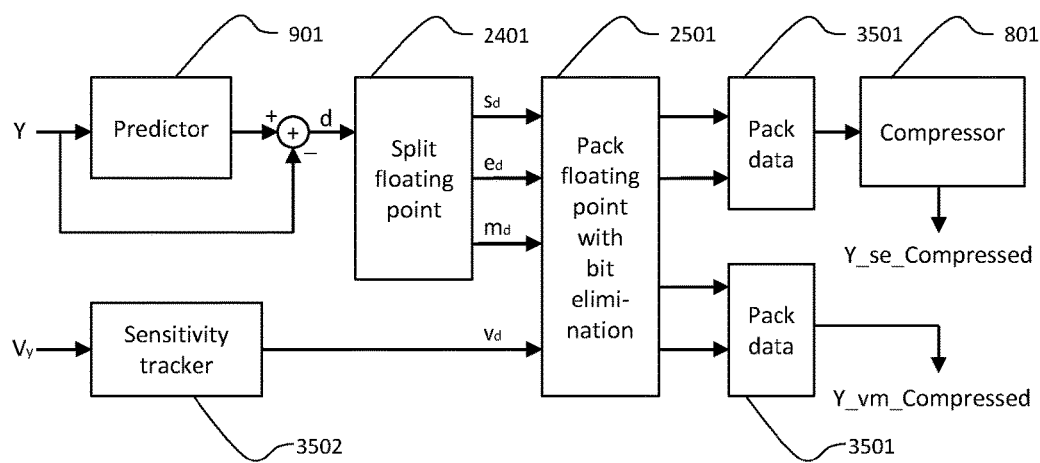

An embodiment may concatenate a compressor 801 with a sensitivity-based packing with bit elimination 2501. Another embodiment may concatenate a sensitivity-based packing with bit elimination 2501 with one or more compressors 801. For example, the output arrays s and e from a 2501 component may be combined in a single array of the form $[s_{d1}, e_{d1}, s_{d2}, e_{d2}, \ldots]$, and then this array may be used as input for a compressor 801. An exemplary embodiment for compression is shown in FIG. 35A. The embodiment in FIG. 35A receives a set of floating point data elements $Y=\{y_1, y_2, \ldots, y_n\}$, n≥1, together with its corresponding set of sensitivities $V=\{v_{y1}, v_{y2}, \ldots, v_{yn}\}$ and produces two sets of compressed data Y_se_Compressed and Y_vm_Compressed, containing compressed signs, exponents, mantissas, and sensitivities of the data elements in Y. A predictor 901 may be used for generating data elements d that may allow better compression rates for data in Y. Based on the sensitivities of the elements of Y, a sensitivity tracker 3501 may compute the sensitivity of data elements d. For example, a sensitivity tracker may implement any of the N-conservative or N-aggressive algebras described above. A split floating point component 2401 may be used for splitting data elements d into their floating point components $s_d$, $e_d$, and $m_d$. Then, a pack floating point with bit elimination component 2501 may use the floating point components $s_d$, $e_d$, and $m_d$, as well as the sensitivity information $v_d$ for producing data elements s, e, $v_d$, and m, where a data element in m may contains less bits than its corresponding data element in $m_d$ due to the potential truncation of garbage bits enabled by the sensitivity $v_d$. Then, the resulting sets of data elements s, e, $v_d$, and m may be packed into one or more arrays. For example, a pack data component 3501 may produce an output array taking one data element from each input at the time (e.g., if the inputs are {$s_1$, $s_2$, $s_3$} and {$e_1$, $e_2$, $e_3$}, then the packed output would be {$s_1$, $e_1$, $s_2$, $e_2$, $s_3$, $e_3$}). Then s and e may be packed into a single array {s,e} and $v_d$ and m could also be packed into a single array Y_vm_Compressed={$v_{d1}$, $m_{d1}$, ..., $v_{dn}$, $m_{dn}$}. One skilled in the art would notice that this type of sensitivity-based packing may be seen as a variable-length encoding. One or more arrays of data elements generated by 2501 may be further compressed using a compressor 801. For example, the packed output {s, e} generated by a pack data component 3501 may be compressed by a compressor 801, generating an output Y_se_Compressed that contains the data {$s_{d1}$, $e_{d1}$, ..., $s_{dn}$, $e_{dn}$}. An embodiment may decompress data elements that were originally compressed using a sensitivity-based packing with bit elimination 2501, by making use of an unpacking 2101 or unpack 3101 that recovers the full bit-length (e.g., 32 bits, 64 bits, other user-defined bit lengths) data. An embodiment may also incorporate a decompressor 1301 to decompress data elements or subarrays that were used in the sensitivity-based compression.

Figure 35B:
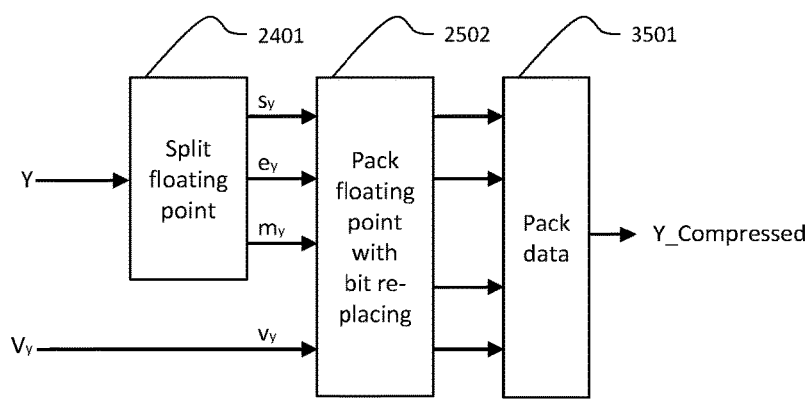

An embodiment may concatenate a compressor 801 with a sensitivity-based packing with bit replacing component 2501. Another embodiment may concatenate a sensitivity-based packing with bit elimination 2501 with one or more compressors 801. For example, the output arrays s and e from a 2501 component may be combined in a single array of the form [$s_{\delta1}$, $e_{\delta1}$, $s_{\delta2}$, $e_{\delta2}$, ... ], and then this array may be used as input for a compressor 801. Another exemplary embodiment uses the output array m in FIG. 25B as an input for a compressor 801. An exemplary embodiment for compression of floating point data elements is shown in FIG. 35B. The embodiment in FIG. 35B receives a set of floating point data elements Y={$y_1$, $y_2$, ..., $y_n$}, n≥1, together with its corresponding set of sensitivities V={$v_{y1}$, $v_{y2}$, ..., $v_{yn}$} and produces a sets of compressed data Y_Compressed. After splitting each data element $y_i$, i=1, ..., n into its floating point components $s_y$, $e_y$, and $m_y$ through a split floating point element 2401, a pack floating point with bit replacing component 2502 may use $s_y$, $e_y$, and $m_y$, together with the sensitivity information $V_y$ to produce arrays s, e, m, and v. These arrays may be packed by a pack data component 3501 to produce a new single set of data elements that may be fed to a compressor 801. The output of the compressor 801 may contain the compressed data Y_Compressed corresponding to Y. An embodiment may decompress data elements that were compressed using a sensitivity-based packing with bit replacing component 2501 combined with at least a compressor 801 by using one or more decompressors 1301 that execute the decompression operation that corresponds to the compressor(s) used for compression/encoding of the compressed data Y_Compressed.

According to an aspect of the invention, using sensitivity information in tandem with other compressors 801 could reduce the number of bits required for representing a set of data elements Y.

Using Sensitivity Information in Numerical Applications

According to an aspect of the invention, the sensitivity of data elements may be used throughout the execution of an application. This may include the use of sensitivity information in arithmetic operations (e.g., addition, subtraction, multiplication), control operations (e.g., comparators, stop conditions, switches), transmission/reception of data elements, compression/decompression of data elements, memory read/write operations, or any other operation required in the execution of a numerical application.

In an embodiment of the present invention, the number of bits used for encoding and/or packing elements of a numerical variable or array may vary from element to element. Since the number of bits used for representing a numerical variable is commonly known as "precision", we may refer to said encoding as Massively Asymmetric Precision (MAP). MAP allows more flexibility in assigning precisions for the representation of numerical variables than other known techniques such as Mixed Precision. This flexibility could support attaining higher compression gains for the representation of numbers in processing or memory systems. Although exemplary embodiments of the invention described herein are based on floating point formats, any equivalent modifications and variations according to the spirit of the present invention that use other data formats are to be included within the scope of the claims stated below.

Figure 36:
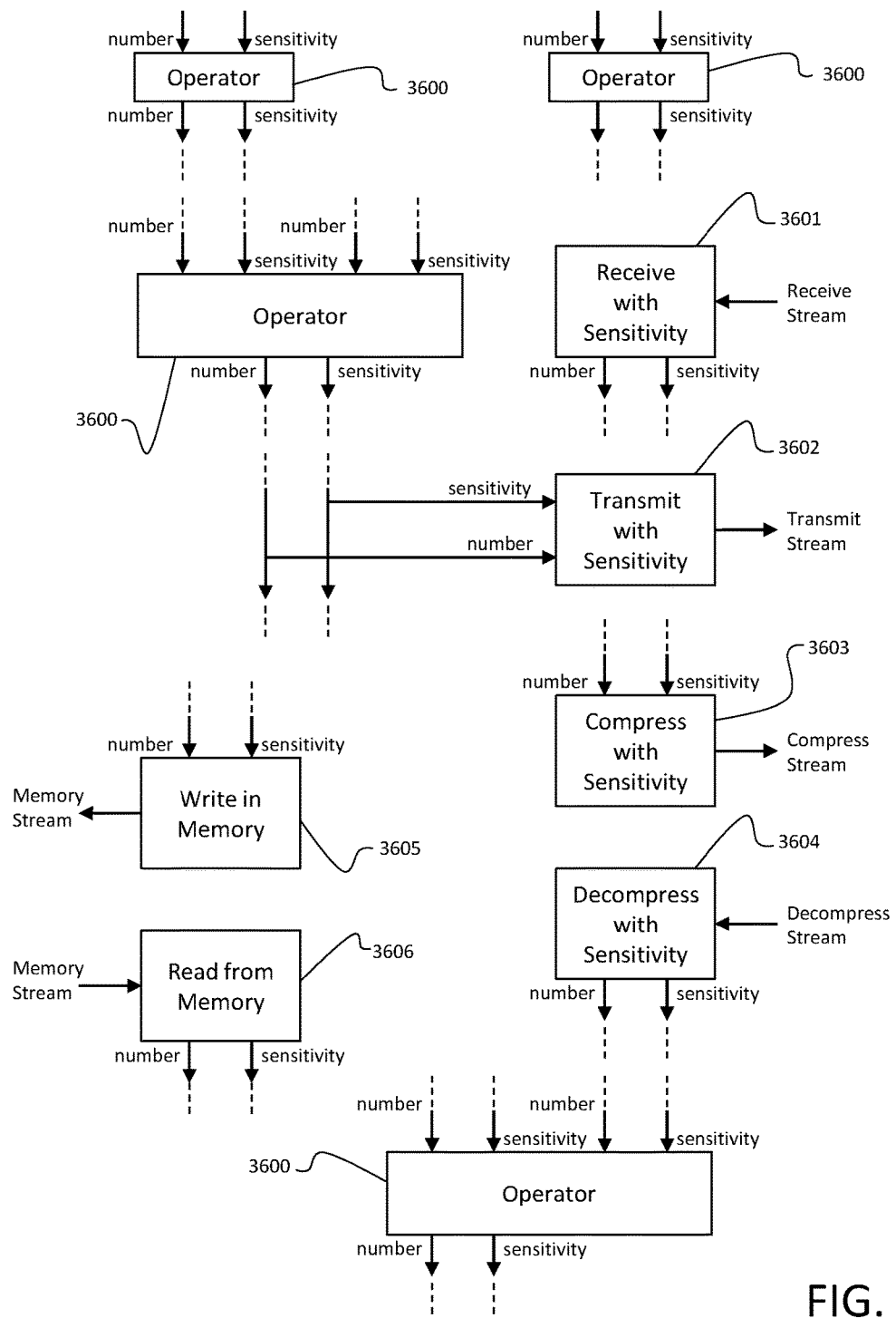

FIG. 36 shows an embodiment in which sensitivity information is used throughout the execution of an application. One or more operators 3600 execute numerical operations. An operator 3600 may execute basic operations such as an addition or a multiplication, or collections of operations that make more complex operations such as a linear equation solver. An operator 3600 may receive one or more inputs, and may render one or more outputs. In an embodiment of the invention, an operator 3600 may receive the sensitivity of one or more input numbers, and output the sensitivity of one or more output numbers. Default values for the sensitivities, as well as systems, functions, methods, or rules that define how the sensitivities may be computed (i.e., algebras) for operators 3600 may be specified by a user through one or more user interfaces. The determination of the values for the sensitivities or of the specific systems, functions, methods or rules to compute them can be made a priori based on user experience or specific experiments, or may be made at runtime depending on the particular nature of the operators and/or the particular data results being observed, or both. Each operator 3600 may contain its own particular sensitivity computation mechanism or method. If sensitivity information is not provided, operators may default its value to particular values. For example, sensitivities may default to a value Vmax, defining the maximal native precision in the computing system. For example, when using double precision floating point native arithmetics, Vmax may be to 52, which defines the maximal precision for the mantissa of a double-precision floating point number. A transmit component 3602 may use the sensitivity information of a number or set of numbers, for reducing the number of bits in the transmit stream. Through a user interface or during the design of an application, the user may indicate or define systems, functions, methods, or rules in the system which will indicate as to when and for which numbers (during the execution of the application) to use sensitivity information for effectuating a change in precision. The effectuation of a change of precision (based on the sensitivity) can be made through any means available for truncating the bits to be eliminated and (optionally packing the bits of interest into a packed stream of shorter length) or replacing the bits to be eliminated by other more convenient bits, including the systems and methods described in previous sections of this document. Any effectuation of change of precision may or may not be coupled with the format type or bit length defined natively by the system for the computation of the number. Also, whenever the user decides to effectuate change of precisions as indicated by sensitivity values, those precisions can vary along the different components of an array of data, as well as along different instances of computation for a variable.

In an exemplary embodiment, a transmit component 3602 contains a discriminator 1602, which passes sensitivity information to a bit elimination and packing component 1601. The packing component 1601 eliminates a number of Least Significant bits in the mantissa of each datum to transmit as indicated by the sensitivity of each datum (i.e., for each datum, Vmax−V Least Significant Bits are eliminated, where S is the sensitivity of said datum). A receive component 3601 receives streams of data, which may contain numbers accompanied by the corresponding sensitivity of each number, packed in compressed or uncompressed formats. The receive component 3601 may output numbers and sensitivity information.

Similarly, in an exemplary embodiment, a compress with sensitivity component 3603 and/or a decompress with sensitivity component 3604 contains means for compressing data using sensitivity information, such as the ones described in FIG. 35A, 35B, or components/elements described in the subsection "data compression based on sensitivity analysis" above. Write in memory 3605 and read from memory 3606 components may use sensitivity information for reducing the number of bits transferred to/from external memory.

Memory Read/Write Operations Based on Sensitivity Analysis

In an embodiment, sensitivity information may be used for reducing data movement between different memory hierarchies. For example, operators 3600 may be inside a processor system that contains local high speed memory (e.g., cache), "transmit with sensitivty" components 3602 or "write in memory" components 3605 may effectuate data movement by writing into higher hierarchy or external low speed memory (e.g., RAM, memory 302), and "receive with sensitivity" components 2401 or "read from memory" components 3606 may effectuate data movement by reading data from higher hierarchy or external low speed memory. Reading/writing operations may be done with data packing, compression components, combined with appropriate memory data read/write operations.

Figure 37:
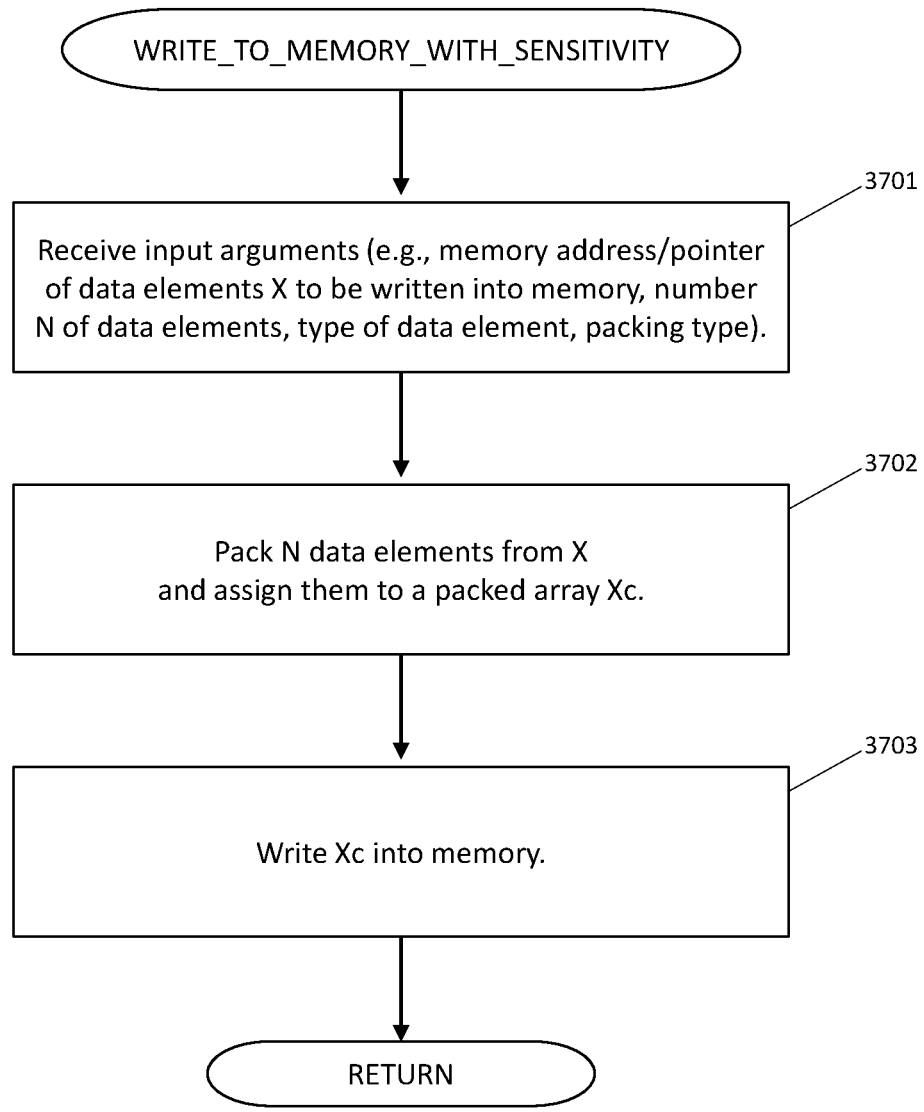

FIG. 37 shows an exemplary embodiment that may be used for writing data elements into memory using sensitivity information. The embodiment of FIG. 37, which we call "WRITE_TO_MEMORY_WITH_SENSITIVITY" receives input arguments in 3701. Input arguments may include memory addresses or pointers to an array of data elements X that are in a lower hierarchy memory system and that must be written into a higher hierarchy memory system, the size of the array X, and any other additional information or parameters, such as type of data element (e.g., floating point, double precision floating point, fixed point, integer), or packing type (e.g., bit elimination/bit replacing, sign-exponent compression, full array compression). Then, in 3702 the elements of the array X are packed accordingly and assigned to an array Xc. Finally, in 3703 the array Xc is transferred to an external memory. One skilled in the art should notice that the elements 3701, 3702, and 3703 may be used in different order or combinations. Also, transfers to external memory could be handled automatically by instructions in a computer device 101. For example, computer devices with different memory hierarchies (e.g., cache memory 309 and memory 302) may automatically try to optimize access to data, keeping some data elements into a faster access cache memory 309, but reaching to memory 302 when the required data is not or does not fit in cache memory 309.

FIG. 38 shows an exemplary embodiment described in the C programming language, and that could be compiled and executed in a computer device 101. The embodiment in FIG. 38 is a function called "WriteToMemoryWithSensitivitiy", and receives a number of parameters: pointer to an array of double precision data X; an integer Nx that contains the number of elements in X; an unsigned 64-bit integer Xv that contains the sensitivities of the data elements in X; a pointer to an array of sensitivity-based packed elements Xc; a pointer to an integer Index_Xc that indicates the data element of the array Xc that has at least one bit available for writing; integer indicating the first number of the first bit, from MSB to LSB, of Xc[*Index_Xc] that is available for writing; an integer called PackingType that may be used for specifying a particular packing implementation mode; and auxiliary pointers to arrays se, sec, and vm, that should be allocated and initialized before calling this function, and that may be used for storing temporary data during the call to WriteToMemoryWithSensitivity. Memory allocation of arrays may be done prior to calling this function to reduce the execution time of the function. The embodiment in FIG. 38 illustrates two packing types, namely bit elimination with compressed sign and exponents, and bit replacing. However, other packing types could be incorporated to the function. The function WriteToMemoryWithSensitivity calls three functions, namely PushToArray (e.g., as described in embodiments related to FIG. 9B), Compress (e.g., as described in embodiments related to FIG. 10C), and PushArrayToArray. The latter function has the prototype:

```
unsigned long PushArrayToArray( unsigned long *SourceArray,
                                unsigned long
                                FirstBitFromSourceToPush,
                                unsigned long NumberOfBitsToPush,
                                unsigned long *DestinationArray,
                                unsigned long *DestinationArrayIn-
                                dex,
                                unsigned long
                                    *DestinationArrayBitPointer
                                ),
``` where SourceArray is a pointer to an array that contains the bits that are going to be copied to a destination array, and DestinationArray is a pointer to the array that will contain the copied bits. The integer FirstBitFromSourceToPush indicates the bit number, from MSB to LSB, of the first element of SourceArray to be copied. Starting at this bit, the integer NumberOfBitsToPush indicates the number of bits to be copied. As an input, the argument DestinationArrayIndex is a pointer to the element of DestinationArray that will contain the first bit copied from SourceArray. As an output, DestinationArrayIndex is a pointer to the element of DestinationArray that contains bit that follows the last bit copied from SourceArray. Similarly, as an input, the argument DestinationArrayIndex is a pointer to a memory address that contains the bit number of DestinationArray[*DestinationArrayIndex], from MSB to LSB, that will contain the first bit copied from SourceArray. As an output, DestinationArrayIndex is a pointer to a memory address that will contain the bit of DestinationArray[*DestinationArrayIndex] that follows the last bit of SourceArray copied. The function WriteToMemoryWithSensitivity could be further optimized for faster execution. One skilled in the art should notice that the function WriteToMemoryWithSensitivity could be defined using other programming languages, instructions, encodings, data types, etc., while maintaining the spirit of the invention.

Figure 39:
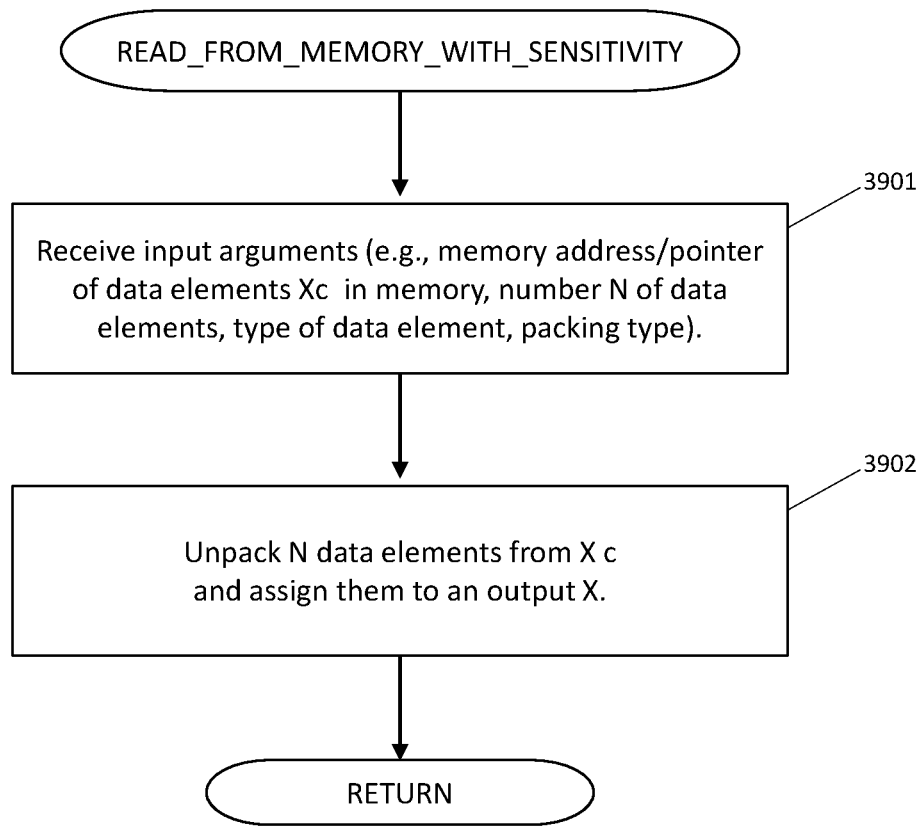

FIG. 39 shows an exemplary embodiment that may be used for reading data that has been stored into a higher hierarchy memory using sensitivity information. The embodiment of FIG. 39, which may be defined or invoked by the name "READ_FROM_MEMORY_WITH_SENSITIVITY" receives input arguments in 3901. Examples of input arguments are memory addresses or pointers to arrays of packed data Xc and unpacked data X, the number N of data elements to be read, the type of data element to be processed (e.g., floating point, double precision floating point, fixed point, integer), packing type, and compression specifications, among others. Based on the information received in 3901, in 3902 N elements are unpacked from Xc and assigned to a variable X. After this is done, READ_FROM_MEMORY_WITH_SENSITIVITY returns.

FIG. 40 shows an exemplary embodiment described in the C programming language, and that could be compiled and executed in a computer device 101. The embodiment in FIG. 40 is a function called "ReadFromMemoryWithSensitivity", and receives a number of parameters: pointer to an unsigned array of 64-bit integers Xc that contains the sensitivity-based packed data; number of elements Nx to be read from memory; pointer to an array of double precision floating point data X; a pointer to an array of 64-bit unsigned integers that will contain the sensitivities of floating point data elements in X; a pointer to an integer Index_Xc that indicates the element of Xc that contains the first bit to be read; a pointer to an integer BitPointer_Xc that indicates position of a bit, from MSB to LSB, in the array Xc[*Index_Xc] to be read first; an integer PackingType to specify the type of packing; and auxiliary pointers to arrays se, sec, and vm, that should be allocated and initialized before calling this function, and that may be used for storing temporary data during the call to ReadFromMemoryWithSensitivity. Two packing types are illustrated in FIG. 40, namely bit elimination with compressed sign and exponents, and bit replacing. However, other packing types could be incorporated to the function. The function ReadFromMemoryWithSensitivity calls three functions, namely PullFromArray (e.g., as described in embodiments related to FIG. 13C), Decompress (e.g., as described in embodiments related to FIG. 14C), and PullArrayFromArray. The latter function has the prototype:

```
unsigned long PullArrayFromArray( unsigned long *SourceArray,
                                   unsigned long *SourceArrayIndex,
                                   unsigned long
                                        *SourceArrayBitPointer,
                                   unsigned long *DestinationArray,
                                   unsigned long NumberOfBitsToPull
                                 ),
``` where SourceArray is a pointer to an array that contains the bits that are going to be copied to a destination array, and DestinationArray is a pointer to the array that will contain the copied bits. As an input, the argument SourceArrayIndex is a pointer to the element of SourceArray that will contain the first bit copied from SourceArray. As an output, SourceArrayIndex is a pointer to the element of SourceArray that contains bit that follows the last bit copied to DestinationArray. Similarly, as an input, the argument SourceArrayIndex is a pointer to a memory address that contains the bit number of SourceArray[*SourceArrayIndex], from MSB to LSB, that contains the first bit copied to DestinationArray. As an output, DestinationArrayIndex is a pointer to a memory address that contains the bit of SourceArray[*SourceArrayIndex] that follows the last bit of SourceArray copied. The integer NumberOfBitsToPush indicates the number of bits to be copied. The function ReadFromMemoryWithSensitivity could be further optimized for faster execution. One skilled in the art should notice that the function ReadFromMemoryWithSensitivity could be defined using other programming languages, instructions, encodings, data types, etc., while maintaining the spirit of the invention.

Figure 41:
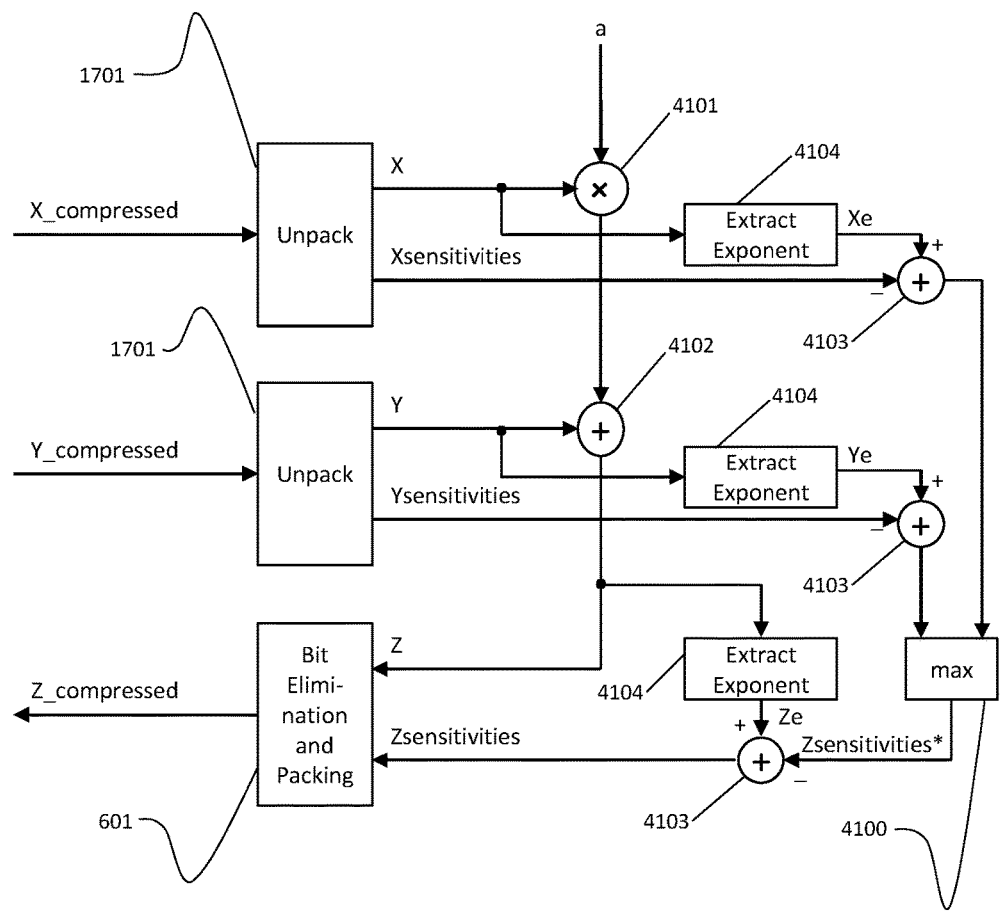

FIG. 41 shows an exemplary embodiment for sensitivity tracking within an AXPY operator. An AXPY operator computes a vector Z=aX+Y, where "a" is a scalar, and X and Y are two vectors of equal size. In the exemplary embodiment, the components of vectors X and Y are floating point numbers that are packed along with each component's sensitivity in the local RAM memory (e.g., memory 302) of a computer device. Unpack systems 4101 unpack the data and output X, Xsensitivities, Y, and Ysensitivities, component by component. The exponents of X and Y, Xe and Ye, respectively, are extracted and their floating point exponent bias is subtracted by "unpack exponent" components 4104. Xe and Ye are operated with their corresponding sensitivities Xsensitivities and Ysensitivities by integer adders 4103, followed by an operator 4100 that computes the maximum of two integers. The output of the operator 4100 contains Z*sensitivities, the absolute sensitivities of Z computed based on a 0-conservative algebra. The components X, Y, and a are operated using a multipliers 4101 and a floating point adder 4102 to obtain Z=aX+Y. The unbiased exponent of Z, Ze, is extracted from Z using an "unpack exponents" component 4104. Ze and Z*sensitivities are operated using an adder 4103 to obtain the sensitivity of Z, Zsensitivities. The components of both Z and Zsensitivities are computed one at a time and are then fed to a bit elimination and packing subsystem 601. All of these operations are done in fast low hierarchy memory, typically registers of the computer system. Once a full memory word or a group of memory words has been packed in reduced length format it can be sent to local RAM memory (e.g., memory 302) for storing of results. It should be apparent to someone skilled in the art that using methods or systems similar in spirit to those depicted in FIG. 41 would allow all vector data to be resident in RAM memory in shorter (packed) formats and thus resulting in savings of memory space, potential savings of power consumption, and potential speedups for the computations by virtue of the reduction in the total number of bits to be transferred from/to local RAM memory to/from the processor unit of the computer system. In a computer device 101, transfer of data in X_Compressed, Y_Compressed, and Z_Compressed between different memory hierarchies may be handled automatically by components in a processor 301 and/or operating system 303.

Figure 42:
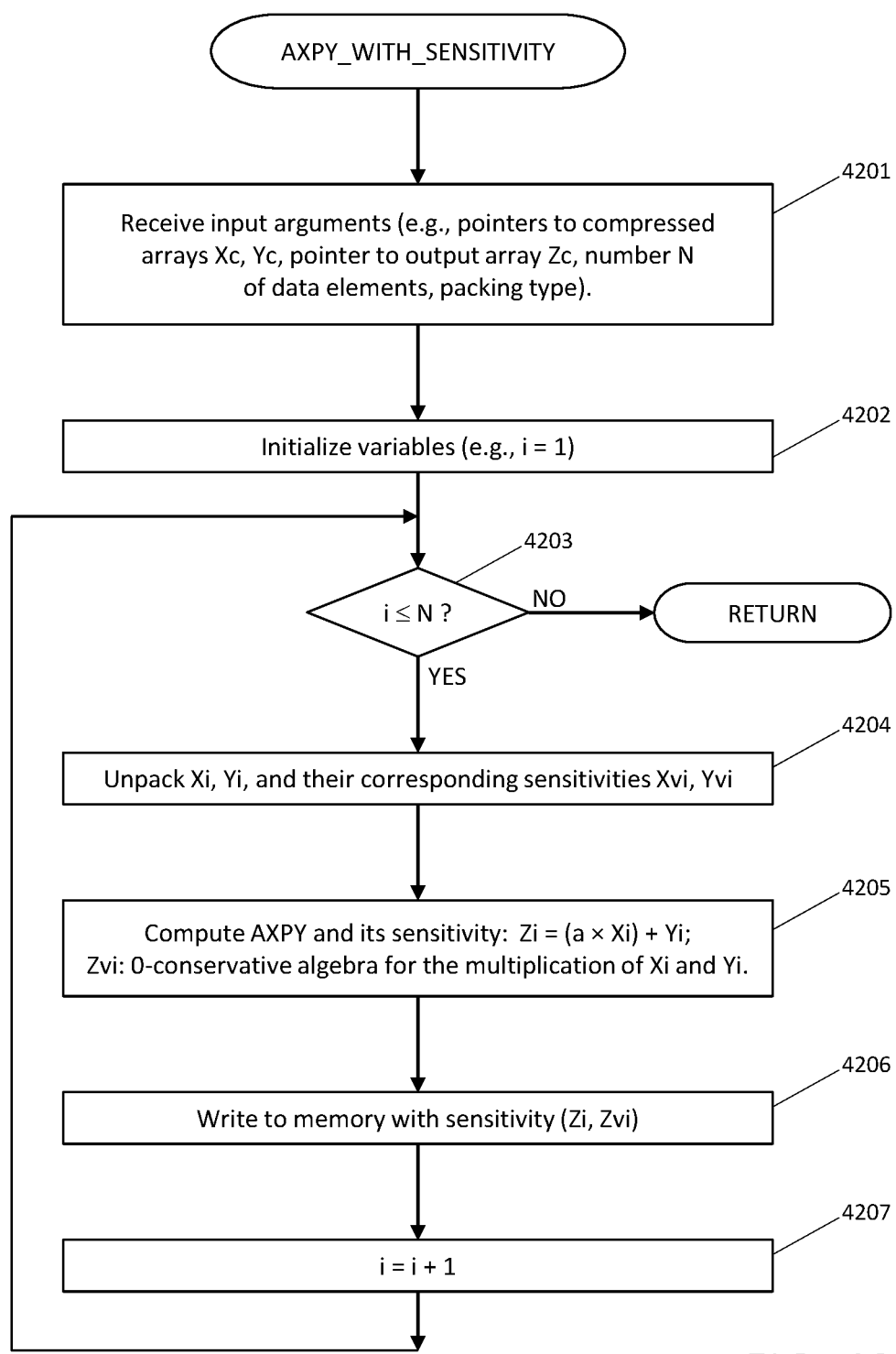

FIG. 42 illustrates an exemplary embodiment for the computation of an AXPY operation using data that has been packed using sensitivity information, and storing the result into an array packed using sensitivity information. The embodiment of FIG. 42, which is called "AXPY_WITH_SENSITIVITY" starts by reading input arguments in 4201. Examples of input arguments are pointers to input arrays of compressed data $X_c$, $Y_c$, pointer to an array of compressed data $Z_c$ that will contain the result of the AXPY operation, an integer N indicating the number of elements in the input arrays, the type of data elements (e.g., floating point, integer, fixed point), and type of packing, among others. Then, some variables or signals may be initialized in 4202. For example, an index i to an element of the arrays $X_c$, $Y_c$, and $Z_c$ could be set to 1. Then, this index i may be compared with the size of the arrays N in 4203, in such a way that if i>N then AXPY_WITH_SENSITIVITY returns, otherwise the embodiment continues with element 4204. In 4204, elements $X_i$ and $Y_1$ as well as their corresponding sensitivities $X_{vi}$ and $Y_{vi}$ are unpacked from $X_c$ and $Y_c$. Then, in 4205, the AXPY operation corresponding to the elements i is executed, i.e., the operation $Z_i=a*X_i+Y_i$ is executed. The sensitivity of the result may also be computed using, for example, the 0-conservative sensitivity algebra. Then, in 4206, the result $Z_i$ may be packed and stored into memory using the sensitivity information indicated by $Z_{vi}$. Finally, the index i is updated in 4207, and the condition 4203 is evaluated to assess if AXPY_WITH_SENSITIVITY continues or returns.

Figure 44:
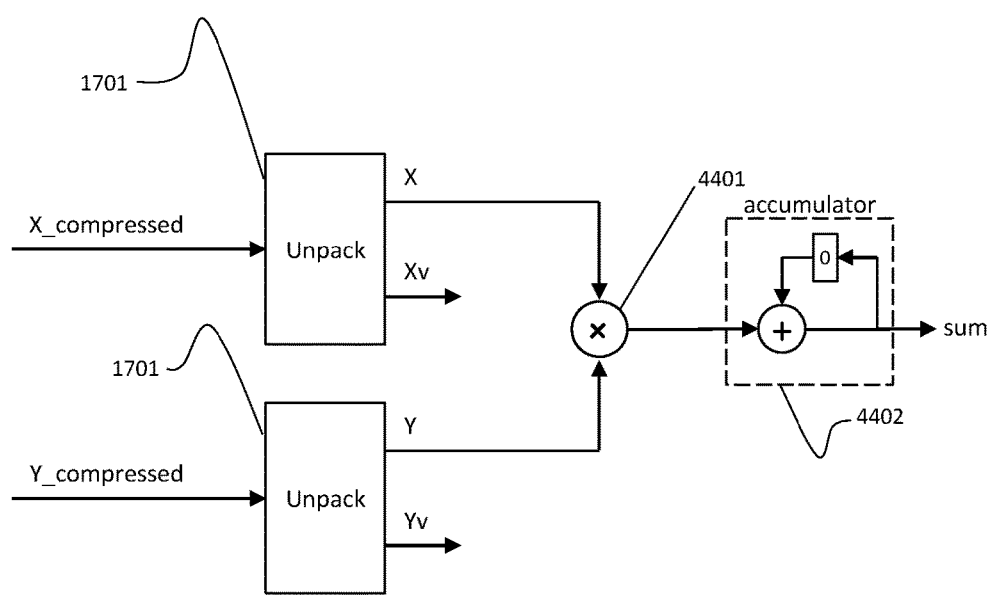

FIG. 43 shows an exemplary embodiment described in the C programming language, and that could be compiled and executed in a computer device 101. The embodiment in FIG. 43 is a function called "AxpyWithSensitivity", and receives a number of parameters: a double precision floating point scalar a; pointers to arrays of 64-bit integers containing the inputs X_Compressed, Y_Compressed, and the output Z_Compressed; an unsigned integer N indicating the size of the arrays X, Y, and Z; an integer indicating the type of packing that should be used for read/write of data in/to memory; and an integer number BlockSize that indicates the size of each batch of elements of X, Y, and Z that must be processed with each combination of memory read/write operations. Memory allocation of arrays may be done prior to calling this function to reduce the execution time of the function. The function AxpyWithSensitivity calls the functions ReadFromMemoryWithSensitivity and WriteToMemoryWithSensitivity described above. The function AxpyWithSenstivity could be further optimized for faster execution. One skilled in the art should notice that the function AxpyWithSenstivity could be defined using other programming languages, instructions, encodings, data types, etc., while maintaining the spirit of the invention FIG. 44 shows an exemplary embodiment for a dot product operator that uses sensitivity information. A dot product operator computes a scalar sum=$\Sigma_i x_i \times y_i$, where i=1, 2, ..., N, and $x_i$ and $y_i$ are elements of vectors X and Y, respectively. In the exemplary embodiment, the components of vectors X and Y are packed along with each component's sensitivity in the local RAM memory of a computer system 101. Unpack systems 4101 unpack the data and output X and Y, as well as their corresponding sensitivities Xv and Yv, component by component. Then each pair of elements $x_1$ and $y_1$ is multiplied using a multiplier 4401, and added using an accumulator 4402 that is initialized in 0. After reading all the N elements of X and Y, the output sum of the accumulator 4402 contains the result of the dot product. It should be apparent to someone skilled in the art that using methods or systems similar in spirit to those depicted in FIG. 44 would allow all vector data to be resident in RAM memory in shorter (packed) formats and thus resulting in savings of memory space, potential savings of power consumption, and potential speedups for the computations by virtue of the reduction in the total number of bits to be transferred from/to local RAM memory to/from the processor unit of the computer system.

Figure 45:
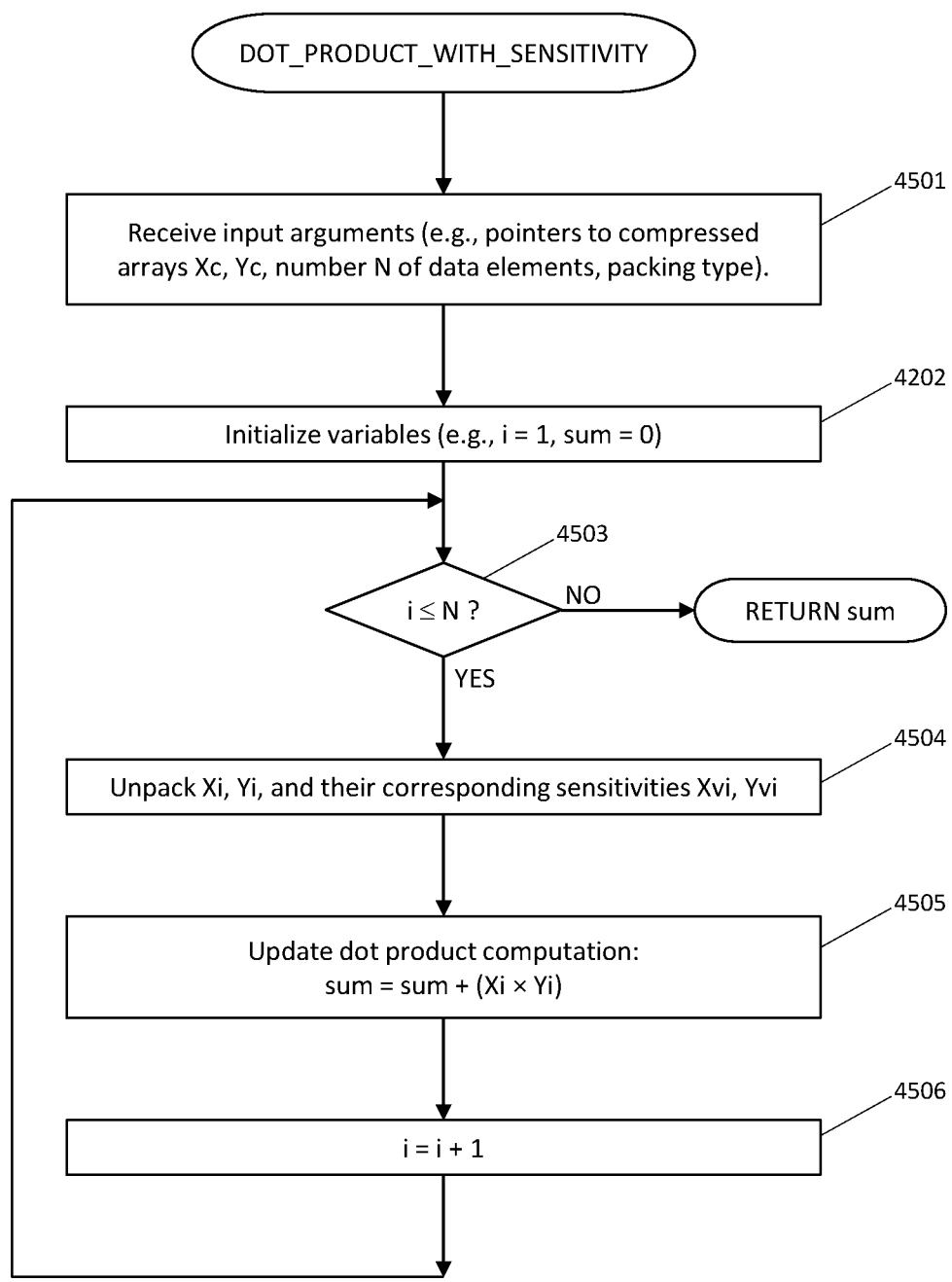

FIG. 45 illustrates an exemplary embodiment for the computation of a dot product operation using data that has been packed using sensitivity information. The embodiment of FIG. 45, which is called "DOT_PRODUCT_WITH_SENSITIVITY" starts by reading input arguments in 4501. Examples of input arguments are pointers to input arrays of compressed data $X_c$, $Y_c$, the number N of elements in the input arrays, and type of packing, among others. Then, some variables or signals may be initialized in 4502. For example, an index i to an element of the arrays $X_c$, and $Y_c$ could be set to 1, and the result "sum" of an accumulator could be set to 0. Then, the index i may be compared with N, the size of the arrays, in 4503, in such a way that if i>N then DOT_PRODUCT_WITH_SENSITIVITY returns the value of "sum", otherwise the embodiment continues with element 4504. In 4504, elements $X_i$ and $Y_1$ as well as their corresponding sensitivities $X_{vi}$ and $Y_{vi}$ are unpacked from $X_c$ and $Y_c$. Then, in 4505, the update of the dot product operation corresponding to the elements i is executed, i.e., the operation sum=sum+$(X_i*Y_i)$ is executed. Finally, the index i is updated in 4506, and the condition 4503 is evaluated to assess if DOT_PRODUCT_WITH_SENSITIVITY continues or returns.

FIG. 46 shows an exemplary embodiment described in the C programming language, and that could be compiled and executed in a computer device 101. The embodiment in FIG. 46 is a function called "DotProductWithSensitivity", and receives a number of parameters: pointers to arrays of 64-bit integers containing the inputs X_Compressed, Y_Compressed; an unsigned integer N indicating the size of the arrays X and Y; an integer indicating the type of packing that should be used for read/write of data in/to memory; and an integer number BlockSize that indicates the size of each batch of elements of X and Y that must be processed with each combination of memory read/write operations. The function DotProductWithSensitivity calls the functions ReadFromMemoryWithSensitivity and WriteToMemoryWithSensitivity described above. The function DotProductWithSenstivity could be further optimized for faster execution. One skilled in the art should notice that the function WriteToMemoryWithSensitivity could be defined using other programming languages, instructions, encodings, data types, etc., while maintaining the spirit of the invention.

Bit-Garbage Analysis for Distributed Applications

According to an aspect of the present invention, the operations inside numerical algorithms may be done using the sensitivity parameter. An exemplary scenario is in the execution of distributed algorithms, where using the sensitivity information may reduce the number of bits transferred between computer devices.

Figure 47:
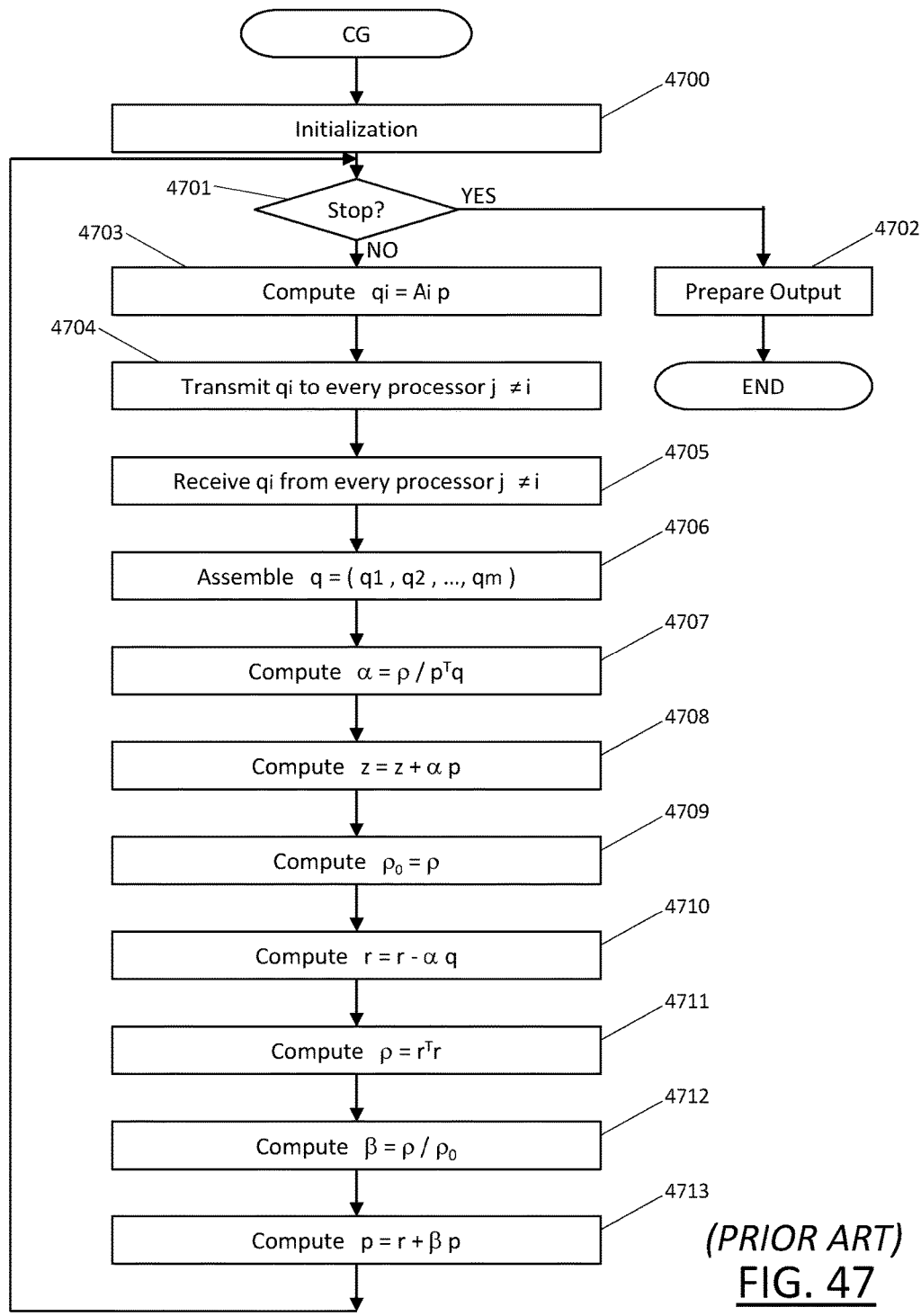
FIG. 47 is a flow diagram that shows an example CG algorithm.
Figure 48:
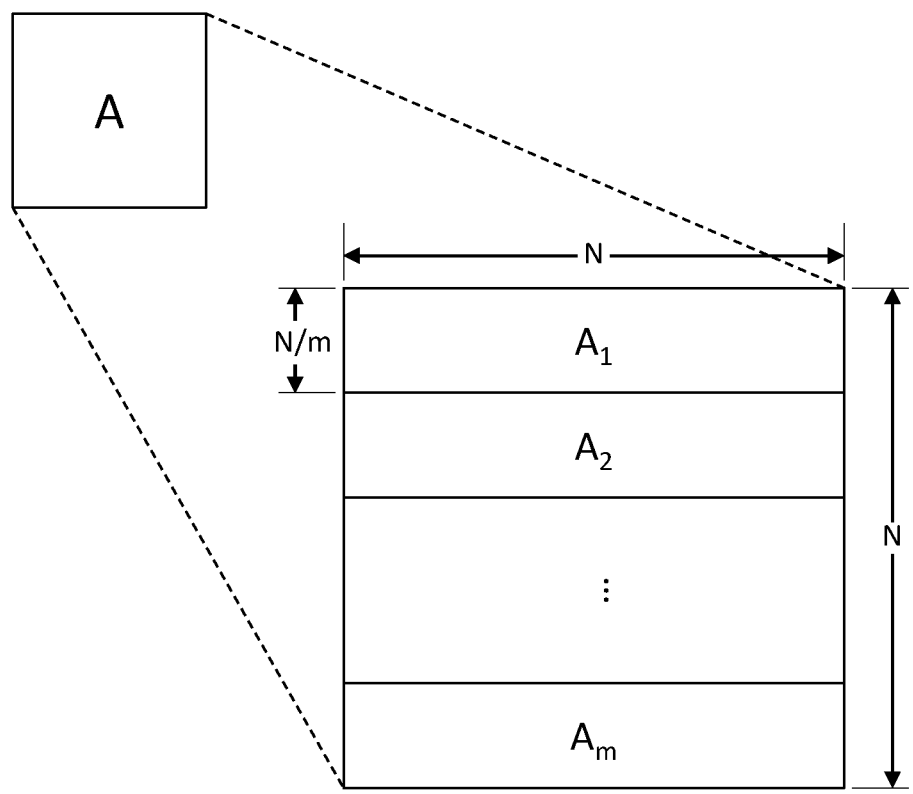
FIG. 48 illustrates an example of data partition for a distributed algorithm.

An exemplary embodiment uses sensitivity tracking for reducing the network communication data movement during the execution of a distributed Conjugate Gradient algorithm (CG), which is a well-known numerical algorithm in the High Performance Computing (HPC) community for finding a vector z that solves the matrix equation Az=b. An implementation using CG may be combined with the preconditioners for faster computations. FIG. 47 shows the typical main steps in a simple distributed CG algorithm. If there are m distributed processing units, different pieces of the CG computations are executed by each processing unit i, i=1, 2, ..., m. In an embodiment, the problem matrix A of size N×N is partitioned into row stripes, as shown in FIG. 48. This is, the problem matrix is partitioned into an array of m submatrices of size (N/m)×N. If the remainder of N/m is not zero, A is partitioned into m−1 first submatrices of length ⌊N/m⌋×N, and one last submatrix of length (N−(m−1)×⌊N/m⌋)×N. The matrix A may be partitioned in other ways, and may be stored in any format such as dense or sparse. Item 4700 initializes the variables of the CG algorithm, and sets the so-called residual vector r to r=b, the "rho" scalar to $\rho=r^T r$, the result vector z to z=0 (i.e., each element of the vector z is set to 0), and the so-called direction vector p to p=r. Subsequently, a series of steps are repeated until a stop condition 4701 is satisfied. The stop condition may be defined by the user to any formulation that the user deems convenient. A stop condition commonly used is, for example, when the L2 norm of the residual vector r is less than a predetermined small value called "tolerance" which is set by the user. These steps that are repeated include, in 4703, a matrix-vector multiplication that multipliers, for each processor i, its corresponding row stripe submatrix $A_i$ times the vector p to produce a resulting subvector $q_i$. In 4704, each processor (i.e., computer device) transmits its vector $q_i$ to every other processor in the distributed computing system. In 4705 every processing unit i receives subvectors $q_j$, j≠i, from every other processing unit. Subsequently, in 4706, the full vector q is assembled as the concatenation $\{q_1, q_2, \ldots, q_m\}$ of the subvectors $q_i$. Items 4707 to 4713 include operations that may be executed locally at each of the processing units (e.g., computer devices), completing the usual operations of the CG. At the point in time when the stop condition 4701 is satisfied, the vector z contains the solution to the linear system of equations; then, the output is prepared at step 4702, and then the CG ends.

Figure 49:
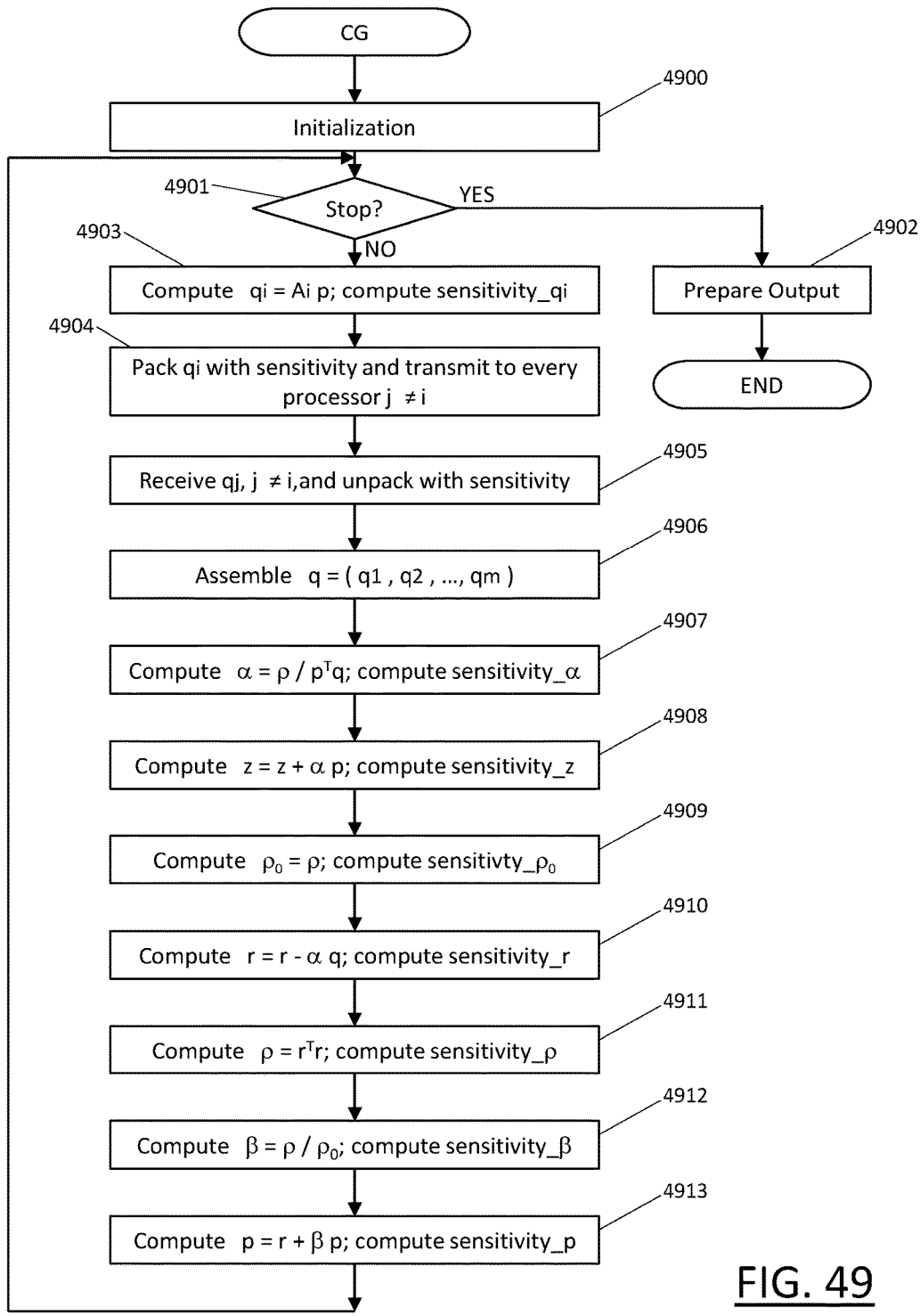
FIGS. 49-51 illustrate example embodiments of the present invention.

FIG. 49 shows an exemplary embodiment of a CG that implements sensitivity tracking for every variable and every operation in the algorithm. Sensitivities in this exemplary embodiment are computed for every scalar and for every scalar component of each vector using the 0-conservative algebra defined above. The initialization in 4900 includes the same operations as in 4700, but also initializes the sensitivity of each initialized variable to a default Vmax. Also in item 4700, sensitivities $V_{Aij}$ are assigned to all existing scalar components $a_{ij}$ of the matrix A. Through a user interface or during the implementation of an embodiment, the user has the option of indicating which values of $V_{Aij}$ to assign, or by default if the user doesn't assign any value, all the sensitivities are set to the default Vmax. Subsequently, if a stop condition 4901 (similar to 4701) is satisfied, the algorithm prepares the output in 4702 and ends; otherwise, the algorithm continues with a set of operations. In 4903, the subvectors $q_1$ are computed as in 4703. However, 4903 also includes a computation of the sensitivities of the scalar components of each of the $q_i$'s. For the vector $q_i$ we denote the vector with the sensitivities of each component of $q_i$ as sensitivity_$q_i$. These sensitivities may be directly computed from the addition and multiplication rules defined in the 0-conservative algebra. Note that $q_i$ is computed using only additions and multiplications that use components of the matrix A and of the vector p, all of which already have sensitivity values defined. In 4904, processor i, i=1, 2, . . . , m packs the vector $q_i$ using sensitivity_$q_i$, and transmits the packed stream (which potentially will have a reduced bit length) to every other processor j≠i, j=1, 2, . . . , m. This sensitivity-based packing may be performed using any of the methods and systems described in previous sections of this document or alternatively, by any other means that may be available to someone skilled in the art. The resulting potential reduction in message length for the transmission of the vectors $q_i$ may reduce the total traffic in the network, which in turn may result in a speedup of the CG or in savings of power consumption, or both. In 4905, data $q_j$ from all of the other processors is received and unpacked with sensitivity by each processor, recovering not only each of the $q_j$'s, but also the sensitivities of every component in the vectors $q_j$. Items 4906 to 4913 execute operations in the algorithm, similar to items 4906 to 4913 in the original CG, with the difference that these steps compute, not only the original CG data, but also the sensitivities associated with every single scalar and scalar component of the data.

Another exemplary embodiment for the CG is similar to the one described by FIG. 49, with the difference that sensitivity computations may be enabled selectively for certain particular steps. For example, an embodiment may perform sensitivity computations only for items 4907 and 4903, and ignore all sensitivity computations in all other items/variables by defaulting all those sensitivities to Vmax.

Figure 50:
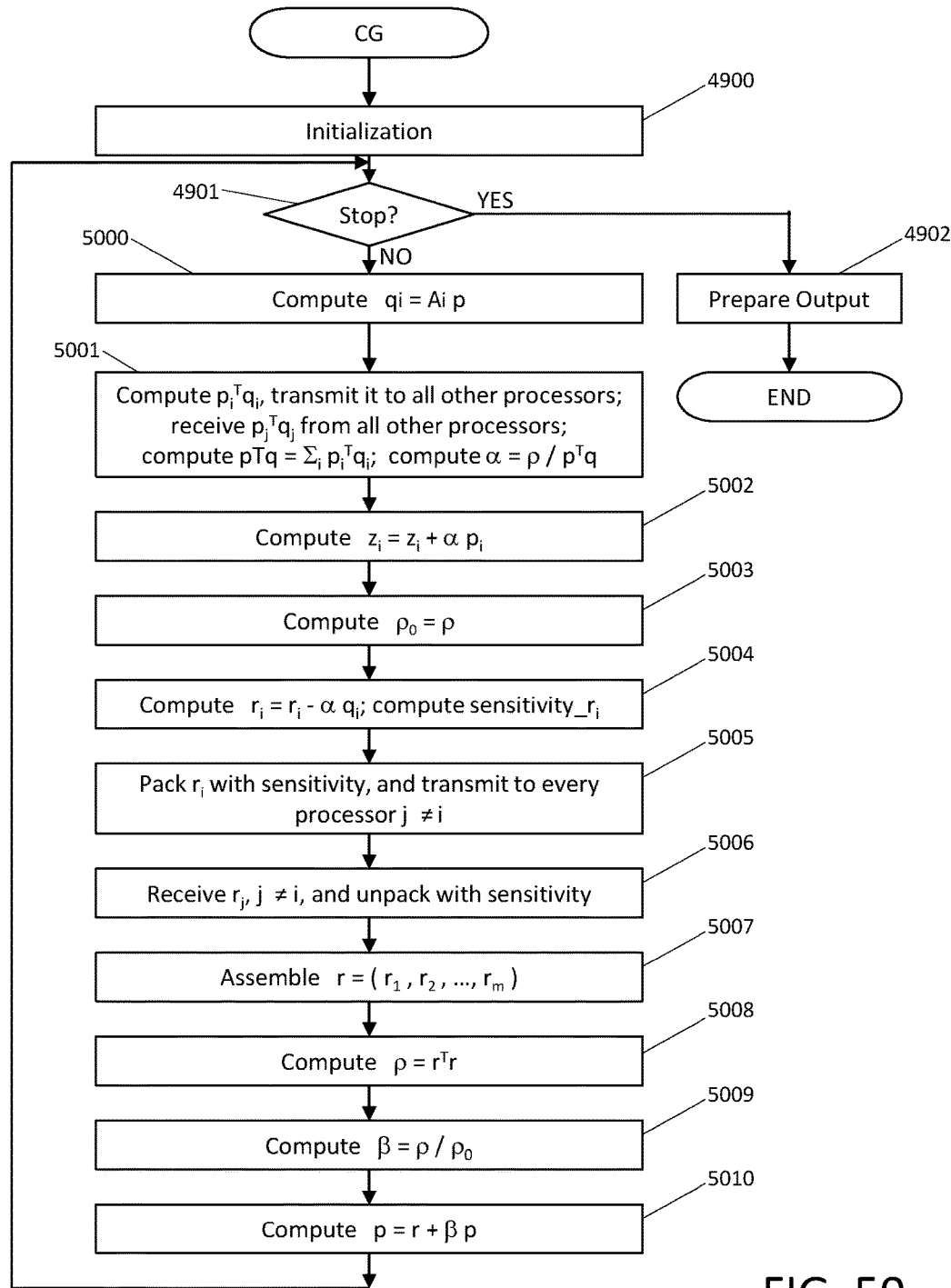

According to an aspect of the invention, a distributed algorithm may be reformulated to transmit alternative data (e.g., variables) whose sensitivities could be smaller than the sensitivities of the sensitivities of the data transmitted by a basic/original algorithm. By transmitting data with smaller sensitivities, the number of bits transferred between computer devices may be further reduced. For example, the CG embodiments of FIGS. 47 and 49 may be reformulated to transmit data corresponding to variables other than q. FIG. 50 illustrates an exemplary embodiment of a CG where data other than q is transmitted. Here, the method selectively computes sensitivities only for the components of the residual vector r. All other steps in the algorithm ignore sensitivity computation, or equivalently, sensitivities may be set to the default Vmax. Also, the transmission of the subvectors $q_i$ is not performed. Instead, $p^T q$ is performed via a reduction $p^T q = \Sigma p_i^T q_i$ (the subvector $p_i$ is made of the components of p that correspond to the row stripe of the matrix A which is assigned to processor i; the subvectors $r_i$, described in 5003, follow a similar definition, but this time they are subvectors of the residual vector r). In 5003 each processor computes its corresponding subvector $r_i$, along with the sensitivities vector sensitivity_$r_i$. Subsequently, in step 5004, each processor packs its $r_1$ with sensitivity and proceeds to transmit to every other processor. Note that in this exemplary embodiment, the transmission of the subvectors $q_i$ is avoided by computing $p^T q$ through a reduction in step 5001, so that computation step 5003 can use alpha to compute the subvectors $r_i$ along with its sensitivities. In this way the needed transmission of vector information can be done with the $r_i$ subvectors, which may produce smaller values of sensitivities (or equivalently higher reductions in transmitted message length).

Figure 51:
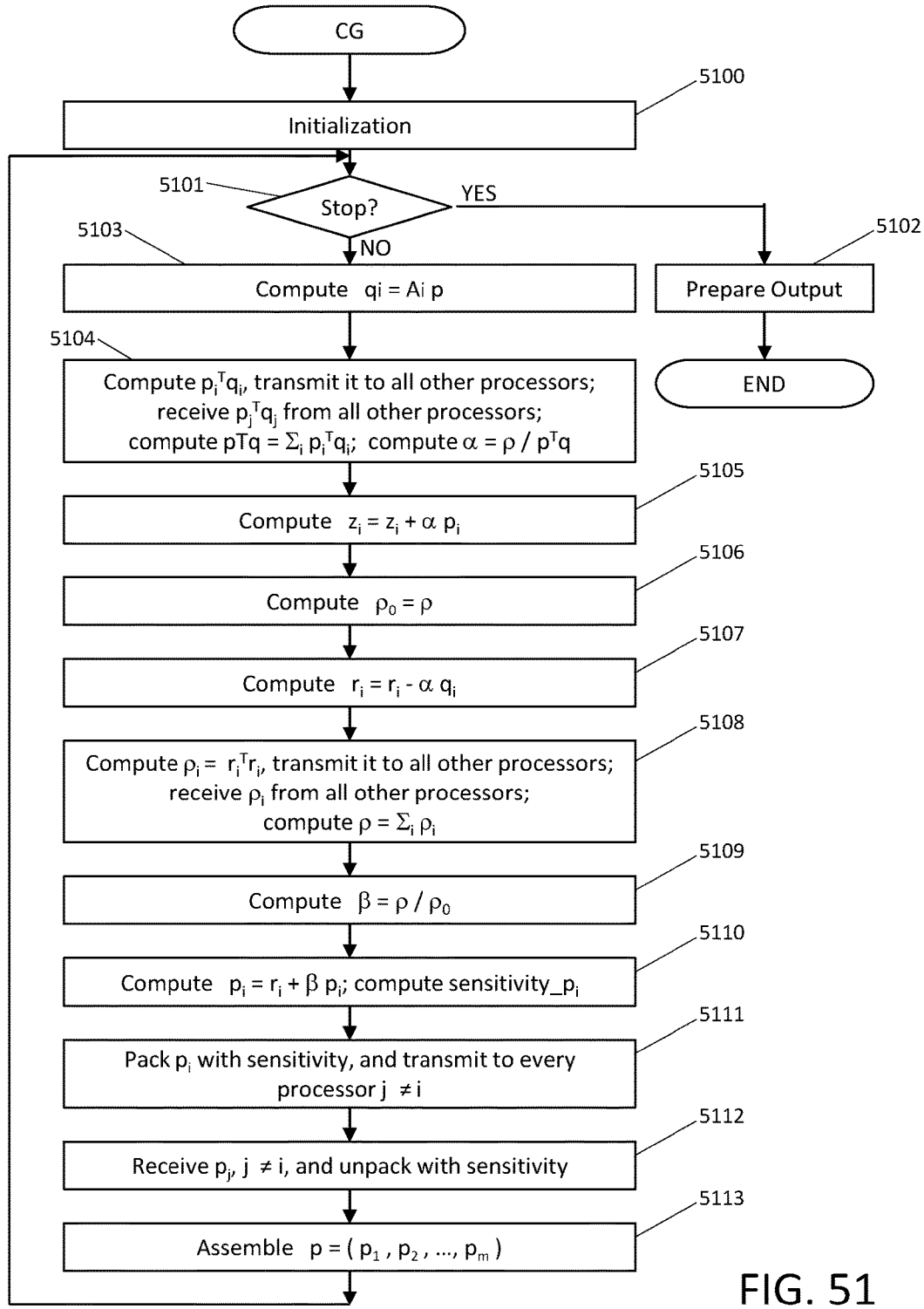

FIG. 51 illustrates an embodiment where the CG may be formulated holding the transmission of subvectors until the subvectors $p_i$ are computed, by means of computing rho again through a reduction operation. The initialization 5100 includes the same operations as in 4700, as well as any other initialization of sensitivities, as in 4900. Then, similar to 4701, the evaluation of a stop condition 5101 determines that, if satisfied, the CG prepares the output in 5102 and returns; otherwise, the CG continues to 5103, where the partial vectors $q_i = A_i p$ are computed in each processing unit (e.g., computer device) i=1, 2, . . . , m. Then, in 5104, the value of alpha is computed through a reduction, similar to the way it is done in 5001. Computations of $z_i$, $\rho_o$, and $r_i$, follow in 5105, 5106, 5107, respectively. In 5108, the value of rho (i.e., r) is computed through a reduction operation, in which each processing unit computes a partial addends ri, transmits it to every other processor in the distributed system, and computes $\rho = \Sigma \rho_i$, i=1, 2, . . . , m, after receiving $p_i$ from every other processor in the distributed system. Then, the CG continues to 5109, where the value of beta is computed. Then the computation of subvectors $p_i$ and their corresponding sensitivities are obtained in 5110. In 5111, the elements of each subvector pi are packed using sensitivity information, and transmitted to every other processor. In 5112, the packed elements of pi are received and unpacked, obtaining both the subvectors pi for every processor j≠i, i, j, =1, 2, . . . , m, as well as their corresponding sensitivities. These subvectors $p_i$ are then assembled into a single vector p in 5113, before going back to evaluate the stop condition 5101 again. It should be apparent to someone skilled in the art that this technique of holding transmission to transmit a different set of subvectors which may have potentially more convenient sensitivity values, can be generalized to any kind of iterative or not iterative algorithm or application. We may refer to an implementation that delays the transmission of data in a distributed algorithm by N operations as an "N-step lazy" implementation. For example, for the CG algorithm, the embodiment in FIG. 50 is a 1-step lazy implementation, and the embodiment in FIG. 51 is a 2-step lazy implementation.

Figure 52:
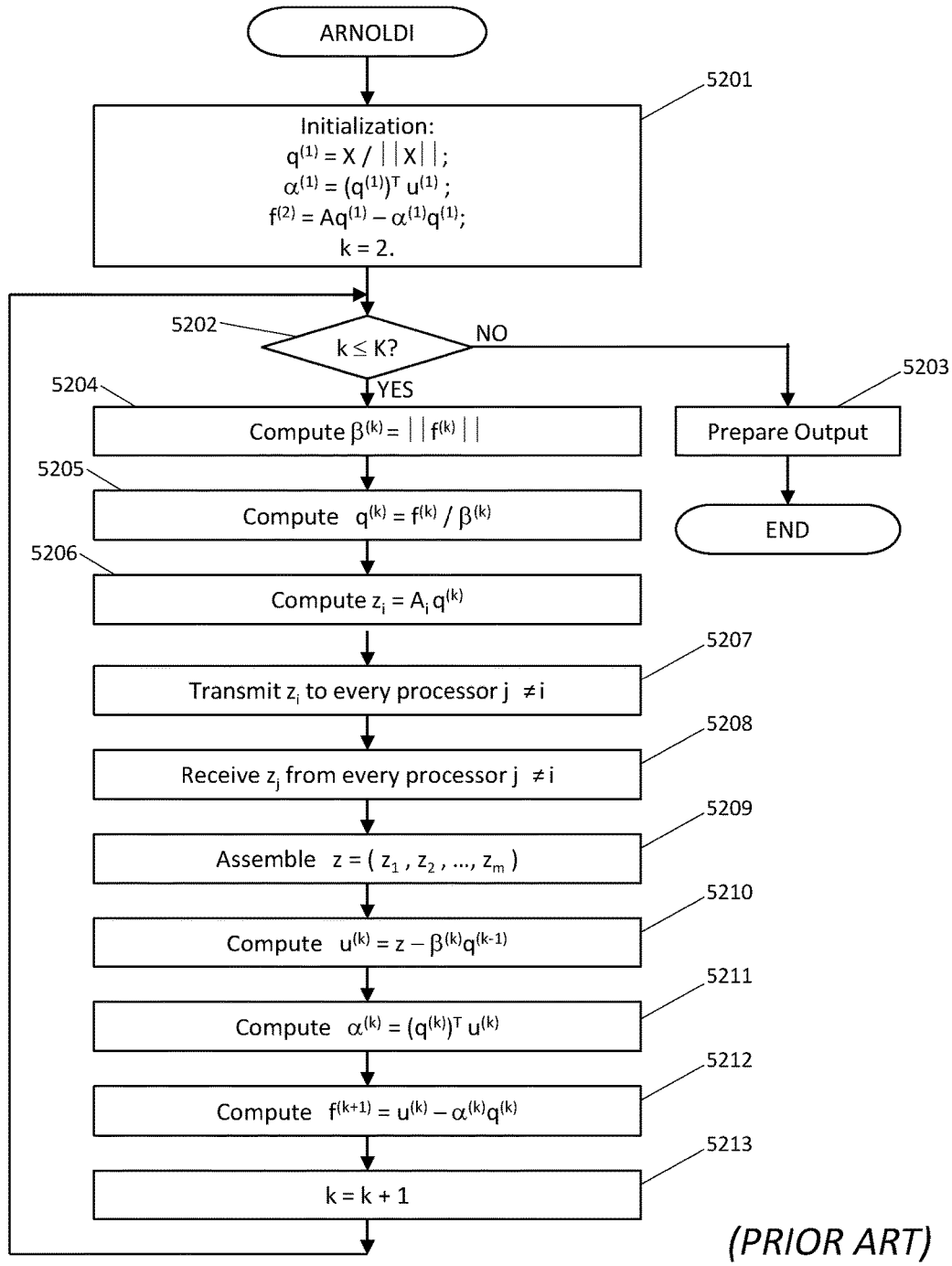
FIG. 52 is a flow diagram that shows an example Arnoldi algorithm.

As another example of sensitivity-enabled distributed algorithms consider the Arnoldi algorithm for the computation of an orthonormal basis of a Krylov space, commonly referred to simply as the Arnoldi algorithm. The Arnoldi algorithm is one of the core components of in many numerical methods, including Lanczos eigensolvers, Arnoldi eigensolvers, and the generalized minimum residual method (GMRES) linear equation solver, among others. The Arnoldi algorithm renders a sequence of orthonormal vectors $\{q^{(1)}, q^{(2)}, q^{(3)}, \ldots\}$ spanning the Krylov subspace related to an invertible matrix A and a vector x. FIG. 52 illustrates the main components of the K-step Arnoldi algorithm for distributed systems, which computes the first K orthonormal vectors of the Krylov subspace. An initialization of the algorithm occurs in 5201, where the first vector $q^{(1)}$ is set to x/∥x∥, i.e., the normalized values of the vector x. Also, initial values for internal variables $\alpha^{(1)}$ and $f^{(2)}$ are computed in 5201, and an index value k is set to 2. A stop condition is evaluated in 5202, where the value of k is compared to the desired number of orthonormal vectors K. If k>K, then the Arnoldi algorithm prepares the output in 5203 and returns; otherwise the algorithm continues to 5204. Operations in 5204 and 5205 compute the values of scalar $\beta^{(k)}$ and vector $q^{(k)}$, respectively. In 5206 the Arnoldi algorithm computes a matrix vector multiplication, which is typically the most time-consuming operation in the algorithm (hence the final result z, at which the algorithm arrives in 5209 is split among m processors). Assuming a matrix partitioning as shown in FIG. 48, in a form similar to that described for the CG embodiments of FIGS. 47, 49, 50, and 51 above, a subvector $z_i$ is computed in $z_i$. This subvector $z_i$ is obtained as the multiplication of the submatrix $A_i$ stored at processor i, i=1, 2, . . . , m, times its corresponding the basis vector $q^{(k)}$. Then, in 5207, the subvector $z_i$ is transmitted to every other processor j≠i, j=1, 2, . . . , m. In 5208, subvectors $z_j$, j=i, are received from every other processor in the distributed system. Then, the full vector z is assembled in 5209 in such a way that $z=(z_1, z_2, \ldots, z_m)$. This is followed by computations of $u^{(k)}$, $a^{(k)}$ and the unnormalized vector $f^{(k+1)}$ in 5210, 5211, and 5212, respectively. Finally, in 5253 the index k is incremented, and the algorithm goes back to evaluate the stop condition 5202.

Figure 53:
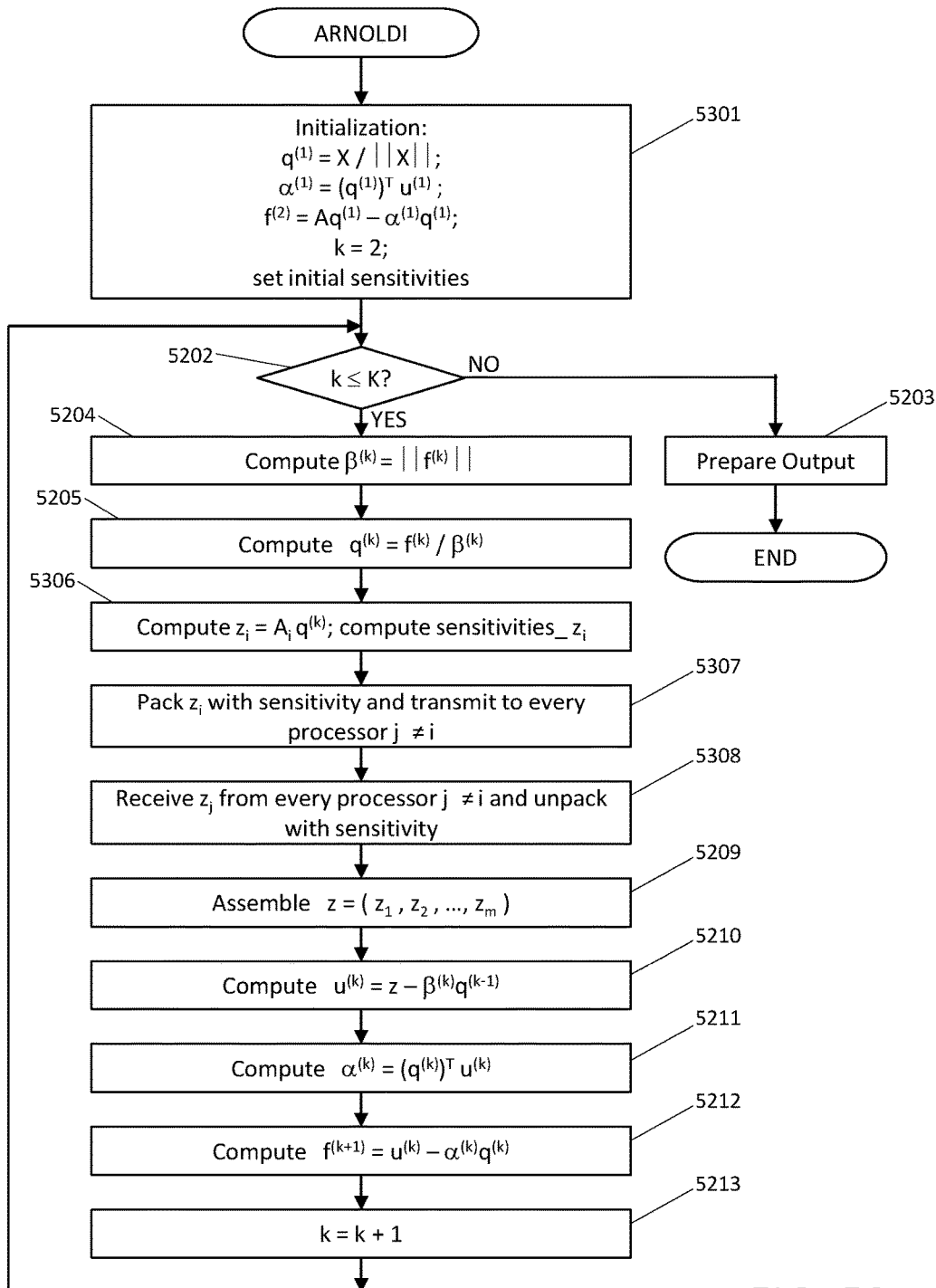
FIGS. 53-54 illustrate example embodiments of the present invention.

FIG. 53 shows an exemplary embodiment where sensitivity information is used in the distributed Arnoldi algorithm for reducing the number of bits to be transferred between computer devices in a distributed system. The initialization of this embodiment occurs in 5301, where in addition to the operations executed in 5201, the sensitivities of numbers in the algorithm are set to a default Vmax. In particular, given that subvectors $z_i$ are transmitted in the distributed Arnoldi algorithm of FIG. 53, we are interested in setting the sensitivity of each element of $z_i$ to a default Vmax (e.g., Vmax=52 in double precision floating point numbers). Then, the stop condition 5202 is evaluated, so to determine if the Arnoldi algorithm should prepare the output (in 5203) and return, or continue with items 5204 and 5205. After the vector q(k) is computed in 5205, the Arnoldi algorithm computes the subvectors $z_1$ as in the embodiment of FIG. 52 in 5306, as well as its corresponding vector of sensitivities Sensitivities_Zi. Then, in 5307, the elements of $z_i$ are packed with the sensitivity information given by Sensitivities_Zi, and transmitted to every other processor j≠i, j=1, 2, . . . , m. It follows 5308, where subvectors $z_j$ are received from every other processor in the distributed system, and unpacked using sensitivity information. Then, as in the embodiment in FIG. 52, the vector z is assembled in 5209, and $u^{(k)}$, $\alpha^{(k)}$, and $f^{(k+1)}$ are computed in 5210, 5211, and 5212, respectively. Finally, the value of k is incremented in 5213, and the algorithm goes back to evaluate the stop condition 5202.

Figure 54:
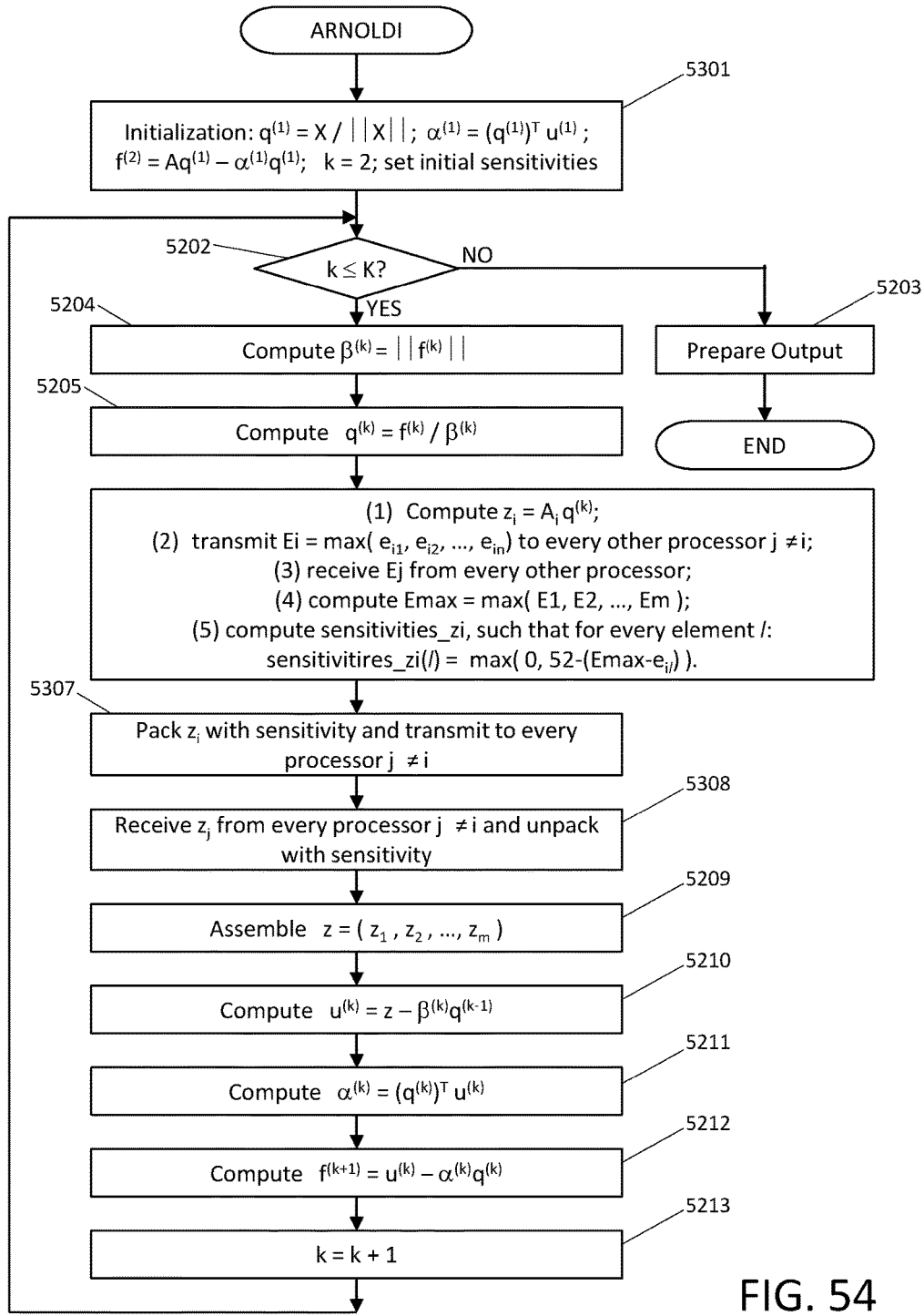

Note that the sensitivities of elements in $z_i$ in the Arnoldi algorithm may be computed with any of the above described algebras. FIG. 54 shows an embodiment in which these sensitivities are computed using backward sensitivity. Most of the components of the embodiment of FIG. 54 are the same than those of FIG. 53. The only difference is in 5306, which is replaced by item 5406 in FIG. 54. As in 5306, component 5406 computes the subvector $z_i$ and its corresponding vector of sensitivities Sensitivities_Zi. The computation of this vector of sensitivities is defined to implement backward sensitivity analysis. As with the CG, it should be apparent to someone skilled in the art the Arnoldi algorithm may be also modified for holding transmission to transmit a different set of subvectors which may have potentially more convenient sensitivity values.

It is to be understood that all of the embodiments described in this document are merely illustrative of numerous and varied other embodiments which may constitute applications of the principles of the invention. Such other embodiments may be readily devised by those skilled in the art without departing from the spirit or scope of this invention and it is our intent they be deemed within the scope of our invention.

What is claimed is:

1. A rule-based method for speeding inter-processor communication in a computer system having a plurality of processors, wherein each of at least two processors of the plurality of processors has an associated local memory portion, the method comprising the steps of:

performing an operation with two operands in a first of the at least two processors to determine an initial result of the operation, each of the operands being associated with a respective sensitivity value, wherein each sensitivity value indicates a number of bits of at least a portion of each associated operand that are not garbage bits, and wherein the initial result is computed by the first processor in its usual manner for the operation and without regard to the sensitivity value of either of the operands;

performing a secondary operation by the first processor according to a prescribed set of rules based on the sensitivity value of each of the operands to determine a sensitivity value for a final result;

developing by the first processor the final result as a function of the initial result and the determined sensitivity value for the final result wherein at least one garbage bit of the initial result is effectively eliminated from the final result;

storing a representation of the final result in association with its sensitivity value in the local memory portion of the first processor; and making available a version of the final result in association with its sensitivity value for storage in at least the local memory portion of a second of the at least two processors.

2. The invention of claim 1, wherein the step of making available further comprises the step of transmitting the available representation of the final result in association with its sensitivity value from the local memory portion of the first processor toward at least the local memory portion of the second processor.

3. The invention of claim 1, wherein the first and second processors are substantially collocated.

4. The invention of claim 1, wherein the first and second processors are remotely distributed.

5. The invention of claim 1, wherein the local memory portion of each of the first and second processors are portions of a shared memory accessible to both the first and second processors.

6. The invention of claim 1, wherein a portion of each of the local memory portions of each of the first and second processors of the computer system is a common portion of a memory that is accessible to both the first and second processors.

7. The invention of claim 1, wherein the developing step further comprises:

compressing the final result into a compressed format; and wherein, in the making available step, the final result is made available in its compressed format.

8. The invention of claim 1, wherein the developing step further comprises:

compressing the final result and its determined sensitivity value into a compressed format; and wherein, in the making available step, the final result and the sensitivity value for the final result are made available in their the compressed format.

9. The invention of claim 1, wherein the developing step further comprises:

compressing the final result and its determined sensitivity value into a compressed format; and wherein, in the storing step, the final result and the sensitivity value for the final result are stored in their the compressed format.

10. The invention of claim 1, wherein the initial result is in a floating point representation such that it comprises a sign bit, an exponent having at least one exponent bit, and a mantissa having at least one mantissa bit, and wherein the sensitivity value of the final result indicates how many most significant bits of the mantissa of the initial result are not garbage bits, and wherein the developing step further comprises:

compressing a portion of the mantissa of the initial result that does not correspond to garbage bits as indicated by the sensitivity value of the final result;

taking the sign bit of the initial result as the sign bit of the final result;

taking the exponent of the initial result as an exponent of the final result;

packing the compressed portion of the mantissa along with a representation of the sign bit of the final result, and a representation of the exponent of the final result as the final result.

11. The invention of claim 10, further wherein the representation of at least one of the group consisting of: the sign bit of the final result, the exponent of the final result, and the sensitivity value of the final result is in a compressed format.

12. The invention of claim 10, further wherein the representation of values of at least one of the group consisting of: the sign bit of the final result, the exponent bits of the final result, and the sensitivity value of the final result are in a compressed format, the compression making use of prediction from prior like values.

13. The invention of claim 1, wherein the operands, the initial result, and the final result are represented in a format having an exponent and a mantissa.

14. The invention of claim 1, wherein the operands are represented in a format having an exponent and a mantissa and wherein the sensitivity value of the final result is further based on the values of the exponents of the operands.

15. The invention of claim 1, wherein each operand is in a floating point representation such that each operand comprises a sign bit, at least one exponent bit, and a mantissa including at least one mantissa bit, and wherein each sensitivity value indicates how many most significant bits of the mantissa of its associated respective value are not garbage bits.

16. The invention of claim 1, wherein the determining of the sensitivity value of the final result is further based on at least one of the group consisting of: the operation performed with the two operands and a purpose for which the final result will be used.

17. The invention of claim 1, wherein by effectively eliminated it is meant that no representation of the at least one garbage bit is included in the final result.

18. The invention of claim 1, wherein by effectively eliminated it is meant that the value of the at least one garbage bit is set to zero.

19. The invention of claim 1, wherein the sensitivity value of the final result is determined using one of the group consisting of: a 0-conservative algebra; an N-conservative, algebra, where N is a positive integer number; an N-aggressive algebra, where N is an integer number; a 0-conservative backward sensitivity; a windowed 0-conservative backward sensitivity; and a progressive 0-conservative backward sensitivity.

20. The invention of claim 1, wherein the method is repeated for additional groups of operands such that each final result is represented as it is being transmitted from the first processor to the second processor using a massively asymmetric precision data representation.

21. The invention of claim 1, wherein the computer system further includes at least a third processor having an associated local memory and wherein the method further comprises making available the final result in association with its sensitivity value by the first processor to the third processor.

22. The invention of claim 1, wherein the processors of the computer system are working cooperatively to solve a single overall problem.

23. The invention of claim 1, wherein at least one of the operands is derived from at least one sensor that obtains real-world readings in a digital format having a prescribed number of bits of precision, the precision of the sensor readings being less than the number of bits used to represent the readings as obtained from the at least one sensor such that each sensor reading has at least one garbage bit.

24. A rule-based method for reducing the data to be transferred during inter processor communication in a computer system having at least two processors where the computer system is processing values derived from at least one sensor that obtained real-world readings in a digital format having a prescribed number of bits of precision, the precision of each reading being less than can be represented by a number of bits used to represent the reading obtained from the at least one sensor such that each sensor reading has at least one garbage bit, the method comprising:

assigning a sensitivity value to each reading, wherein a sensitivity value indicates a number of one or more bits of at least a portion of each associated value that are not garbage bits, performing an operation with two operands, wherein a value derived from one of the sensor readings is at least one operand of the operation, to determine an initial result of the operation, each of the operands being associated with a sensitivity value, and wherein the initial result is computed without regard to the sensitivity value of either of the operands;

performing a secondary operation according to a prescribed set of rules based on the sensitivity value of each of the operands to determine a sensitivity value for a final result, wherein when any of the operands is a value that is an actual sensor reading the sensitivity value of such operand is the sensitivity value assigned in the assigning step;

developing the final result as a function of the initial result and the determined sensitivity value for the final result; and storing the final result in association with its sensitivity value.

25. The invention of claim 24, wherein the assigning, performing, developing, and storing are performed by a first of the at least two processors, wherein the method further comprises:

making available, by the first processor, a version of the final result in association with its sensitivity value for use by at least a second of the at least two processors.

26. The invention of claim 25, further comprising:
repeating the performing, developing, and storing by the second processor, wherein the final result made available to the second processor is employed by the second processor as one of the two operands.

27. The invention of claim 24, wherein the operands are represented in a format having an exponent and a mantissa and wherein the sensitivity value of the final result is further based on the values of the exponents of the operands.

28. The invention of claim 24, wherein each operand is in a floating point representation such that each operand comprises a sign bit, at least one exponent bit, and a mantissa including at least one mantissa bit, and wherein each sensitivity value indicates how many most significant bits of the mantissa of its associated respective value are not garbage bits.

29. The invention of claim 24, wherein the determining of the sensitivity value of the final result is further based on at least one of the group consisting of: the operation performed with the two operands and a purpose for which the final result will be used.

30. The invention of claim 24, wherein the sensitivity value of the final result is determined using a garbage tracking consistent algorithm.

31. The invention of claim 24, wherein the sensitivity value of the final result is determined using one of the group consisting of: a 0-conservative algebra; an N-conservative, algebra, where N is a positive integer number; an N-aggressive algebra, where N is an integer number; a 0-conservative backward sensitivity; a windowed 0-conservative backward sensitivity; and a progressive 0-conservative backward sensitivity.

32. A method for use by a computing system having at least two processors, the method improving operation of the computing system when subsequent computations by a second of the at least two processors are based on results of computations performed by the first of the at least two processors on a first set of data elements that represent information, by making available at least some of the results of the computations by the first processor as a second set of data elements to be processed by the second processor, the method comprising:

deriving, by the first processor, the second set of data elements by performing at least one calculation for each respective one of the data elements of the first set, wherein each calculation takes at least two operands, at least one of the operands being a data element of the first set, to obtain a set of results, each operand of each calculation being associated with a sensitivity value that indicates at least a portion of bits representing a value of the associated operand that are not garbage bits, and wherein each calculation is performed without regard for the sensitivity value of any operand;

performing, by the first processor, a secondary operation according to a prescribed set of rules based on the respective sensitivity values of each of the operands and the computation performed on the operands to determine a sensitivity value for each result of the set of results;

producing, by the first processor, the second set of data elements by effectively eliminating at least one garbage bit from at least one result of the set of results as indicated by the at least one result's corresponding sensitivity value so that the second set of data elements has a reduced bit representation; and making available, by the first processor, the second set of data elements and their associated sensitivity values to the second processor.

33. The invention of claim 32, wherein the step of making available further comprises the step of transmitting the second set of data elements from the first processor toward the second processor.

34. The invention of claim 32, wherein the step of making available further comprises the step of storing the second set of data elements by the first processor to a memory accessibly the second processor.

35. The invention of claim 32, wherein producing the second set of data elements further comprises packing the set of results after eliminating the at least one garbage bit therefrom.

36. The invention of claim 32, wherein the sensitivity values are packed prior to being made available.

37. The invention of claim 32, wherein the prescribed set of rules is determined based on at least one of the group consisting of: the calculation performed with the at least two operands and a purpose for which the final result will be used.

38. The invention of claim 32, wherein the prescribed set of rules make up a garbage tracking consistent algorithm.

39. The invention of claim 32, wherein the prescribed set of rules correspond to one of the group consisting of: a 0-conservative algebra; an N-conservative, algebra, where N is a positive integer number; an N-aggressive algebra, where N is an integer number; a 0-conservative backward sensitivity; a windowed 0-conservative backward sensitivity; and a progressive 0-conservative backward sensitivity.

40. The invention of claim 32, wherein the improved operation of the computing system results in at least one of the group consisting of: operating the computing system with lower power and enabling the subsequent computations to begin quicker.

* * * * *